United States Patent
Yamazaki et al.

(10) Patent No.: US 7,037,809 B2
(45) Date of Patent: May 2, 2006

(54) METHOD OF MANUFACTURING SEMICONDUCTOR DEVICE USING A LASER IRRADIATION PROCESS

(75) Inventors: Shunpei Yamazaki, Tokyo (JP); Hisashi Ohtani, Tochigi (JP); Masaaki Hiroki, Kanagawa (JP); Koichiro Tanaka, Kanagawa (JP); Aiko Shiga, Kanagawa (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 186 days.

(21) Appl. No.: 10/739,105

(22) Filed: Dec. 19, 2003

(65) Prior Publication Data

US 2004/0132266 A1 Jul. 8, 2004

Related U.S. Application Data

(62) Division of application No. 10/279,960, filed on Oct. 25, 2002, now Pat. No. 6,700,096.

(30) Foreign Application Priority Data

Oct. 30, 2001 (JP) .................................. 2001-331747
Apr. 22, 2002 (JP) .................................. 2002-118770

(51) Int. Cl.
*H01L 21/20* (2006.01)
*H01L 21/26* (2006.01)

(52) U.S. Cl. .................................. 438/478; 438/795

(58) Field of Classification Search .............. 438/795, 438/478, 486, 487, 764
See application file for complete search history.

(56) References Cited

U.S. PATENT DOCUMENTS 4,330,363 A   5/1982   Biegesen et al.
4,370,175 A   1/1983   Levatter (Continued)

FOREIGN PATENT DOCUMENTS

| JP | 62-104117 | 5/1986 |
|----|-----------|--------|
| JP | 02-181419 | 7/1990 |
| JP | 04-282869 | 10/1992 |
| JP | 05-315278 | 11/1993 |
| JP | 06-163401 | 6/1994 |
| JP | 07-130652 | 5/1995 |
| JP | 07-183540 | 7/1995 |

(Continued)

OTHER PUBLICATIONS

Hara et al., "Ultra–high Performance Poly–Si TFTs on a Glass by a Stable Scanning CW Laser Lateral Crystallization" AM–LCD '01, pp. 227–330.
Takeuchi et al., "Performance of poly–Si TFTs fabricated by a Stable Scanning CW Laser Crystallization", AM–LCD '01, pp. 251–254.

*Primary Examiner*—David Zarneke
*Assistant Examiner*—Scott B. Geyer
(74) *Attorney, Agent, or Firm*—Nixon Peabody LLP; Jeffrey L. Costellia

(57) ABSTRACT

The present invention provides a semiconductor device manufacturing method where a beam spot is formed by having respective beam spots of a plurality of laser lights overlap each other on a semiconductor film using an optical system. Crystallinity, in a region determined by pattern information, is enhanced by scanning the beam spot to form an island-like semiconductor film based on the pattern information.

13 Claims, 38 Drawing Sheets

(2 of 38 Drawing Sheet(s) Filed in Color)

U.S. PATENT DOCUMENTS

| | | |
|---|---|---|
| 4,566,043 A | 1/1986 | Tamura |
| 4,668,089 A | 5/1987 | Oshida et al. |
| 4,978,970 A | 12/1990 | Okazaki |
| 5,643,826 A | 7/1997 | Ohtani et al. |
| 5,803,965 A | 9/1998 | Yoon |
| 5,854,803 A | 12/1998 | Yamazaki et al. |
| 5,886,320 A | 3/1999 | Gallo et al. |
| 5,923,962 A | 7/1999 | Ohtani et al. |
| 5,953,597 A | 9/1999 | Kusumoto et al. |
| 6,043,453 A | 3/2000 | Arai |
| 6,204,099 B1 | 3/2001 | Kusumoto et al. |
| 6,210,996 B1 | 4/2001 | Yamazaki et al. |
| 6,265,745 B1 | 7/2001 | Kusumoto et al. |
| 6,285,042 B1 | 9/2001 | Ohtani et al. |
| 6,335,541 B1 | 1/2002 | Ohtani et al. |
| 6,365,933 B1 | 4/2002 | Yamazaki et al. |
| 6,396,616 B1 | 5/2002 | Fitzer et al. |
| 6,468,842 B1 | 10/2002 | Yamazaki et al. |
| 6,590,230 B1 | 7/2003 | Yamazaki et al. |
| 6,700,096 B1 | 3/2004 | Yamazaki et al. |
| 2001/0019861 A1 | 9/2001 | Yamazaki et al. |
| 2002/0094008 A1 | 7/2002 | Tanaka |
| 2002/0100937 A1 | 8/2002 | Yamazaki et al. |
| 2003/0089691 A1 | 5/2003 | Tanaka |
| 2003/0112322 A1 | 6/2003 | Tanaka |

FOREIGN PATENT DOCUMENTS

| | | |
|---|---|---|
| JP | 07-326769 | 12/1995 |
| JP | 08-78329 | 3/1996 |
| JP | 08-195357 | 7/1996 |
| JP | 10-135468 | 5/1998 |
| JP | 10-135469 | 5/1998 |
| JP | 3221724 | 8/2001 |

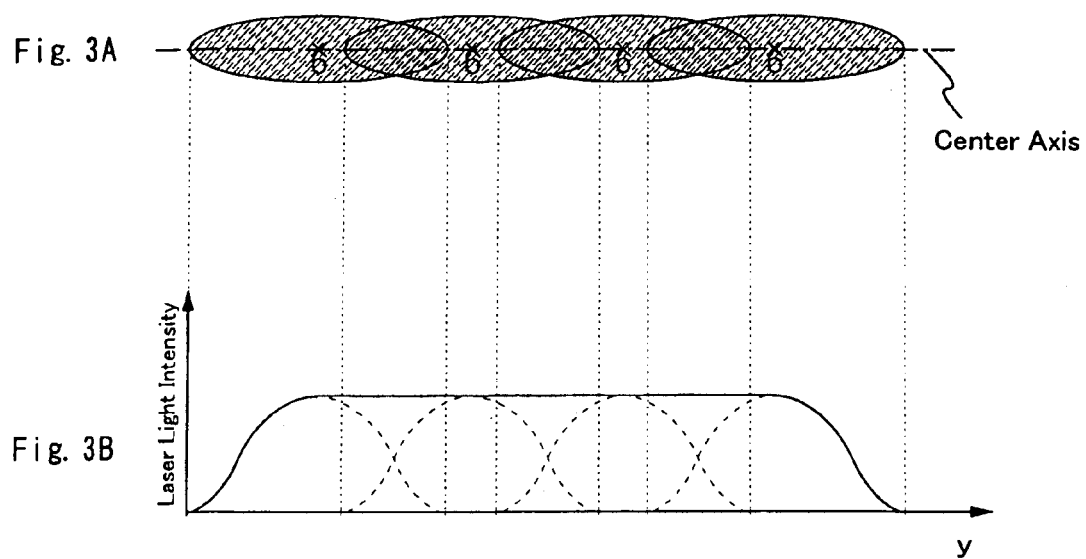

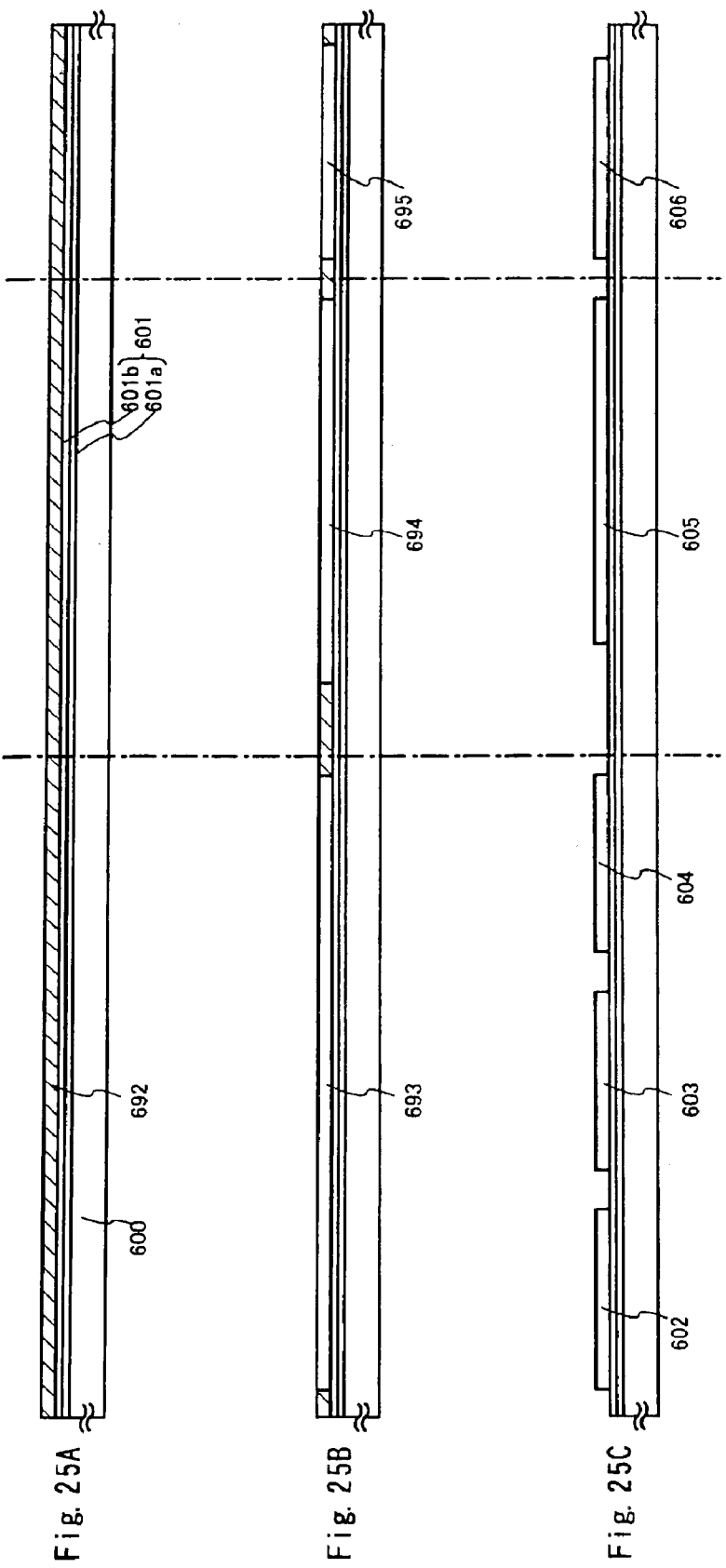

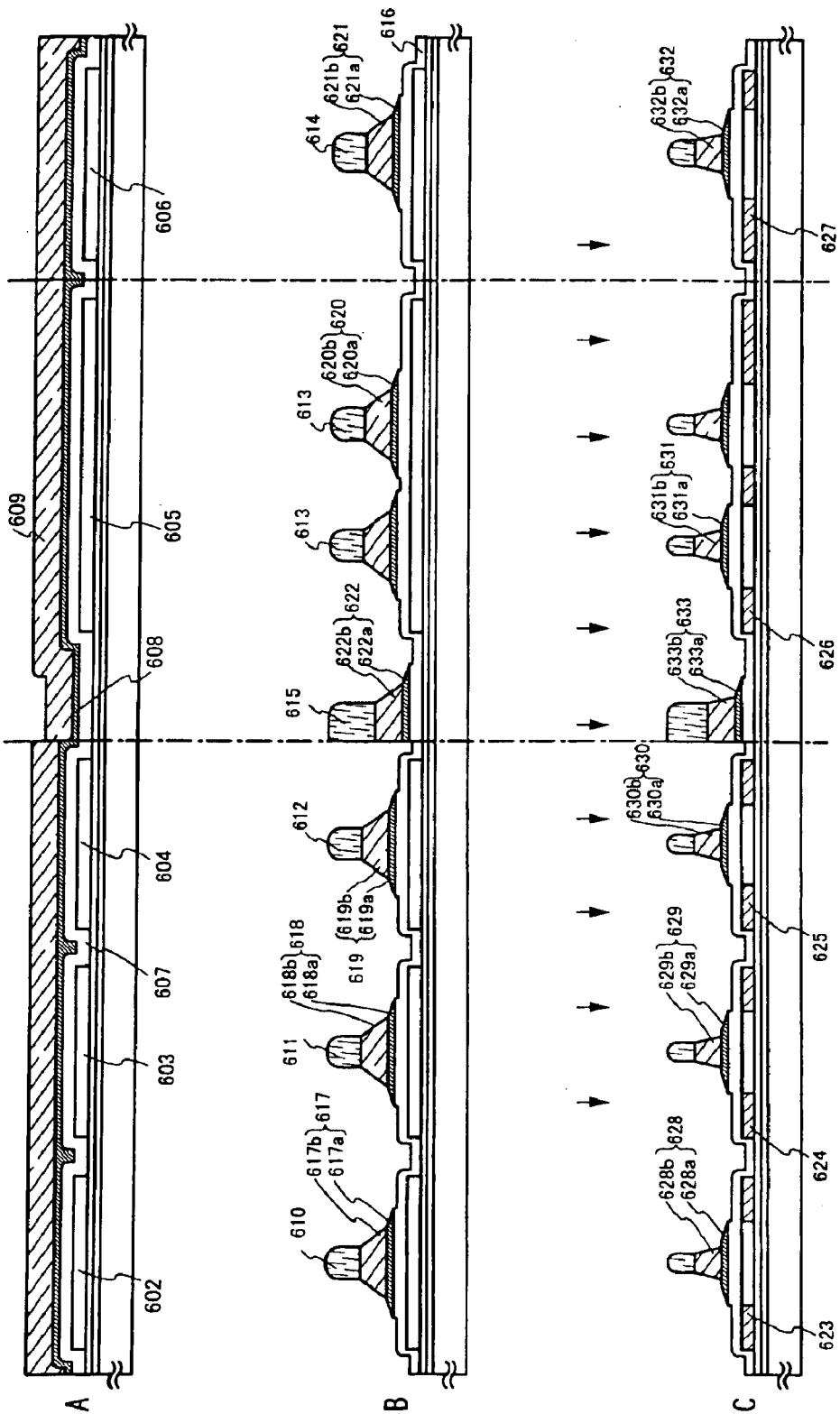

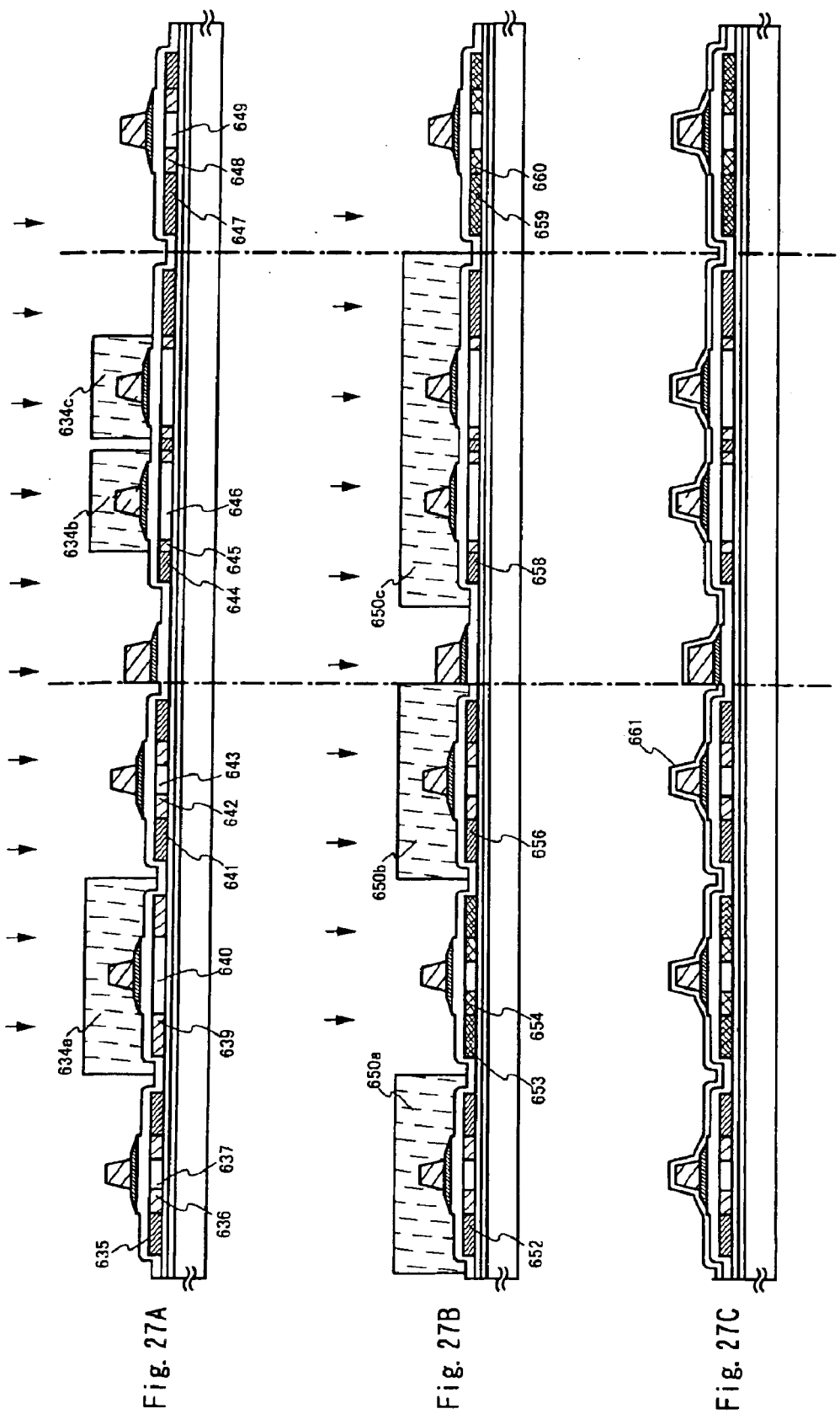

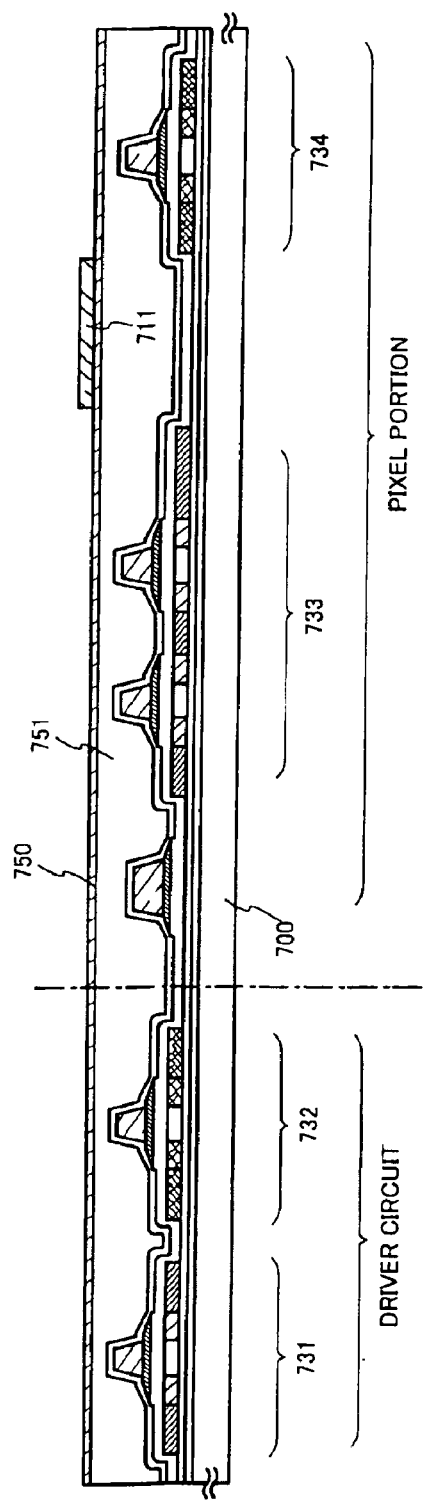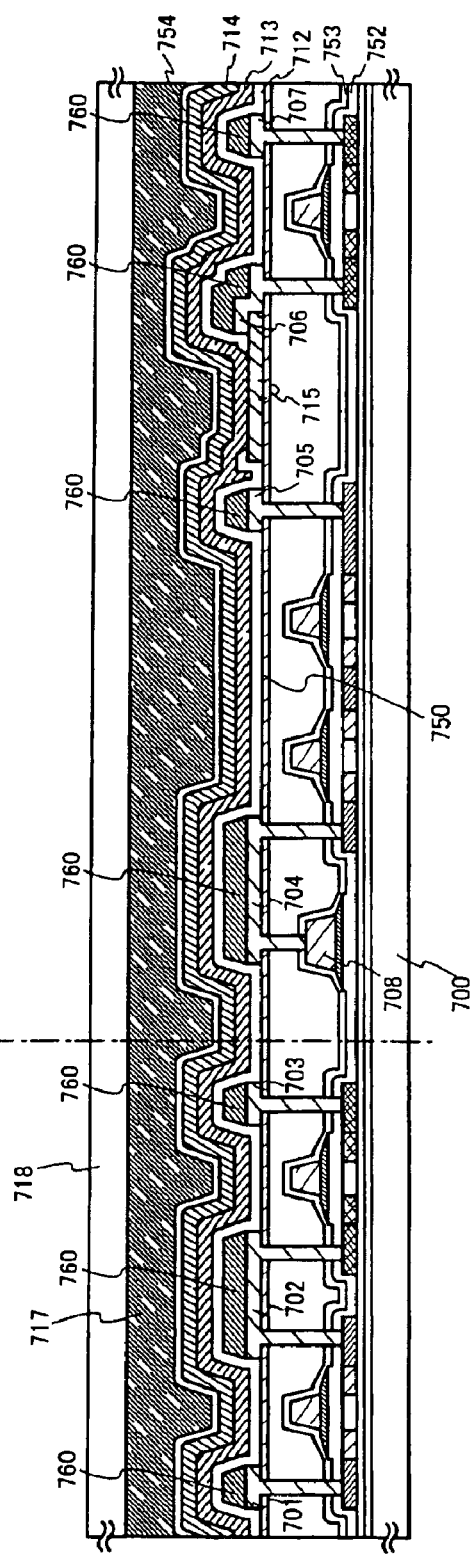
Fig. 30A
Fig. 30B

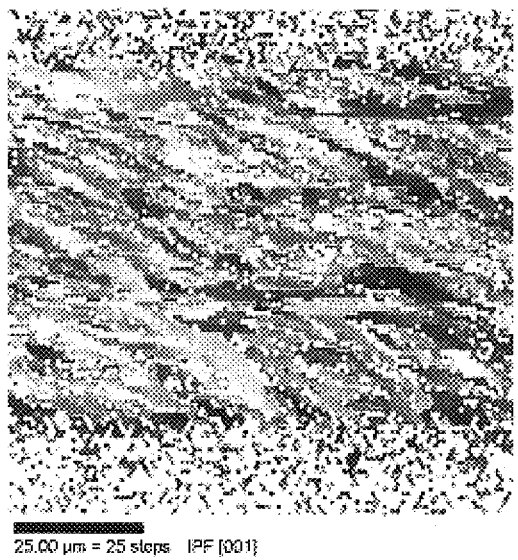
Fig. 31A
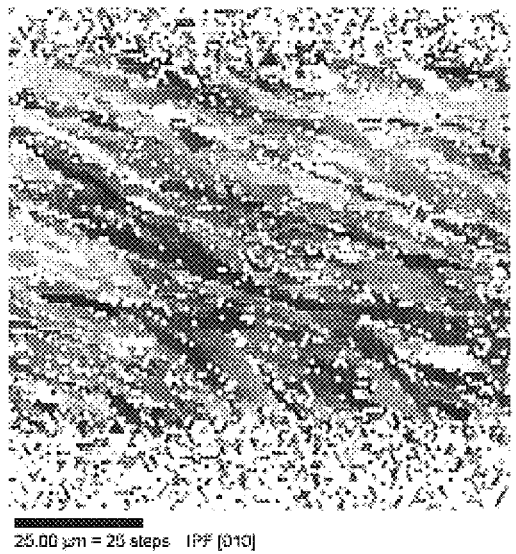
Fig. 31B
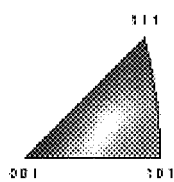
Fig. 31C
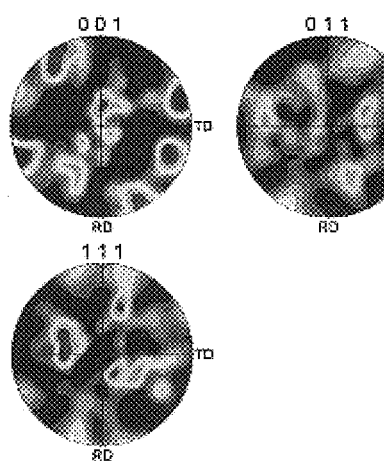 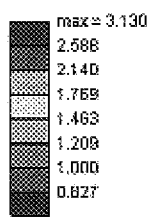
Fig. 31D

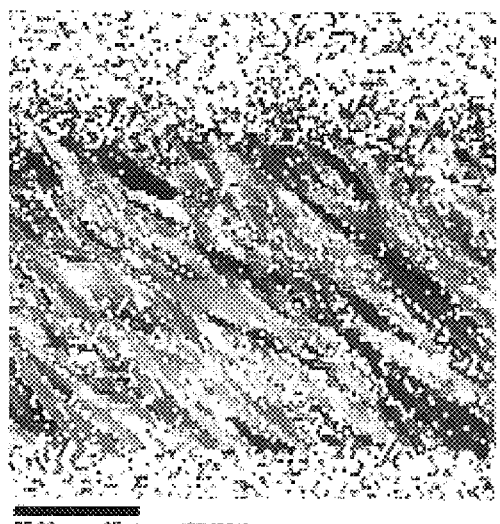
Fig. 32A
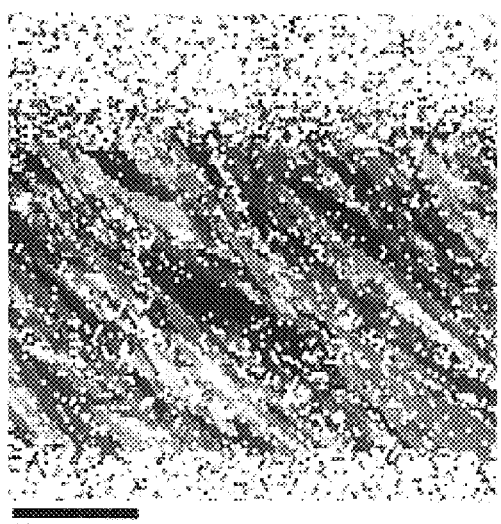
Fig. 32B
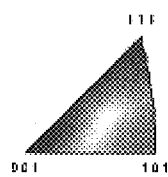
Fig. 32C
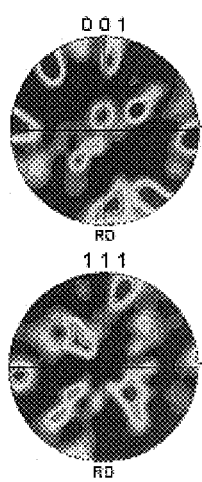
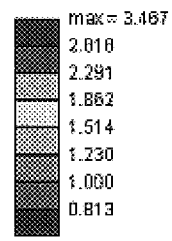
Fig. 32D Compressed Air Compressed Air

METHOD OF MANUFACTURING SEMICONDUCTOR DEVICE USING A LASER IRRADIATION PROCESS

BACKGROUND OF THE INVENTION

1. Field of the Invention

The present invention relates to a laser processing apparatus and a laser irradiation method for crystallizing a semiconductor substrate, a semiconductor film or the like using a laser light or for performing activation after ion implantation, a semiconductor device formed by using the laser apparatus and a manufacturing method thereof, an electronic equipment using the semiconductor device, and a production system of the semiconductor device using the laser apparatus.

2. Description of the Related Art

In recent years, a technique of forming a TFT over a substrate has greatly progressed, and its application and development for active matrix semiconductor display device has been advanced. In particular, since a TFT using a polysilicon film has higher field-effect mobility than a TFT using a conventional amorphous silicon film, it enables high speed operation. Therefore, although the pixel is conventionally controlled on a driving circuit provided outside the substrate, it is possible to control the pixel on the driving circuit formed over the same substrate.

Incidentally, as the substrate used in the semiconductor device, a glass substrate is regarded as important in comparison with a single crystal silicon substrate in terms of the cost. Since a glass substrate is inferior in heat resistance and is susceptible to heat-deformation, in the case where a polysilicon TFT is formed on the glass substrate, laser annealing is used for crystallization of the semiconductor film in order to avoid heat-deformation of the glass substrate.

Characteristics of laser annealing are as follows: it can greatly reduce a processing time in comparison with an annealing method using radiation heating or conductive heating; and it hardly causes thermal damage to the substrate by selectively and locally heating a semiconductor or the semiconductor film.

Note that the laser annealing method here indicates a technique of recrystallizing the damaged layer formed over the semiconductor substrate or the semiconductor film, and a technique of crystallizing the amorphous semiconductor film formed on the substrate. Also, the laser annealing method here includes a technique applied to leveling or surface reforming of the semiconductor substrate or the semiconductor film. A laser oscillation apparatus applied is a gas laser oscillation apparatus represented by an excimer laser or a solid laser oscillation apparatus represented by a YAG laser. It is known as the apparatus which performs crystallization by heating a surface layer of the semiconductor by irradiation of the laser light in an extremely short period of time of about several ten nanoseconds to several hundred microseconds.

Lasers are roughly divided into two types: pulse oscillation and continuous oscillation, according to an oscillation method. In the pulse oscillation laser, an output energy is relatively high, so that mass productivity can be increased assuming the size of a beam spot to be several $cm^2$ or more. In particular, when the shape of the beam spot is processed using an optical system and made to be a linear shape of 10 cm or more in length, it is possible to efficiently perform irradiation of the laser light to the substrate and further enhance the mass productivity. Therefore, for crystallization of the semiconductor film, the use of a pulse oscillation laser is becoming mainstream.

However, in recent years, in crystallization of the semiconductor film, it is found that grain size of the crystal formed in the semiconductor film is larger in the case where the continuous oscillation laser is used than the case where the pulse oscillation laser is used. When the crystal grain size in the semiconductor film becomes large, the mobility of the TFT formed using the semiconductor film becomes high and variation of the TFT characteristics due to a grain boundary is suppressed. Therefore, a continuous oscillation laser is recently attracting attention.

However, since the maximum output energy of the continuous oscillation laser is generally small in comparison with that of the pulse oscillation laser, the size of the beam spot is small, which is about $10^{-3}$ $mm^2$. Accordingly, in order to treat one large substrate, it is necessary to move a beam irradiation position on the substrate upward and downward, and right and left, it results in increasing the processing time per one substrate. Thus, processing efficiency is poor and it is an important object to improve the processing speed of the substrate.

SUMMARY OF THE INVENTION

The present invention has been made in view of the above problems, and therefore it is an object of the present invention to provide a continuous oscillation laser apparatus, a laser irradiation method, and a method of manufacturing a semiconductor device using the continuous oscillation laser apparatus, which can enhance a processing efficiency in comparison with the conventional example.

The laser apparatus of the present invention includes: a first means for controlling an irradiation position of each laser light on an object to be processed; a plurality of second means (laser oscillation apparatuses) for oscillating laser lights; a third means (optical system) for having beam spots of the laser lights oscillated from the plurality of laser oscillation apparatuses partially overlap each other on the object to be processed; and a fourth means for controlling the oscillation by each of the plurality of second means and also controlling the first means so that the beam spots of the laser lights cover a position determined in accordance with data (pattern information) concerning a shape of a mask.

It should be noted here that the position determined in accordance with the mask data means a portion of a semiconductor film to be obtained by performing patterning after crystallization. With the present invention, in accordance with the mask, the fourth means grasps a portion of the semiconductor film formed on an insulating surface that should be left on a substrate after the patterning. In addition, a portion to be scanned with the laser lights is determined so that at least the portion to be obtained by performing the patterning is crystallized, and the first means is controlled so that the beam spots strike the portion to be scanned. In this manner, the semiconductor film is partially crystallized. That is, with the present invention, the laser lights are not scanned and irradiated onto the entire surface of the semiconductor film but are scanned so that at least an indispensable portion is crystallized. With the construction described above, it becomes possible to save a time taken to irradiate the laser lights onto a portion to be removed through the patterning after the crystallization of the semiconductor film.

With the present invention, in order to realize the construction described above, after the formation of the semiconductor film, prior to the crystallization using the laser lights, a marker is given to the semiconductor film using a laser light. Then, a position, at which the laser lights should be scanned, is determined based on a mask with reference to the position of the marker.

With the construction described above, it becomes possible to shorten a time taken to irradiate the laser lights and also to improve a speed at which a substrate is processed.

BRIEF DESCRIPTION OF THE DRAWINGS

The patent or application file contains at least one drawing executed in color. Copies of this patent or patent application publication with color drawings will be provided by the Office upon request and payment of the necessary fee.

In the accompanying drawings:

FIGS. 3A and 3B show shapes of laser beams of the present invention and distribution of their energy densities, respectively;

FIGS. 25A to 25C show a manufacturing method for a semiconductor device that uses the laser apparatus of the present invention;

FIGS. 26A to 26C show a manufacturing method for the semiconductor device that uses the laser apparatus of the present invention;

FIGS. 27A to 27C show a manufacturing method for the semiconductor device that uses the laser apparatus of the present invention;

FIGS. 30A and 30B show a manufacturing method for a light-emitting apparatus that uses the laser apparatus of the present invention;

FIGS. 31A to 31D are each an inverse pole figure of a semiconductor film;

FIGS. 32A to 32D are each an inverse pole figure of the semiconductor film;

DETAILED DESCRIPTION OF THE PREFERRED EMBODIMENTS

Figure 1:
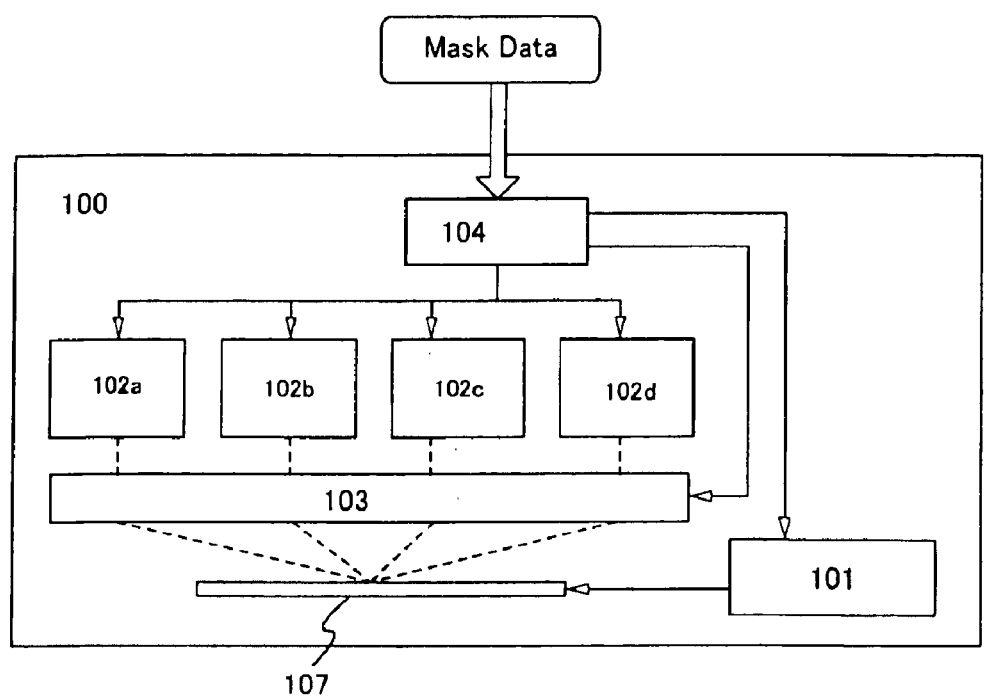
FIG. 1 shows a construction of the laser apparatus of the present invention.

Hereinafter, there will be described a construction of the laser apparatus of the present invention. FIG. 1 is a block diagram of the laser apparatus of the present invention.

A laser apparatus 100 of the present invention includes a stage controller 101 that corresponds to a first means for controlling an irradiation position of each laser light on an object to be processed.

Also, the laser apparatus 100 of the present invention includes a plurality of laser oscillation apparatuses 102 (102a to 102d) that correspond to a second means for oscillating laser lights. Note that an example where four laser oscillation apparatuses 102a to 102d are provided is shown in FIG. 1, although the number of the laser oscillation apparatuses 102 possessed by the laser apparatus 100 of the present invention is not limited to this. There occurs no problem so long as the number of the laser oscillation apparatuses 102 possessed by the laser apparatus 100 of the present invention is in a range of from two to eight. Also, all of the laser oscillation apparatuses use the same laser and it does not matter whether the wavelengths thereof are the same to each other or are different from each other.

It is possible to change the laser as appropriate depending on the purpose of processing. In the present invention, it is possible to use a publicly known laser. As the laser, it is possible to use a gas laser or solid-state laser of continuous oscillation. As the gas laser, it is possible to cite an excimer laser, an Ar laser, a Kr laser, and the like. On the other hand, as the solid-state laser, it is possible to cite a YAG laser, a $YVO_4$ laser, a YLF laser, a $YAlO_3$ laser, a glass laser, a ruby laser, an alexandrite laser, a Ti: sapphire laser, a $Y_2O_3$ laser, and the like. As the solid-state laser, there is applied a laser that uses a crystal such as YAG, YVO$_4$, YLF, YAlO$_3$, or the like doped with Cr, Nd, Er, Ho, Ce, Co, Ti, Yb, or Tm. The fundamental wave of the laser differs depending on a material to be doped and there is obtained a laser light having a fundamental wave in the neighborhood of 1 μm. It is possible to obtain a harmonic wave with respect to the fundamental wave using a nonlinear optical element.

Also, it is further possible to use an ultraviolet laser light obtained by converting an infrared laser light emitted from a solid-state laser into a green laser light using a nonlinear optical element and by further processing the green laser light using another nonlinear optical element.

It should be noted here that there occurs no problem even if the laser apparatus of the present invention is provided with means for adjusting the temperature of the object to be processed in addition to the four means described above.

Also, the laser apparatus 100 of the present invention includes an optical system 103 that corresponds to a third means that is capable of having beam spots of laser lights oscillated from respective laser oscillation apparatuses 102a to 102d overlap each other on the object to be processed.

The laser apparatus 100 of the present invention further includes a CPU 104 that corresponds to a fourth means. The CPU 104 is capable of controlling the oscillation by the laser oscillation apparatuses 102 and also controlling the stage controller 101 corresponding to the first means so that the beam spots of the laser lights cover positions determined in accordance with data concerning masks.

Figure 2A:
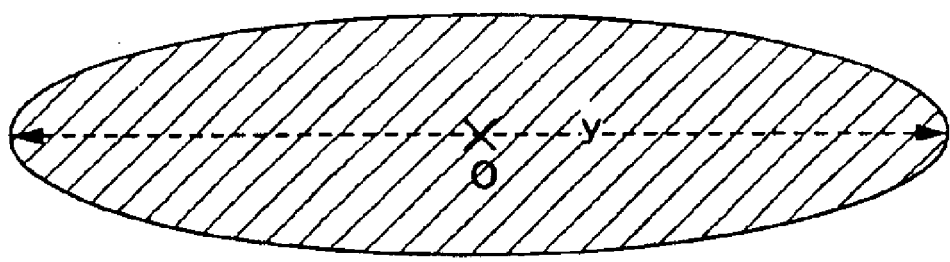
FIGS. 2A and 2B show a shape of a laser beam of the present invention and distribution of its energy density, respectively.

FIG. 2A shows an example of the shape of a laser spot of a laser light oscillated from each of the laser oscillation apparatuses 102a to 102d on the object to be processed 107. The beam spot shown in FIG. 2A has an elliptic shape. Note that in the laser apparatus of the present invention, the beam spots of the laser lights oscillated from the laser oscillation apparatuses are not limited to the elliptic shape. The shapes of the laser spots differ depending on the kind of the laser and it is possible to shape the beam spots with an optical system. For instance, the laser light emitted from the XeCl excimer laser (whose wavelength is 308 nm and pulse width is 30 ns) L3308 manufactured by Lambda K.K. has a rectangular shape whose size is 10 mm×30 mm (both of which are the half-value width in a beam profile). Also, the laser light emitted from the YAG laser has a circular shape if a rod has a cylindrical shape, and has a rectangular shape if the rod has a slab shape. Also, by further shaping such a laser light with an optical system, it is possible to form a laser light having a desired size.

Figure 2B:
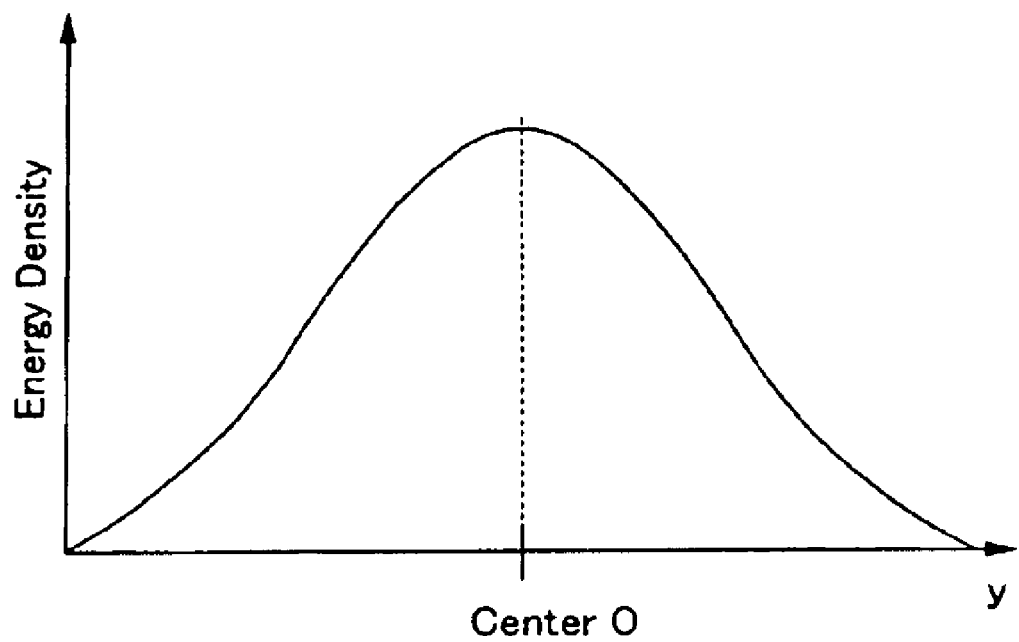

FIG. 2B shows distribution of a laser light energy density of the beam spot shown in FIG. 2A in a major axis y direction. As to the distribution of the energy density of a laser light whose beam spot has an elliptic shape, the energy density is increased in accordance with the reduction of a distance to the center "o" of the ellipse. The range specified by "α" corresponds to the width in the major axis y direction where the energy density exceeds a value that is necessary to obtain a desired crystal.

Next, FIG. 3A shows shapes of beam spots in the case where there are synthesized laser lights that each has the beam spot shown in FIG. 2A. As shown in FIG. 3A, the beam spots of respective laser lights are combined by matching the major axes of respective ellipses and also having the beam spots overlap each other, thereby forming one beam spot. Note that a straight line obtained by connecting the centers "o" of respective ellipses will be hereinafter referred to as the "center axis".

FIG. 3B shows distribution of energy densities of the laser lights shown in FIG. 3A, whose beam spots have been combined, in the center axis direction. There is increased the energy density in each portion in which respective beam spots before the synthesizing overlap each other, so that the energy density is flattened in each portion between the centers "o" of respective ellipses.

As can be seen from FIG. 3B, by having a plurality of laser lights overlap each other and having the laser lights complement each other in each portion having a low energy density, it becomes possible to enhance the crystallinity of a semiconductor film with efficiency in comparison with a case where the plurality of laser lights are not made to overlap each other and are used independently of each other. For instance, it is assumed that there is exceeded a value of the energy density that is necessary to obtain a desired crystal only in the area specified by the sloped lines in FIG. 3B and the energy densities in other areas are low. In this case, if the four beam spots are not made to overlap each other, the desired crystal is obtained only in the sloped-line area whose width in the center axis direction is indicated by "α". However, by having the beam spots overlap each other as shown in FIG. 3B, it becomes possible to obtain the desired crystal in the area whose width in the center axis direction is indicated by β (β>4α). As a result, it becomes possible to crystallize a semiconductor film with more efficiency.

Figure 4A:
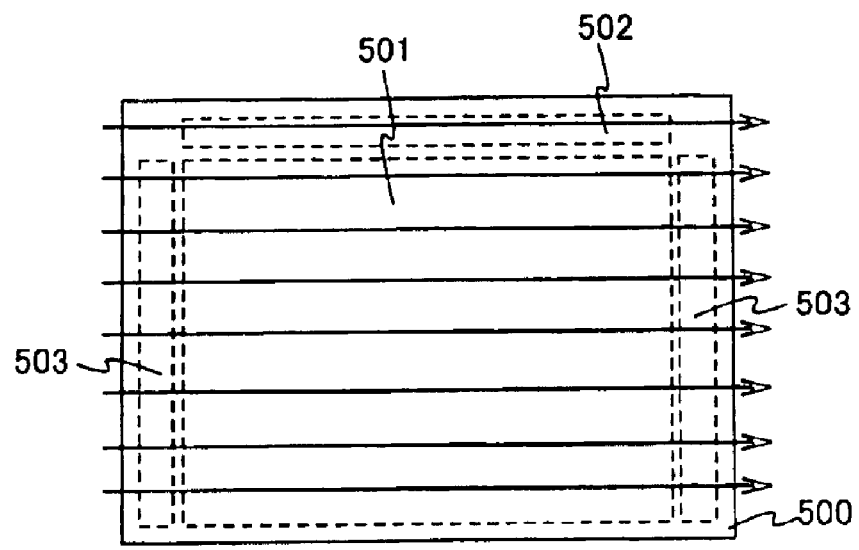
FIGS. 4A to 4C show a direction in which laser lights move on an object to be processed.

A case where the object to be processed 107 in FIG. 3A is a semiconductor film formed over a substrate will be described with reference to FIG. 4A. Note that FIG. 4A shows a semiconductor film 500 formed in order to manufacture a semiconductor device of active matrix type. The portion surrounded by a broken line 501 corresponds to a portion in which there is formed a pixel portion, the portion surrounded by a broken line 502 corresponds to a portion in which there is formed a signal line driving circuit, and the portion surrounded by a broken line 503 corresponds to a portion in which there is formed a scanning line driving circuit.

Also, in the present invention, a plurality of laser lights are synthesized by having the beam spots thereof overlap each other, thereby forming one beam spot. When doing so, respective beam spots are made to overlap each other so that the centers of respective beam spots before the synthesizing form a straight line.

It should be noted here that it does not matter whether or not the beam spot after the synthesizing is set so that a straight line (hereinafter referred to as the "center axis") formed by connecting centers of the beam spots before the synthesizing extends perpendicular to a scanning direction. In the case where the center axis of the beam spot after the synthesizing extends perpendicular to the scanning direction, the efficiency of the processing of a substrate is increased to the highest level. On the other band, there are obtained advantages given below by performing the scanning so that the center axis of the beam spot after the synthesizing and the scanning direction form an angle of 45°±35°, preferably, an angle closer to 45°.

FIGS. 31A and 31B are each a map diagram of an inverse pole figure concerning a crystal orientation when crystallization is performed through the irradiation of Nd: YVO$_4$ on a 1000 Å amorphous silicon film formed on a silicon nitride film by setting the angle of the center axis of the beam spot with respect to the scanning direction at 27°, setting the wavelength at 532 nm, setting the output energy at 2 W, and setting the moving speed at 20 cm/sec. When a direction perpendicular to the scanning direction within a plane parallel to the substrate is referred to as "x", the scanning direction is referred to as "y", and a direction perpendicular to the substrate is referred to as "z", FIG. 31A shows the distribution of the crystal orientation on a plane perpendicular to the z direction of the semiconductor film and FIG. 31B shows the distribution of the crystal orientation on a plane perpendicular to the y direction. Also, FIG. 31C is an inverse pole figure on a plane perpendicular to the y direction and shows the distribution ratio between respective crystal orientations. Further, FIG. 31D is a pole figure in which TD corresponds to the scanning direction y, reference numeral 001 represents a pole figure on a plane perpendicular to the z direction, reference numeral 011 represents a pole figure on a plane perpendicular to a direction in which there are synthesized the y direction and the z direction, and reference numeral 111 represents a pole figure on a plane perpendicular to a direction in which there are synthesized the x direction, y direction, and z direction.

FIGS. 32A and 32B are each a map diagram of an inverse pole figure concerning a crystal orientation when crystallization is performed through the irradiation of Nd: $YVO_4$ on a 1000 Å amorphous silicon film formed on a silicon nitride film by setting the angle of the center axis of the beam spot with respect to the scanning direction at 45, setting the wavelength at 532 nm, setting the output energy at 1.6 W, and setting the moving speed at 20 cm/sec. When a direction perpendicular to the scanning direction within a plane parallel to the substrate is referred to as "x", the scanning direction is referred to as "y", and a direction perpendicular to the substrate is referred to as "z", FIG. 32A shows the distribution of the crystal orientation on a plane perpendicular to the z direction of the semiconductor film and FIG. 32B shows the distribution of the crystal orientation on a plane perpendicular to the y direction. Also, FIG. 32C is an inverse pole figure on a plane perpendicular to the y direction and shows the distribution ratio between respective crystal orientations. Further, FIG. 32D is a pole figure in which TD corresponds to the scanning direction y, reference numeral 001 represents a pole figure on a plane perpendicular to the z direction, reference numeral 011 represents a pole figure on a plane perpendicular to a direction in which there are synthesized the y direction and the z direction, and reference numeral 111 represents a pole figure on a plane perpendicular to a direction in which there are synthesized the x direction, y direction, and z direction.

As can be seen from FIGS. 31A to 31D and 32A to 32D, crystal grains grow in a direction perpendicular to the center axis of the beam spot. With the construction described above, the number of crystal grains existing in an active layer is increased and it becomes possible to reduce variations in characteristics resulting from the crystal orientation and crystal grains in comparison with a case where scanning is performed so that the scanning direction and the center axis of the beam spot become perpendicular to each other.

Figure 4B:
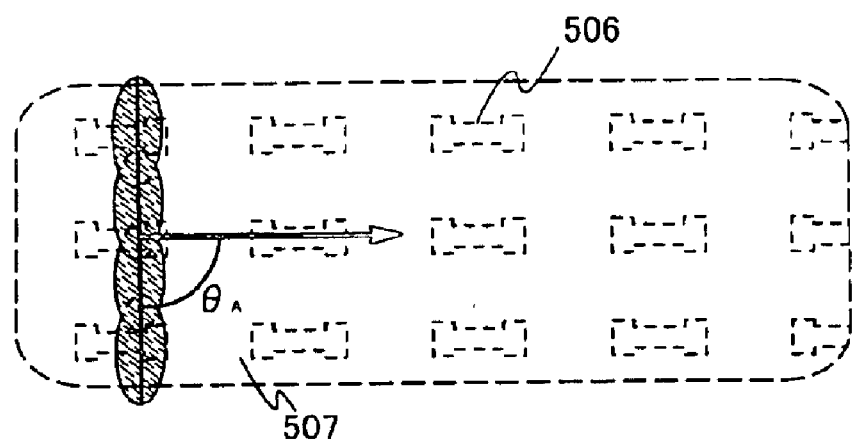
Figure 4C:
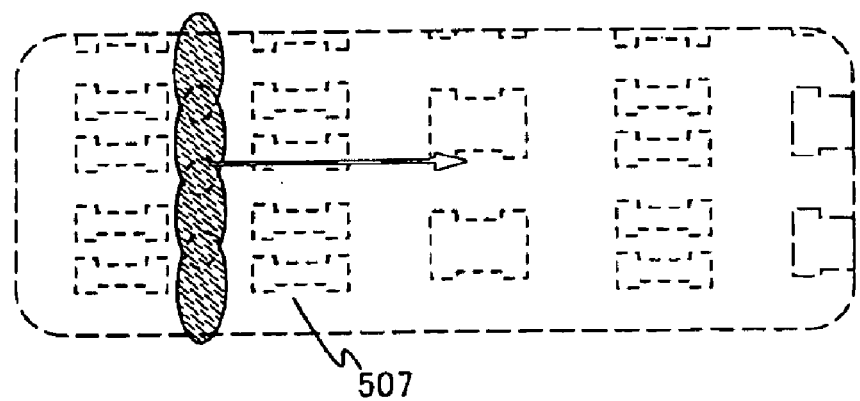

FIG. 4B is an enlarged view of a beam spot 507 in the portion 501 in which there is formed the pixel portion. Also, FIG. 4C is an enlarged view of the beam spot 507 in the portion in which there is formed the signal line driving circuit 502. With the present invention, there is prevented a situation where the center axis of the beam spot 507 extends perpendicular to the scanning direction. In more detail, an acute angle $\theta_A$ formed between the center axis of the beam spot and the scanning direction is set so as to be 45°±35°, more preferably, 45°.

In addition, the energy densities of the laser lights in edge portions of the beam spots are lower than those in other portions as shown in FIG. 3B, and there is a case where it is impossible to uniformly perform the processing of the object to be processed. Consequently, it is preferable that the laser lights are irradiated so that there is prevented a situation where each portion 506 corresponding to an island-like semiconductor film obtained by patterning the semiconductor film after crystallization overlaps the edges of the paths of the laser lights.

Figure 33A:
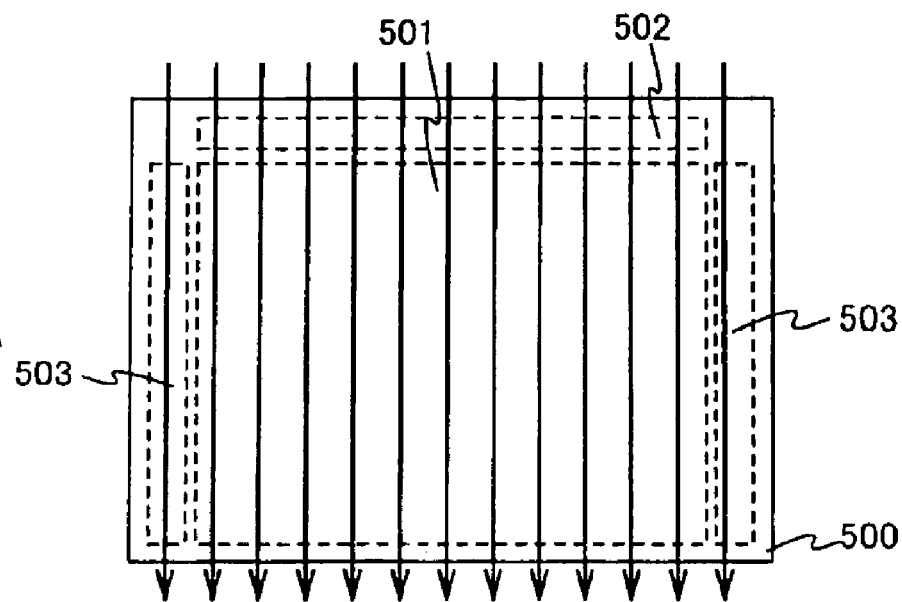
FIGS. 33A and 33B show the direction in which the laser lights move on the object to be processed.
Figure 33B:
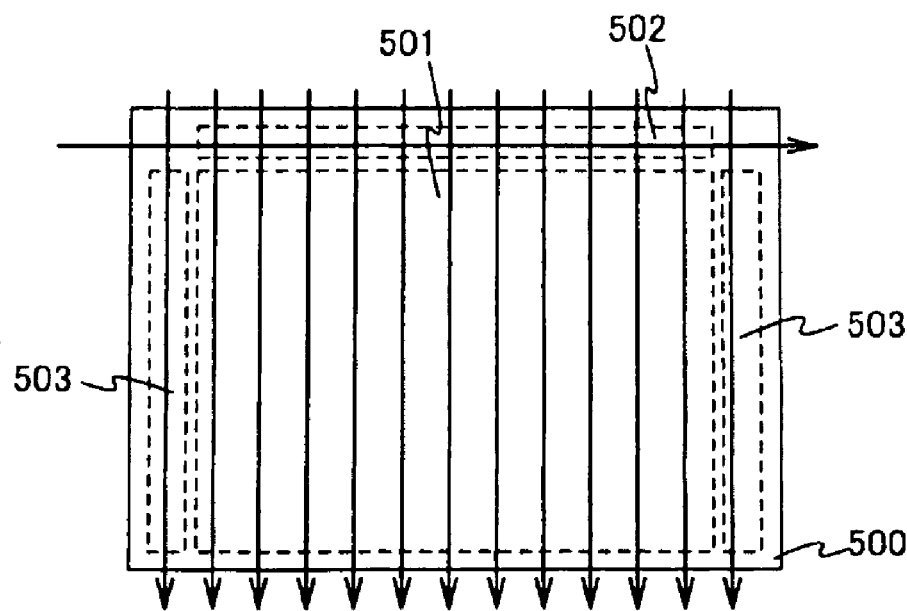

It should be noted here that the laser lights are scanned in the arrow direction in FIG. 4A, although it is not necessarily required that the scanning is performed in this arrow direction. FIG. 33A shows an example where the scanning direction of the laser lights is rotated by 90° with reference to the case shown in FIG. 4A. Also, FIG. 33B shows an example where the scanning direction of the laser lights in the pixel portion 501 and the scanning line driving circuit 503 is the same as that in the case shown in FIG. 33A and laser lights, whose scanning direction is the same as that in the case shown in FIG. 33A, and a laser light, whose scanning direction is the same as that in the case shown in FIG. 4A, are both irradiated in the signal line driving circuit 502. In this case, the surface of the semiconductor film is placed in a rough state in each portion in which the laser lights overlap each other, so that it is preferable that there is prevented a situation where the laser lights overlap in each portion in which an active layer is to be formed. Also, laser lights having different scanning directions are irradiated in the signal line driving circuit in FIG. 33B, although such laser lights having different scanning directions may also be irradiated in the scanning line driving circuit 503 and the pixel portion 501.

Also, with the present invention, each portion to be scanned with the laser lights is determined in accordance with a mask for patterning the semiconductor film inputted into the CPU 104. Note that the portion to be scanned with the laser lights is set so as to cover a portion of the semiconductor film to be obtained through patterning after crystallization. The CPU 104 determines the portion to be scanned with the laser lights so that at least each portion of the semiconductor film to be obtained by performing patterning can be crystallized, and controls the stage controller 101 corresponding to the first means so that beam spots, that is, irradiation positions strike the portion to be scanned. In this manner, the semiconductor film is partially crystallized.

Figure 5A:
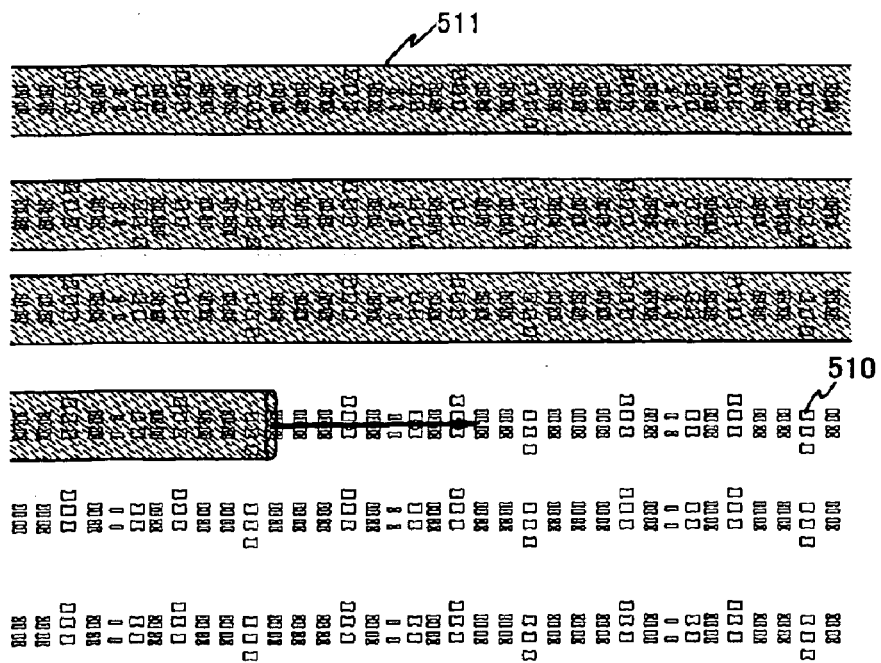
FIGS. 5A and 5B also show the direction in which the laser lights move on the object to be processed.
Figure 5B:
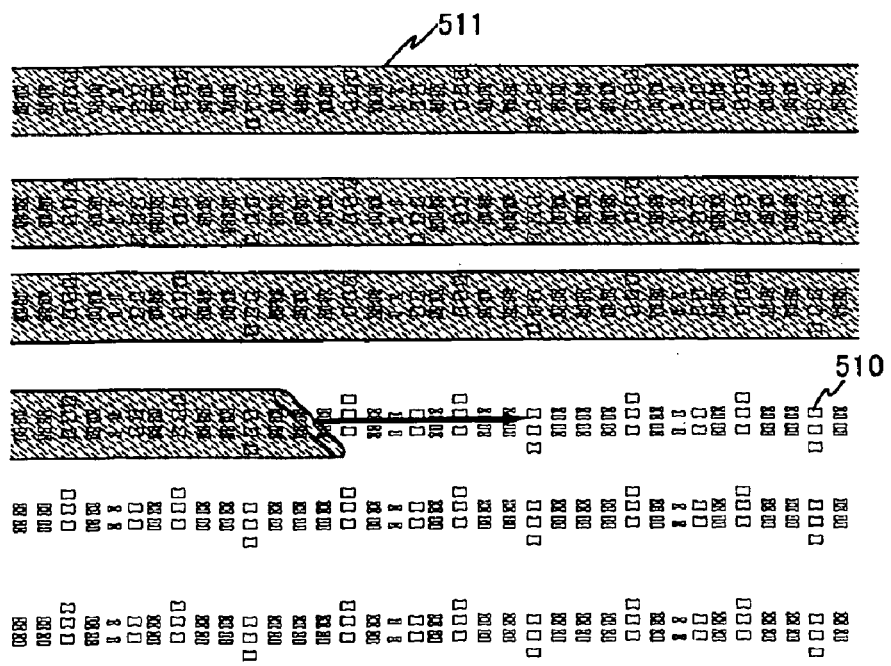

FIG. 5A shows a relation between each portion to be scanned with the laser lights and a mask. Note that the center axis of the beam spots extends almost perpendicular to the scanning direction in FIG. 5A. FIG. 5B shows a relation between the portion to be scanned with the laser lights and the mask in the case where the center axis of the beam spots and the scanning direction form an angle of 45. Reference numeral 510 denotes island-like semiconductor films of the semiconductor film to be obtained by performing patterning, and each portion to be scanned with the laser lights is determined so as to cover these island-like semiconductor films 510. Reference numeral 511 indicates the portions to be scanned with the laser lights that cover the island-like semiconductor films 510. As shown in FIGS. 5A and 5B, with the present invention, the laser lights are not irradiated onto the entire surface of the semiconductor film but are scanned so that at least each indispensable portion is crystallized.

It should be noted here that in the case where the semiconductor film after the crystallization is used as the active layer of a TFT, it is preferable that the scanning direction of the laser lights is determined so as to be parallel to the direction in which carriers in a channel formation region move.

Figure 6A:
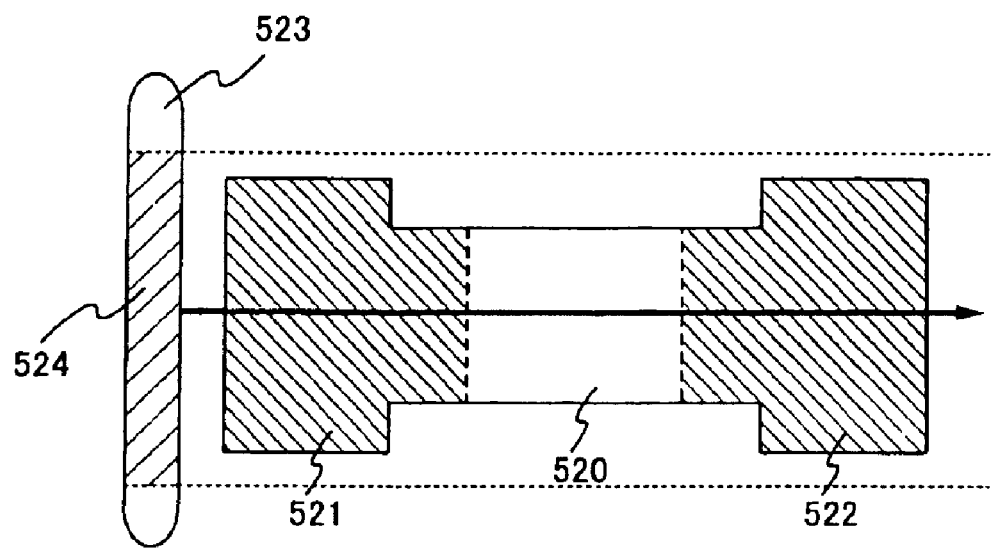
FIGS. 6A and 6B show a direction in which the laser lights move on an active layer of a TFT.
Figure 6B:
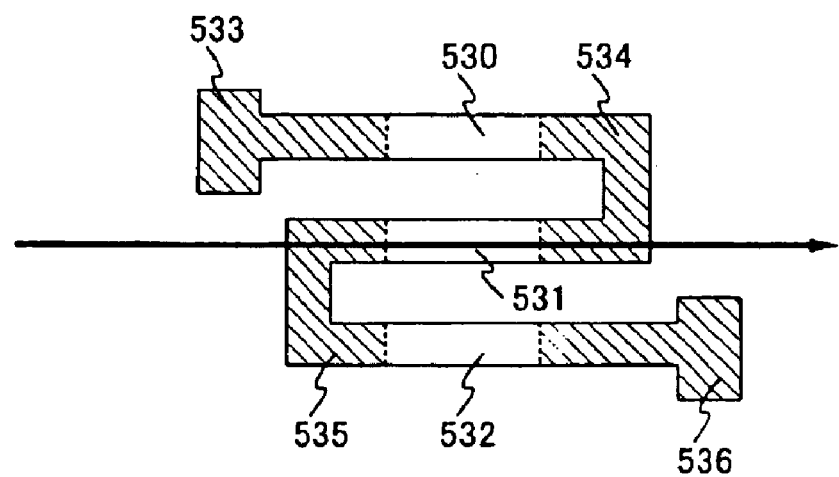

FIGS. 6A and 6B each show an example of the active layer of a TFT. FIG. 6A shows an active layer in which one channel formation region is provided and impurity regions 521 and 522 that will become a source region and a drain region are provided so that the channel formation region 520 is sandwiched therebetween. When the semiconductor film is crystallized using the laser apparatus of the present invention, the scanning direction of the laser lights is determined so that the scanning direction becomes parallel to a direction in which the carriers in the channel formation region move, as indicated by the arrow. Reference numeral 523 indicates the shape of the beam spot. In a region 524 of the beam spot 523 specified by sloped lines, the energy density exceeds the value that is necessary to obtain a favorable crystal. By having the laser light in the region 524 specified by the sloped lines irradiated onto the entire surface of the active layer, it becomes possible to further enhance the crystallinity of the active layer.

Also, FIG. 6B shows an active layer provided with three channel formation regions. In this drawing, impurity regions 533 and 534 are provided so that the channel formation region 530 is sandwiched therebetween. Also, impurity regions 534 and 535 are provided so that the channel formation region 531 is sandwiched therebetween. Further, impurity regions 535 and 536 are provided so that the channel formation region 532 is sandwiched therebetween. In addition, when the semiconductor film is crystallized using the laser apparatus of the present invention, the scanning direction of the laser lights is determined so that the scanning direction becomes parallel to the direction in which carriers in the channel formation regions move, as indicated by the arrow.

Figure 7A:
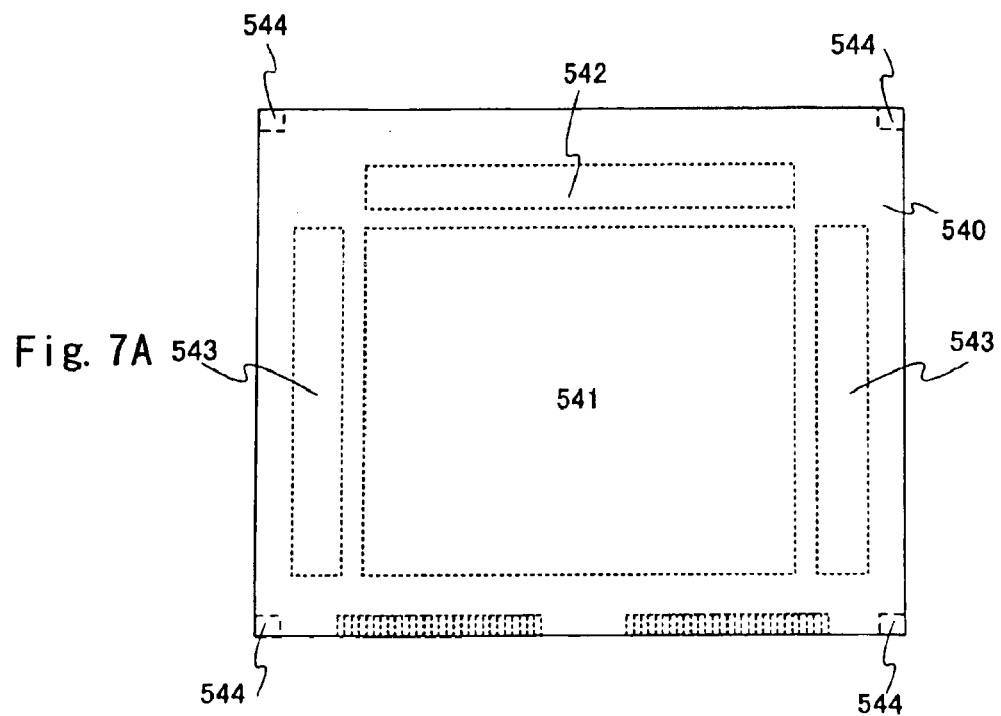
FIGS. 7A and 7B show positions of markers.
Figure 7B:
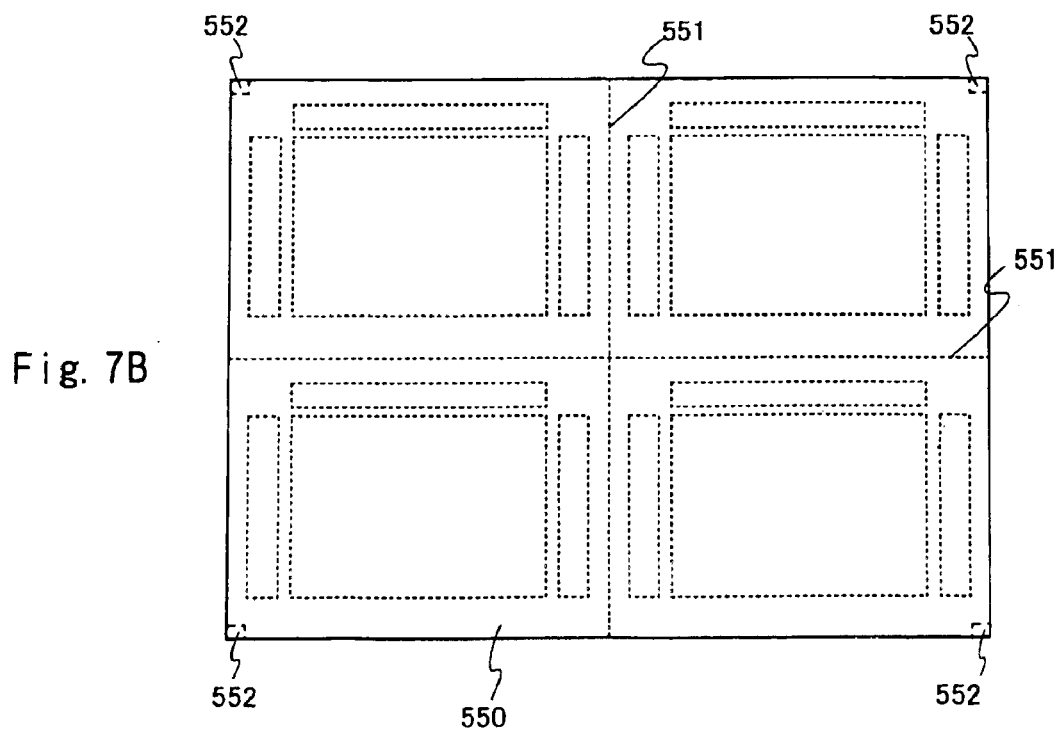

It should be noted here that in order to determine each portion to be scanned with the laser lights, it is necessary that markers for determining the positions of masks with respect to the semiconductor film are formed in the semiconductor film. FIGS. 7A and 7B each show the positions at which the markers are formed in a semiconductor film formed in order to produce a semiconductor device of active matrix type. Note that FIG. 7A shows an example where one semiconductor device is manufactured from one substrate, while FIG. 7B shows an example where four semiconductor devices are manufactured from one substrate.

In FIG. 7A, reference numeral 540 denotes a semiconductor film formed on a substrate, the portion surrounded by a broken line 541 corresponds to a portion in which there is formed the pixel portion, the portion surrounded by a broken line 542 corresponds to a portion in which there is formed the signal line driving circuit, and the portion surrounded by a broken line 543 corresponds to a portion in which there is formed the scanning line driving circuit. Reference numeral 544 represents a portion (marker-forming portion) in which there is formed a marker, with this portion being provided and positioned at four corners of the semiconductor film.

It should be noted here that four marker-forming portions 544 are respectively provided at the four corners in FIG. 7A, although the present invention is not limited to this construction. The positions of the marker-forming portions and the number thereof are not limited to the form described above so long as it is possible to align each portion to be scanned with the laser lights of the semiconductor film and each mask for patterning the semiconductor film.

In FIG. 7B, reference numeral 550 denotes a semiconductor film formed on a substrate and broken lines 551 indicate scribe lines along which the substrate is to be divided in a subsequent step. In FIG. 7B, it is possible to manufacture four semiconductor devices by dividing the substrate along the scribe lines 551. Note that the number of semiconductor devices obtained through the division is not limited to this.

Reference numeral 552 represents a portion (marker-forming portion) in which there is formed a marker, with this portion being provided and positioned at four corners of the semiconductor film. It should be noted here that four marker-forming portions 552 are respectively provided at the four corners in FIG. 7B, although the present invention is not limited to this construction. The positions of the marker-forming portions and the number thereof are not limited to the form described above so long as it is possible to align each portion to be scanned with the laser lights of the semiconductor film and each mask for the patterning of the semiconductor film.

It is possible to cite the YAG laser, $CO_2$ laser, and the like as representative examples of the laser used to form the markers. Needless to say, however, it is possible to form the markers using another laser.

Next, there will be described a production system for a semiconductor device that uses the laser apparatus of the present invention.

Figure 8:
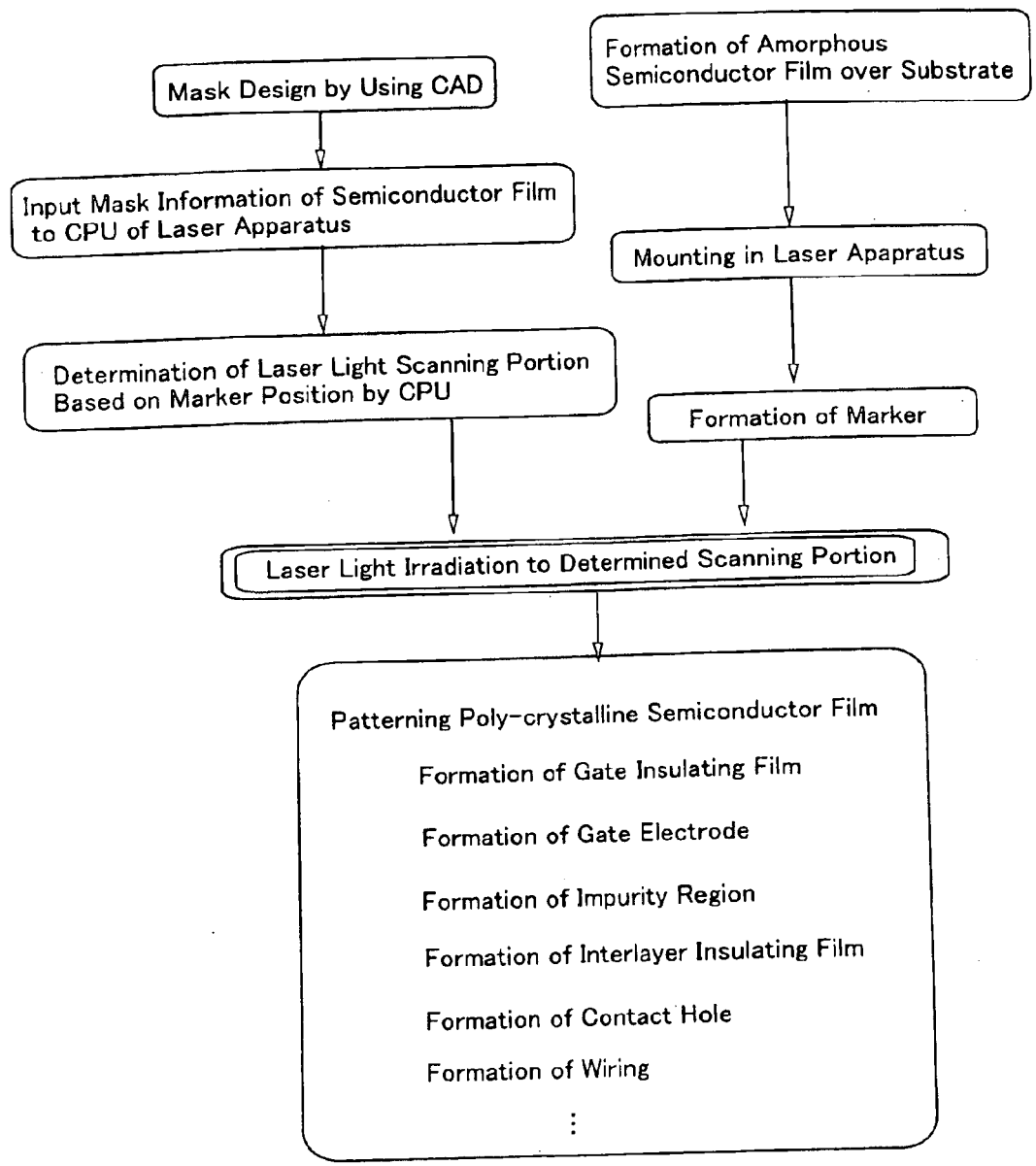
FIG. 8 is a flowchart showing an operation flow of a production system of the present invention.

An operation flow of the production system of the present invention is shown in FIG. 8 as a flowchart. First, there is performed the designing of a semiconductor device using CAD. Then, information concerning the shape of each designed mask for patterning a semiconductor film is inputted into a CPU possessed by the laser apparatus.

On the other hand, after an amorphous semiconductor film is formed over a substrate, the substrate, on which the amorphous semiconductor film has been formed, is set in the laser apparatus. Then, markers are formed on the surface of the semiconductor film using a laser.

On the basis of inputted information concerning the masks, the CPU determines each portion to be scanned with laser lights with reference to the positions of the markers. Then, with reference to the formed markers, the laser lights are irradiated onto the portion to be scanned with the laser lights, thereby partially crystallizing the semiconductor film.

Then, after the irradiation of the laser lights, a polycrystalline semiconductor film obtained by the irradiation of the laser lights is patterned and etched, thereby forming island-like semiconductor films. Following this, there is performed a step for manufacturing a TFT from these island-like semiconductor films. The concrete step for manufacturing the TFT differs depending on the shape of the TFT. Representatively, however, a gate insulating film is formed and an impurity region is formed in the island-like semiconductor films. Then, an interlayer insulating film is formed so as to cover the gate insulating film and a gate electrode, and a contact hole is established in the interlayer insulating film. In this manner, there is obtained an exposed part of the impurity region. Then, wiring is formed on the interlayer insulating film so as to contact the impurity region through the contact hole.

Figure 9:
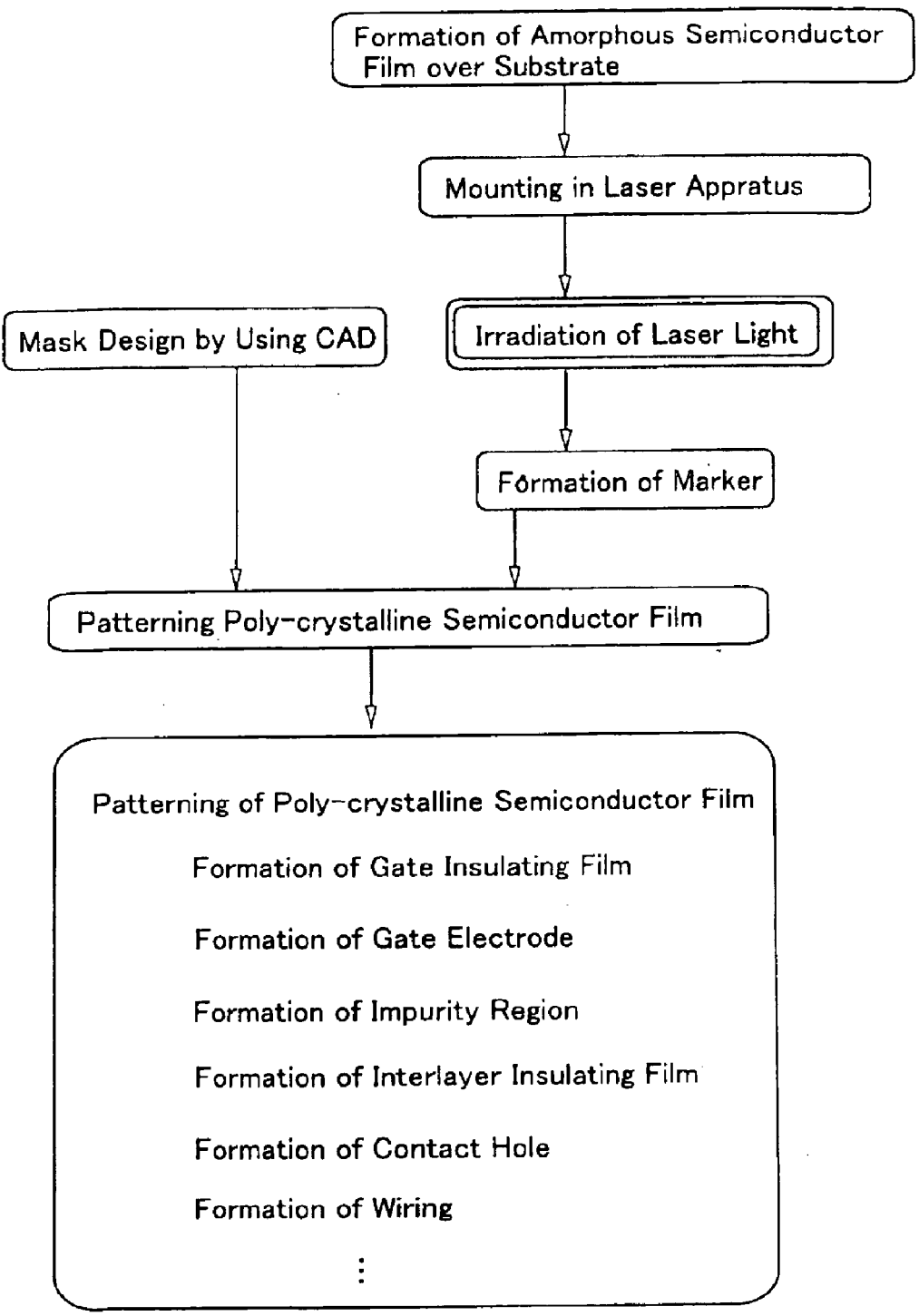
FIG. 9 is a flowchart showing an operation flow of a conventional production system.

It should be noted here that for the sake of comparison and contrast, FIG. 9 shows a production flow for a conventional semiconductor device as a flowchart. As shown in FIG. 9, the designing of masks for a semiconductor device is performed using CAD. On the other hand, an amorphous semiconductor film is formed over a substrate and the substrate, on which the amorphous semiconductor film has been formed, is set in a laser apparatus. Then, laser lights are scanned and irradiated onto the entire surface of the amorphous semiconductor film, thereby crystallizing the entire surface of the amorphous semiconductor film. Then, markers are formed in a polycrystalline semiconductor film obtained through the crystallization and island-like semiconductor films are formed by patterning the polycrystalline semiconductor film with reference to the markers. Then, a TFT is manufactured using the island-like semiconductor films.

As described above, in contrast to a conventional case such as the case shown in FIG. 9, in the production system of the present invention, markers are formed using a laser light prior to the crystallization of an amorphous semiconductor film. Then, laser lights are scanned in accordance with information concerning masks for patterning the semiconductor film.

With the construction described above, it becomes possible to save a time taken to irradiate the laser lights onto each portion to be removed through patterning after the crystallization of the semiconductor film, which makes it possible to shorten a time taken to irradiate the laser lights and also to improve the speed at which a substrate is processed.

Figure 10:
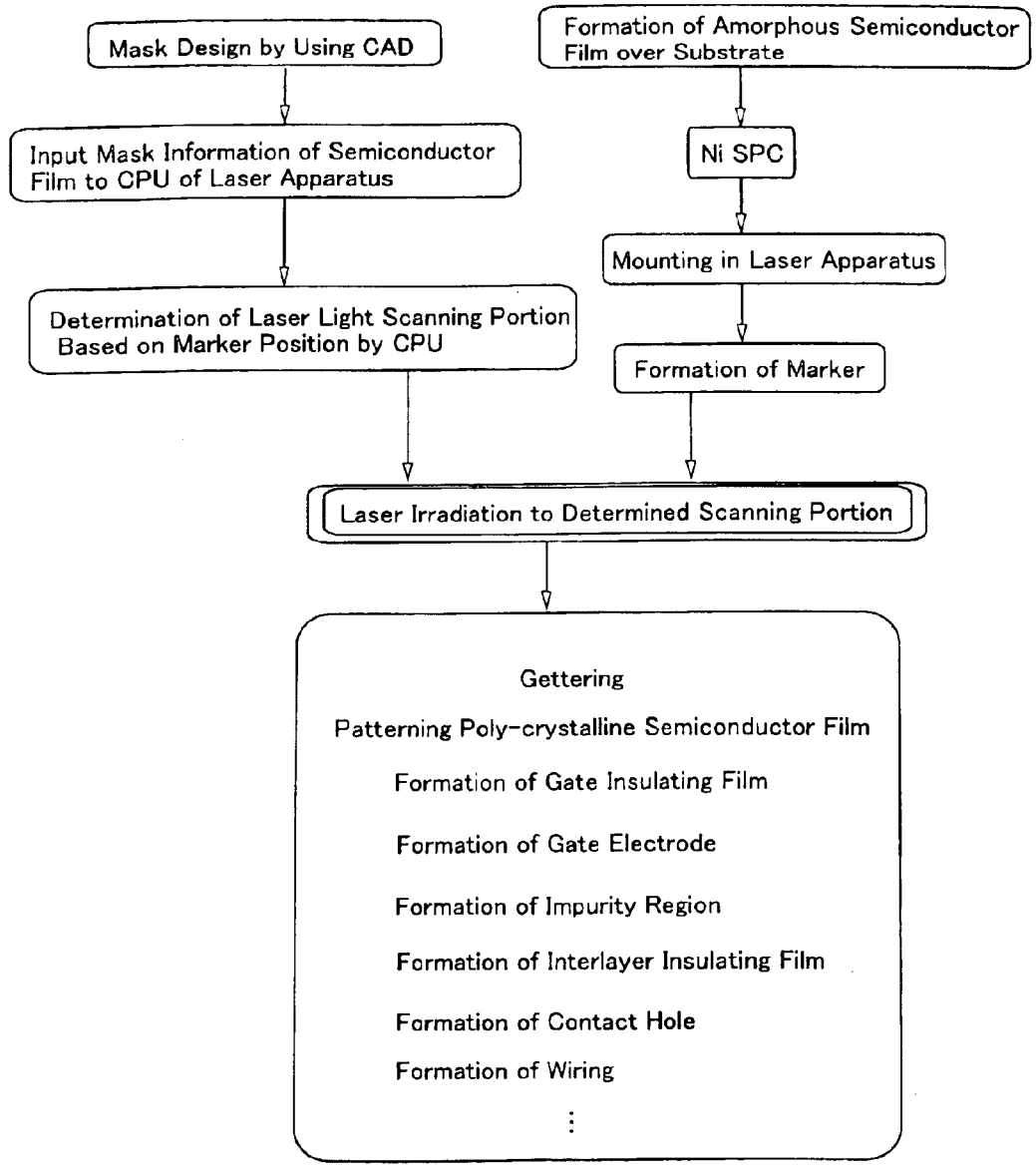
FIG. 10 is another flowchart showing the operation flow of the production system of the present invention.

It should be noted here that FIG. 10 shows a flowchart of the production system of the present invention in the case where there is included a step for crystallizing the semiconductor film using a catalyst. In the case where a catalytic element is used, it is preferable that there is used the technique disclosed in JP 07-130652 A or JP 08-78329 A.

FIG. 10 differs from FIG. 8 in that FIG. 10 includes a step (NiSPC) for crystallizing an amorphous semiconductor film using Ni after the formation of this film. In the case where there is used the technique disclosed in JP 07-130652 A, for instance, a nickel-containing layer is formed by applying a nickel acetate solution containing 10 ppm nickel on a weight basis onto the amorphous semiconductor film. Then, after a dehydrogenation step is performed for one hour at 500° C., crystallization is performed by performing heat treatment for four to 12 hours at 500 to 650° C. (for eight hours at 550° C., for instance). Note that as to a usable catalytic element, an element such as germanium (Ge), iron (Fe), palladium (Pd), tin (Sn), lead (Pd), cobalt (Co), platinum (Pt), copper (Cu), or gold (Au) may be used in addition to nickel (Ni).

Then, in FIG. 10, the crystallinity of the semiconductor film crystallized by NiSPC is further enhanced using the irradiation of laser lights. A polycrystalline semiconductor film obtained by the laser light irradiation contains the catalytic element and there is performed a step (gettering) for removing the catalytic element from the crystalline semiconductor film after the laser light irradiation in FIG. 10. It is possible to use the technique disclosed in JP 10-135468 A or JP 10-135469 A to perform the gettering.

In more detail, phosphorus is added to a part of the polycrystalline semiconductor film obtained after the laser irradiation and heat treatment is performed in a nitrogen atmosphere for five to 24 hours at 550 to 800° C. (for 12 hours at 600° C., for instance). As a result of this processing, the region of the polycrystalline semiconductor film, in which there has been added the phosphorus, functions as a gettering site and it becomes possible to segregate the phosphorus existing in the polycrystalline semiconductor film in the region in which the phosphorus has been added. Following this, by removing the region of the polycrystalline semiconductor film, in which the phosphorous has been added, through patterning, it is possible to obtain island-like semiconductor films in which the density of the catalytic element is reduced to $1 \times 10^{17}$ atms/cm$^3$ or below, preferably, around $1 \times 10^{16}$ atms/cm$^3$.

As described above, with the present invention, laser lights are not scanned and irradiated on the entire surface of the semiconductor film but are scanned so that it is possible to crystallize at least each indispensable portion. With the construction described above, it becomes possible to save a time taken to irradiate the laser lights onto each portion to be removed through patterning after the crystallization of the semiconductor film and to significantly shorten a time taken to process one substrate.

Also, it is possible to change the widths of the paths of laser lights, so that it becomes possible to prevent a situation where the edges of the paths of the laser lights overlap a semiconductor obtained through patterning. It is also possible to reduce damage inflicted on a substrate by the irradiation of the laser lights onto each unnecessary portion.

EMBODIMENTS

Hereinafter, there will be described embodiments of the present invention.

[Embodiment 1]

In this embodiment, there will be described an optical system used for the laser apparatus of the present invention.

Figure 11A:
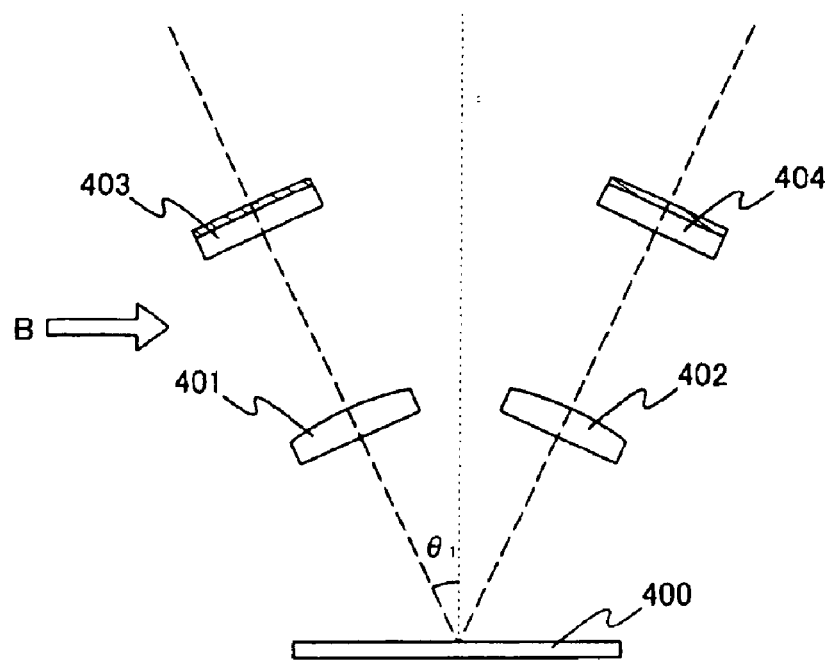
FIGS. 11A and 11B show an optical system of the laser apparatus of the present invention.
Figure 11B:
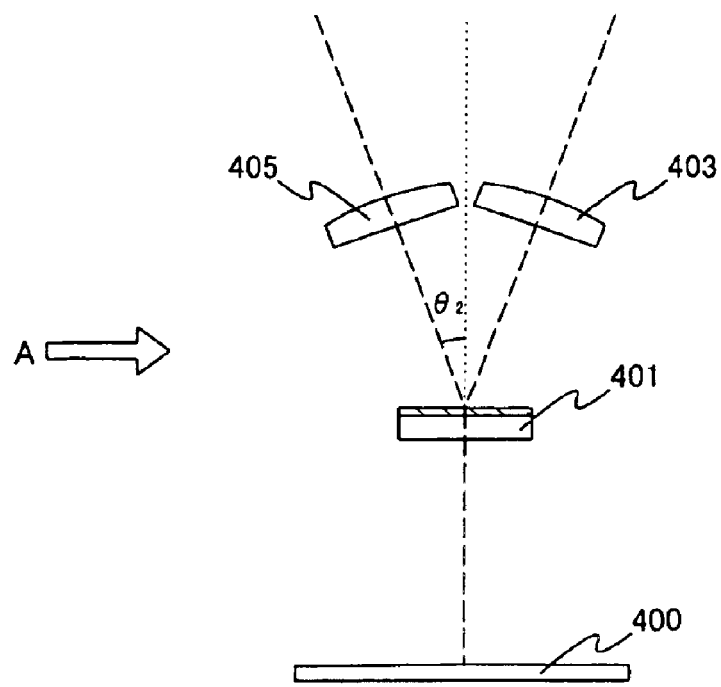

FIGS. 11A and 11B show a concrete construction of the optical system used for the laser apparatus of the present invention. FIG. 11A is a side view of the optical system of the laser apparatus of the present invention and FIG. 11B is a side view taken in the direction of arrow B in FIG. 11A. Note that the side view taken in the direction of arrow A in FIG. 11B corresponds to FIG. 11A.

FIGS. 11A and 11B respectively show an optical system in the case where four beam spots are combined into one beam spot. Note that in the present invention, the number of beam spots to be combined is not limited to this and there occurs no problem so long as the number of beam spots to be combined is in a range of from two to eight.

Figure 12:
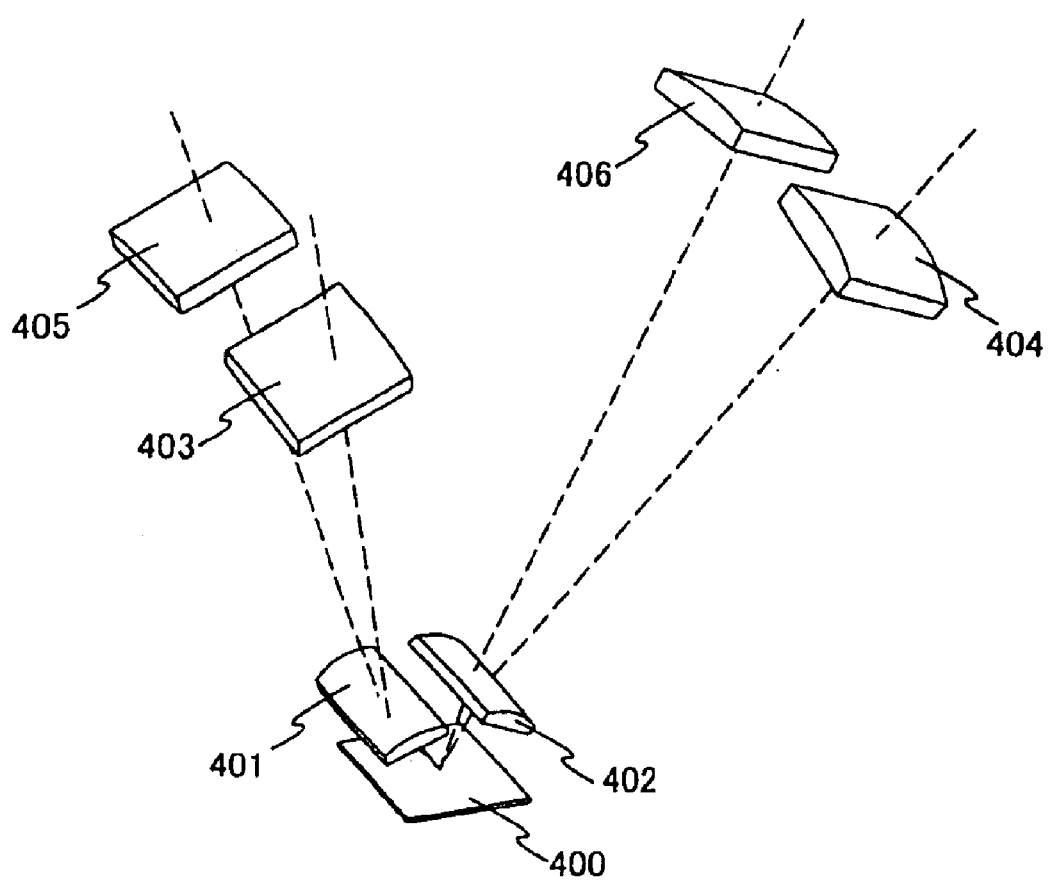
FIG. 12 also shows the optical system of the laser apparatus of the present invention.

Reference numerals 401, 402, 403, 404, and 405 each denote a cylindrical lens and the optical system of this embodiment uses six cylindrical lenses, although not shown in FIGS. 11A and 11B. FIG. 12 is a perspective view of the optical system shown in FIGS. 11A and 11B. Laser lights from different laser oscillation apparatuses are incident on the cylindrical lenses 403, 404, 405, and 406, respectively.

Then, laser lights, whose beam spot shapes have been processed by the cylindrical lenses 403 and 405, are incident on the cylindrical lens 401. The beam spot shapes of the incident laser lights are processed by the cylindrical lens and are irradiated onto an object to be processed 400. Also, laser lights, whose beam spot shapes have been processed by the cylindrical lenses 404 and 406, are incident on the cylindrical lens 402. The beam spot shapes of the incident laser lights are processed by the cylindrical lens and are irradiated onto the object to be processed 400.

On the object to be processed 400, the beam spots of the laser lights are made to overlap each other and are combined into one beam spot.

It should be noted here that in this embodiment, the focal distance of the cylindrical lenses 401 and 402 that are closest to the object to be processed 400 is set at 20 mm and the focal distance of the cylindrical lenses 403 to 406 is set at 150 mm. In addition, in this embodiment, each lens is set so that the incident angle $\theta_1$ of laser lights from the cylindrical lenses 401 and 402 to the object to be processed 400 becomes 25° and the incident angle $\theta_2$ of laser lights from the cylindrical lenses 403 to 406 to the cylindrical lenses 401 and 402 becomes 10°.

It should be noted here that it is possible for a designer to set the focal distance and incident angle of each lens as appropriate. Further, the number of cylindrical lenses is not limited to this and the optical system used is not limited to cylindrical lenses. It is sufficient that in the present invention, there is used an optical system that is capable of processing the beam spot of a laser light oscillated from each laser oscillation apparatus so that there is obtained a shape and energy density suited for the crystallization of a semiconductor film and of combining the beam spots of all laser lights into one beam spot by having the beam spots overlap each other.

It should be noted here that in this embodiment, there has been described an example where four beam spots are combined. In this case, there are provided four cylindrical lenses, which respectively correspond to four laser oscillation apparatuses, and two cylindrical lenses that correspond to the four cylindrical lenses. In the case where beam spots, whose number is n (n=2, 4, 6, or 8), are combined, there are provided n cylindrical lenses, which respectively correspond to n laser oscillation apparatuses, and n/2 cylindrical lenses that correspond to the n cylindrical lenses. In the case where beam spots, whose number is n (n=3, 5, or 7), are combined, there are provided n cylindrical lenses, which respectively correspond to n laser oscillation apparatuses, and (n+1)/2 cylindrical lenses that correspond to the n cylindrical lenses.

It should be noted here that in order to prevent a situation where a returning light returns by following the optical path that the light originally followed, it is preferable that the incident angle with respect to a substrate is maintained at a degree that is larger than 0° and is smaller than 90°.

Also, in order to realize the uniform irradiation of laser lights, in the case where the shape of each beam that is a plane perpendicular to an irradiation surface and is not yet synthesized is regarded as a rectangle, if either of a plane containing a short side of the rectangle or a plane containing a long side of the rectangle is defined as an incident surface, when the length of the short side or long side contained in the incident surface is referred to as "W" and the thickness of a substrate that is placed on the irradiation surface and has a transmission property with respect to the laser lights is referred to as "d", it is preferable that the incident angle θ of the laser lights satisfies a condition of θ arctan (W/2d). It is required that this condition is satisfied by each laser light before the synthesizing. Note that when the paths of the laser lights do not exist on the incident surface, the incident angle, at which the paths are projected on the incident surface, is regarded as θ. If the laser lights are incident at this incident angle θ, there occurs no interference between a reflection light on the surface of the substrate and a reflection light from the underside of the substrate, which makes it possible to perform uniform irradiation of the laser lights. The above description has been made by assuming that the refractive index of the substrate is one. In actual cases, many substrates have a refractive index of around 1.5 and a calculated value that is greater than the angle calculated in the above description is obtained if consideration is given to this numerical value. However, the energies on both sides of the beam spots in the longitudinal direction are attenuated, so that the effect of the interference in these portions is small and there is sufficiently obtained the effect of attenuating the interference at the calculated value described above.

[Embodiment 2]

In this embodiment, there will be described an example of changing the size of the beam spot of the laser light while irradiating the laser lights.

The laser apparatus of the present invention grasps each portion that should be scanned with the laser lights based on inputted information concerning masks using the CPU. Further, in this embodiment, the length of the beam spot is changed in accordance with the shapes of the masks.

Figure 13:
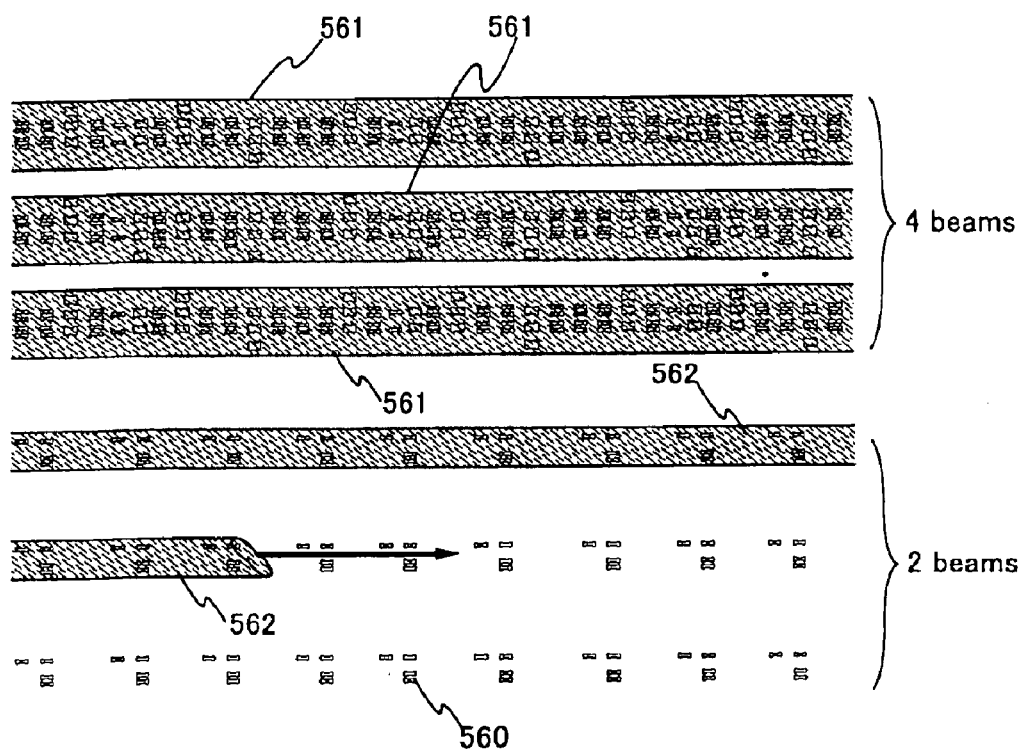
FIG. 13 shows the direction in which the laser lights move on the object to be processed.

FIG. 13 shows an example of the relation between the shapes of the masks for patterning a semiconductor film and the length of the beam spot. Reference numeral 560 shows the shapes of the masks for patterning the semiconductor film, and after the crystallization by laser irradiation, the semiconductor film is patterned in accordance with the masks.

Reference numerals 561 and 562 denote portions irradiated with the laser lights. Note that reference numeral 561 represents each portion scanned with a beam spot obtained by superimposing and combining beam spots of laser lights outputted from four laser oscillation apparatuses. On the other hand, reference numeral 562 indicates each portion scanned with a beam spot obtained by superimposing and combining beam spots of laser lights outputted from two laser oscillation apparatuses.

The beam spot obtained by synthesizing laser lights outputted from two laser oscillation apparatuses is obtained by terminating the oscillation by two laser oscillation apparatuses out of four laser oscillation apparatuses. In this case, however, it is important that two beam spots outputted from remaining two laser oscillation apparatuses are made to overlap each other.

It should be noted here that in the case where the lengths of beam spots are changed halfway through the scanning of laser lights like in this embodiment, the changing of the beam spot lengths from a long side to a short side is more preferable than the changing thereof from the short side to the long side because there are stabilized the outputs from the laser oscillation apparatuses. Consequently, it is preferable that the CPU gives consideration to the scanning order of the laser lights so that the beam spot lengths are changed from the long side to the short side based on information concerning the shapes of masks. Further, it is possible to design the masks with consideration given to the scanning order of the laser lights at a stage of designing the mask.

With the construction described above, it becomes possible to change the widths of paths of laser lights, so that it becomes possible to prevent a situation where the edges of the paths of the laser lights are superimposed on a semiconductor obtained through patterning. It is also possible to further reduce damage inflicted on a substrate by the irradiation of the laser lights onto each unnecessary portion.

It is possible to implement this embodiment in combination with the first embodiment.

[Embodiment 3]

In this embodiment, there will be described an example where laser lights are blocked by a shutter possessed by an optical system halfway through the irradiation of the laser lights, thereby irradiating the laser lights only onto each predetermined portion.

The laser apparatus of the present invention grasps each portion that should be scanned with the laser lights based on inputted information concerning masks using the CPU. Further, in this embodiment, the laser lights are blocked using the shutter so that the laser lights are irradiated only onto each portion that should be scanned. It is desirable that during this operation, the shutter is capable of blocking the laser lights and also is formed using a material with which there is prevented a situation where the shutter is deformed or damaged by the laser lights.

Figure 14:
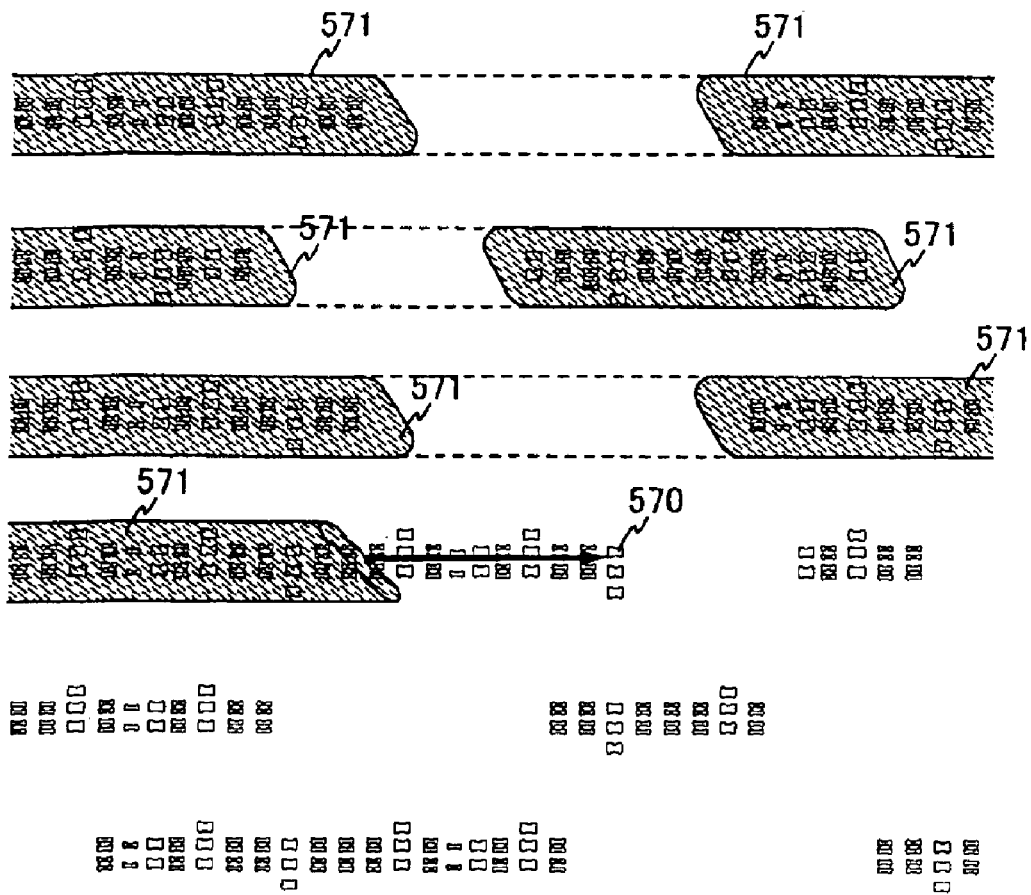
FIG. 14 shows the direction in which the laser lights move on the object to be processed.

FIG. 14 shows an example of the relation between the shapes of the masks for patterning a semiconductor film and portions to be irradiated with laser lights. Reference numeral 570 shows the shapes of the masks for patterning the semiconductor film, and after the crystallization by laser irradiation, the semiconductor film is patterned in accordance with the masks.

Reference numeral 571 shows each portion irradiated with the laser lights. The broken lines specify each portion in which the laser lights were blocked by the shutter. In this embodiment, it is possible to prevent the irradiation of the laser lights onto each portion for which crystallization is not required or it is possible to reduce the energy densities of the laser lights even if the laser lights are irradiated onto such a portion. As a result, it becomes possible to further reduce damage inflicted on a substrate by the irradiation of the laser lights onto unnecessary portions.

It is possible to implement this embodiment in combination with the first embodiment or the second embodiment.

[Embodiment 4]

In this embodiment, there will be described an example where changing the scanning direction of the laser lights is changed.

By setting the irradiation direction of the laser lights so as to be parallel to a direction in which carriers in channel formation regions move, there is obtained a situation where the growing direction of crystal grains in the semiconductor film overlaps the moving direction of the carriers and it becomes possible to enhance the mobility. Because of constraints concerning the designing of a circuit, however, there is a case where it is difficult to lay out all active layers so that the channel formation regions are parallel to the carrier moving direction. In this case, it is preferable that the scanning direction of the laser lights is changed in accordance with information concerning masks.

Figure 15:
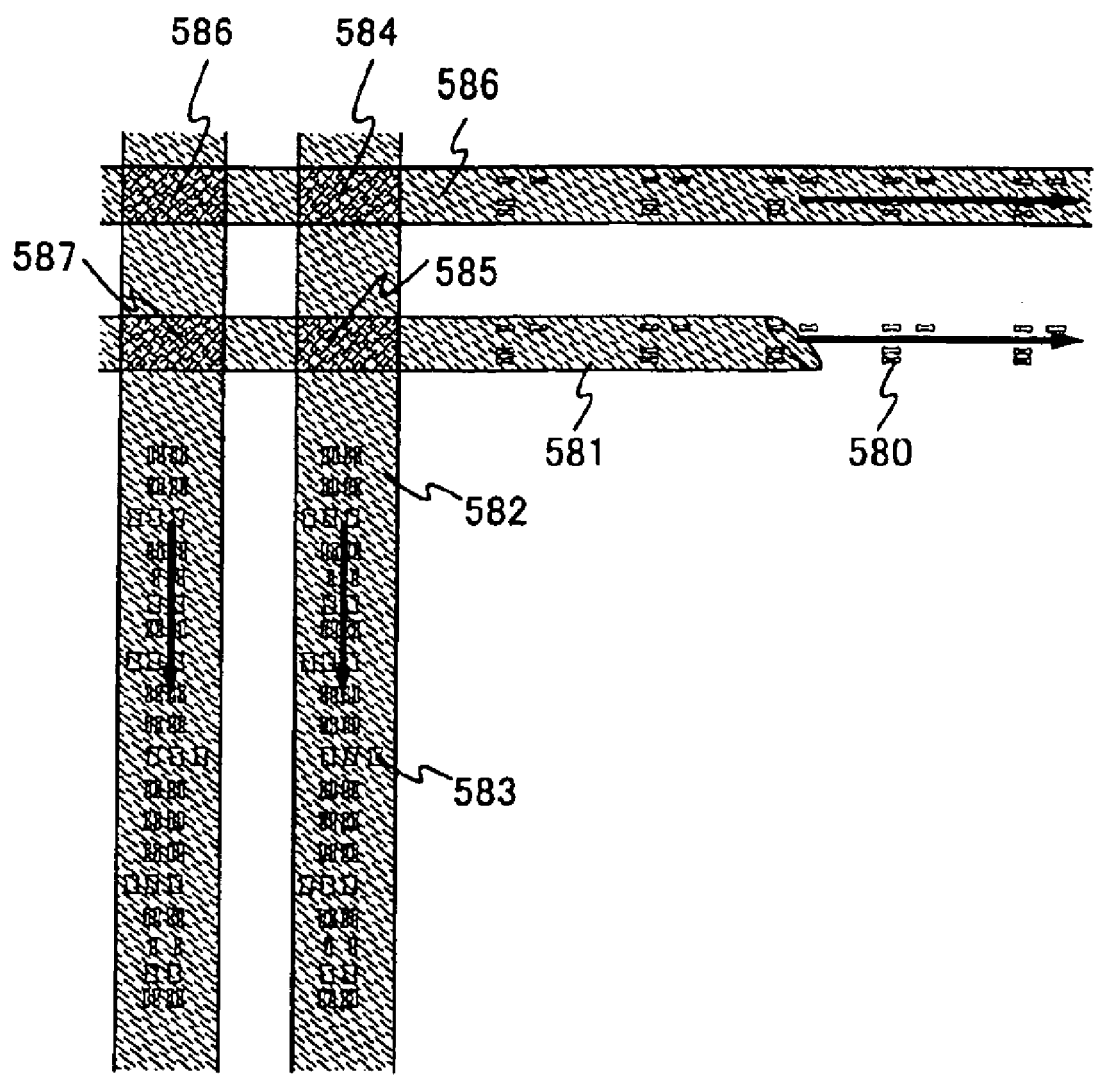
FIG. 15 shows directions in which the laser lights move on the object to be processed.

FIG. 15 shows an example of the relation between the shapes of the masks for patterning the semiconductor film and portions to be irradiated with the laser lights. Reference numerals 580 and 583 show the shapes of the masks for patterning the semiconductor film and, after the crystallization by laser irradiation, the semiconductor film is patterned in accordance with the masks. The masks given reference numerals 580 and 583 are designed so that the directions, in which carriers move in channel formation regions, become perpendicular to each other.

The laser apparatus of the present invention grasps each portion to be scanned with the laser lights using the CPU based on inputted information concerning the masks. On the other hand, the carrier moving direction in a channel formation region of each island-like semiconductor film obtained through patterning is inputted into the CPU as information. Specifically, there is predetermined a laser light scanning direction with respect to the shape of each active layer. Then, the CPU refers to the predetermined laser light scanning direction with respect to the shape of the active layer and compares it with the shape of each active layer obtained from the shapes of the masks, and determines the scanning direction of each portion to be scanned of the semiconductor film.

Reference numeral 581 shows a portion on which the laser lights have been irradiated when the laser lights were scanned in a horizontal direction, with the scanning direction being parallel to the carrier moving direction of a portion that will become the channel formation region of the island-like semiconductor film 580 obtained after the patterning. Reference numeral 582 indicates a portion on which the laser lights were irradiated when the laser lights were scanned in a vertical direction, with its scanning direction being parallel to the carrier moving direction of a portion that will become the channel formation region of the island-like semiconductor film 583 obtained after the patterning.

It should be noted here that as indicated by reference numerals 584 to 587 in FIG. 15, the surface of the semiconductor film in each portion, in which laser lights having different scanning directions are superimposed and irradiated, is placed in a rough state, so that there is a possibility that there is exerted an adverse effect on the characteristics of a gate insulating film to be formed afterward and it is not preferable that such a semiconductor film is used as the active layer of a TFT. Consequently, it is preferable that the scanning direction and scanning portion of the laser lights are determined at a stage of designing the masks and the layout of the masks is determined so that the island-like semiconductor films are not disposed in such portions in which the laser lights overlap each other.

Also, there occurs no problem even if the situation where the edge portions of the paths of the laser lights overlap the island-like semiconductor films is prevented by changing the lengths of the beam spots of the laser lights in the center axis direction like in the second embodiment. Also, there occurs no problem even if the situation where the edge portions of the paths of the laser lights overlap the island-like semiconductor films is prevented or the situation where the laser lights overlap each other is prevented using a shutter like in the third embodiment.

It is possible to implement this embodiment in combination with the first to third embodiments.

[Embodiment 5]

In this embodiment, there will be described an example of a marker provided on a marker forming portion 423.

Figure 16A:
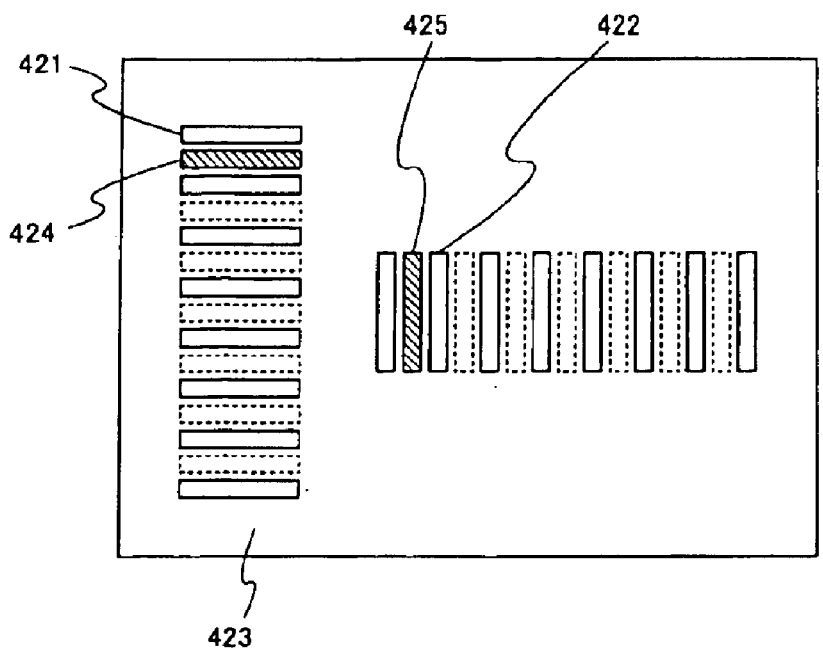
FIGS. 16A and 16B show a construction of markers.

FIG. 16A shows the top view of markers of this embodiment. Reference numerals 421 and 422 denote markers (hereinafter referred to as the "reference markers") that will function as reference points formed in a semiconductor film, with each of the reference markers having a rectangular shape. All of the reference markers 421 are disposed so that long sides of the rectangles extend in the horizontal direction, with respective reference markers 421 being disposed in the Vertical direction at regular intervals. All of the reference markers 422 are disposed so that long sides of the rectangles extend in the vertical direction, with respective reference markers 422 being disposed in the horizontal direction at regular intervals.

The reference markers 421 become reference points with reference to which there are determined the positions of the masks in the vertical direction, while the reference markers 422 become reference points with reference to which there are determined the positions of the masks in the horizontal direction. Reference numerals 424 and 425 denote markers for the masks for patterning the semiconductor film, with each of the markers having a rectangular shape. The positions of the masks for the semiconductor patterning are determined so that the long sides of the rectangular marker 424 are disposed in the horizontal direction and the long sides of the rectangular marker 425 are disposed in the vertical direction. In addition, the positions of the masks for the semiconductor patterning are determined so that the masks are precisely positioned at the center between two adjacent reference markers 421 that determine the markers 424 and are also precisely positioned at the center between two adjacent reference markers 422 that determine the markers 425.

Figure 16B:
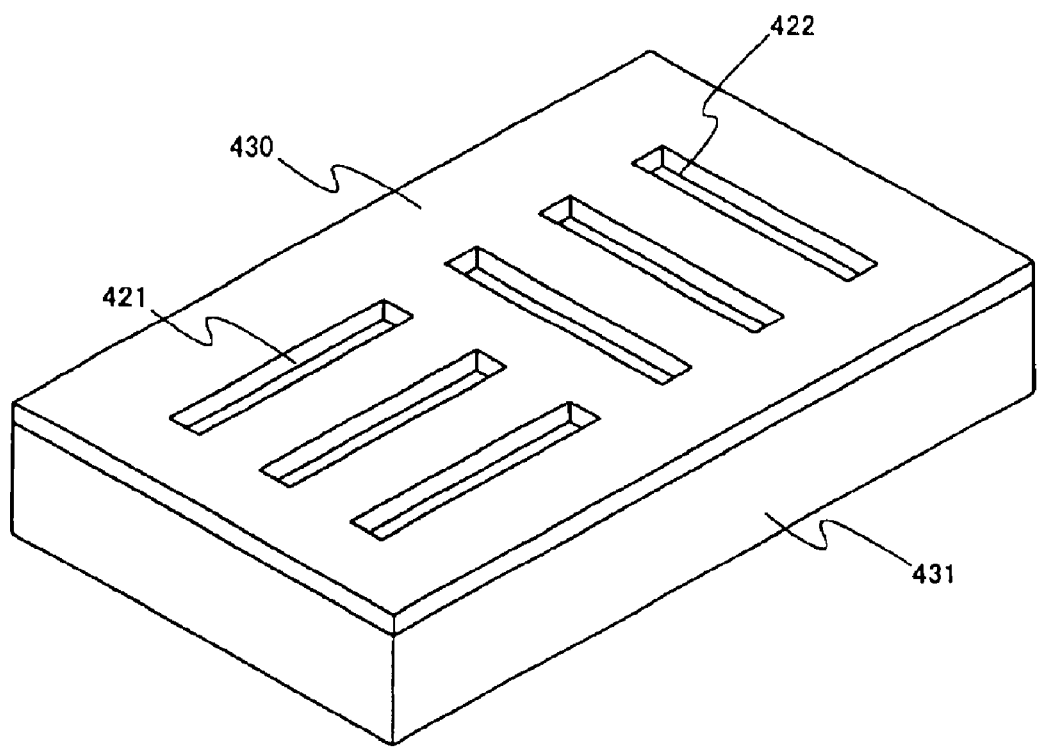

FIG. 16B is a perspective view of the reference markers formed in the semiconductor film. Parts of the semiconductor film 430 formed on the substrate 431 are cut away by a laser in a rectangular shape and the cut-away portions function as the reference markers 421 and 422.

It should be noted here that the markers described in this embodiment are just an example and the markers of the present invention are not limited to these markers. There occurs no problem so long as it is possible to form the markers of the present invention prior to the crystallization of the semiconductor film with the laser lights and also to use the markers even after the crystallization by the irradiation of the laser lights.

It is possible to implement this embodiment in combination with the first to fourth embodiments.

[Embodiment 6]

In this embodiment, there will be described an optical system used for eight laser oscillation apparatuses of the present invention.

Figure 17:
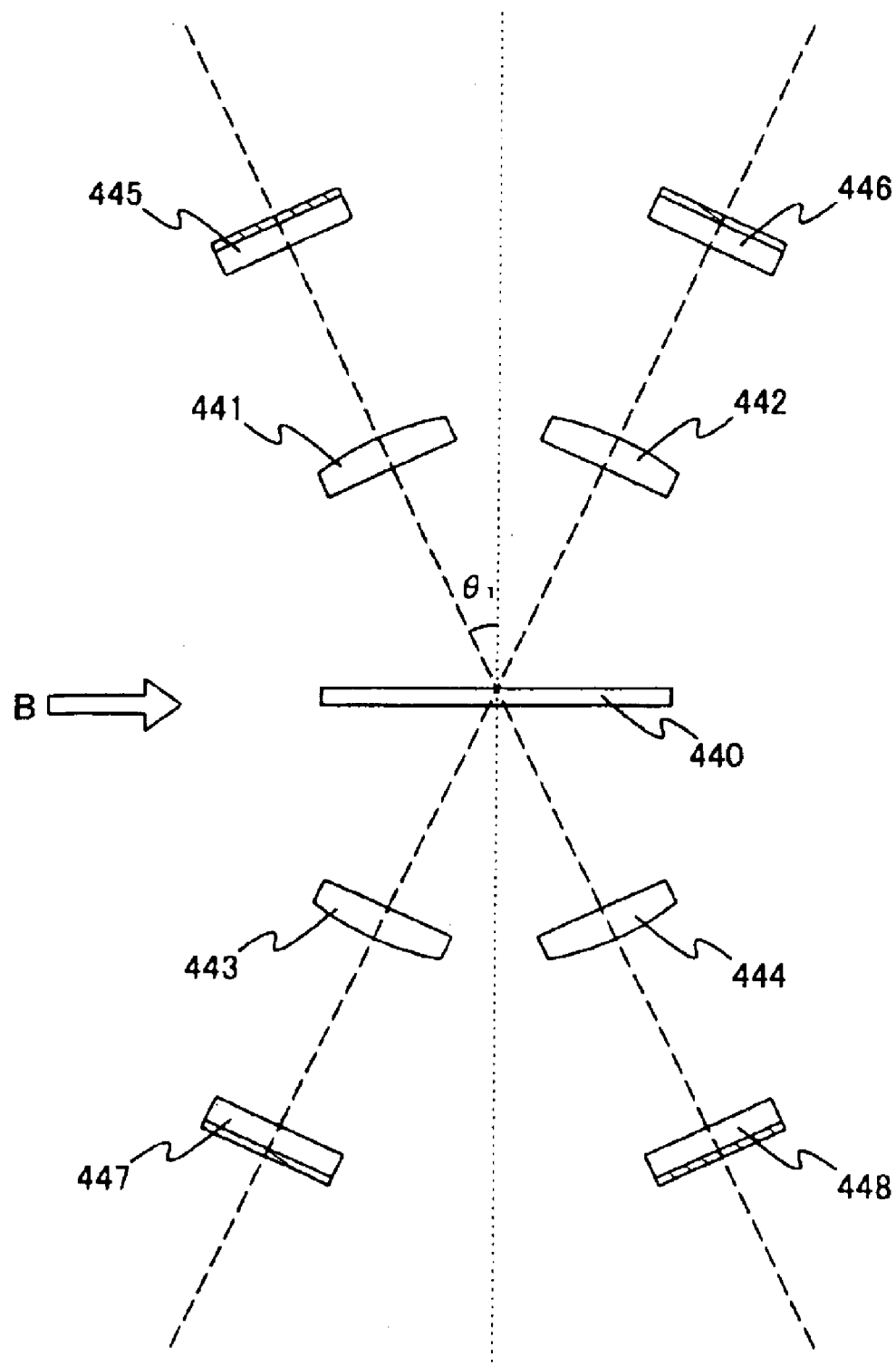
FIG. 17 shows an optical system of the laser apparatus of the present invention.
Figure 18:
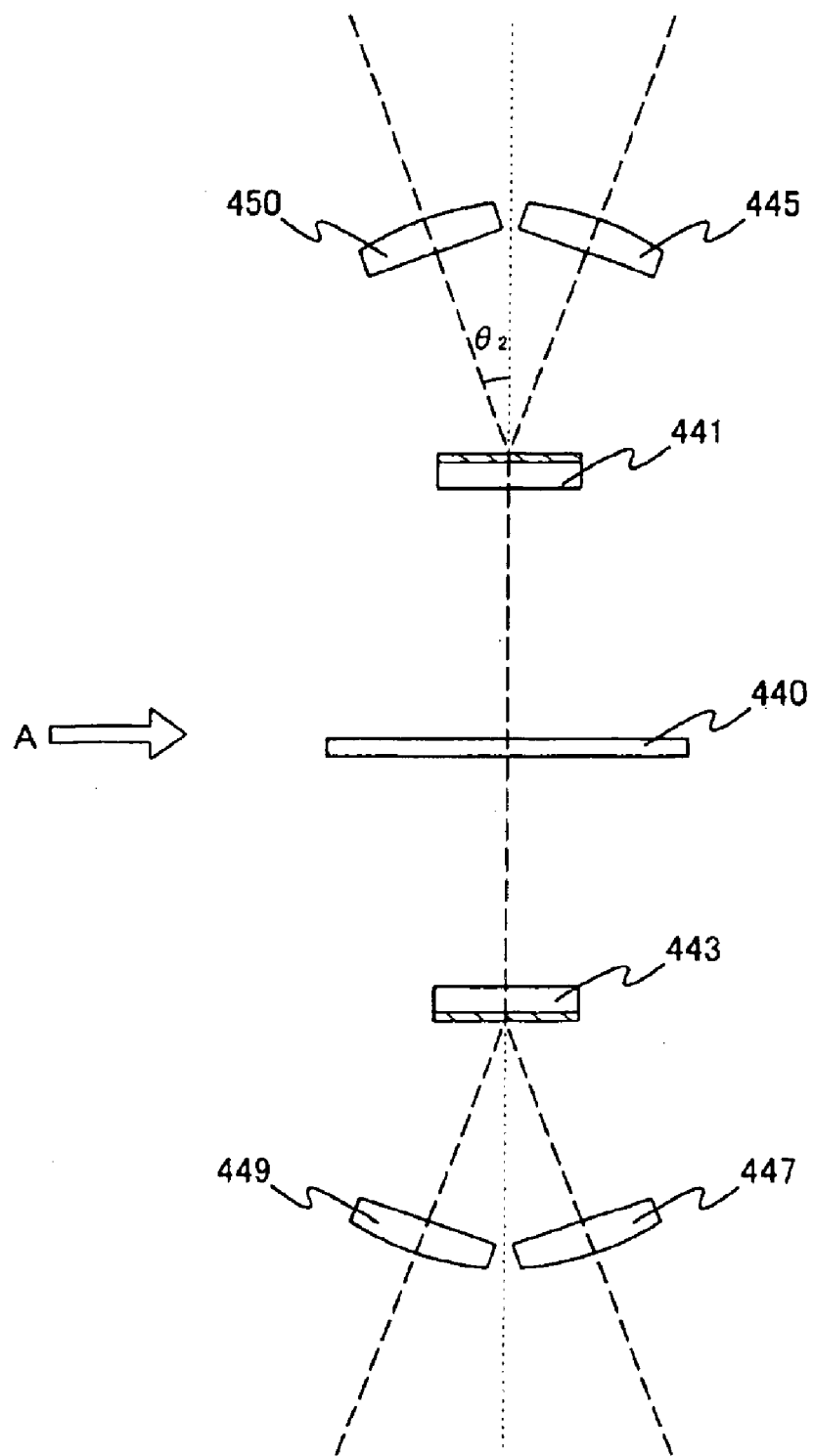
FIG. 18 also shows the optical system of the laser apparatus of the present invention.

FIGS. 17 and 18 show a concrete construction of the optical system used for the laser apparatus of the present invention. FIG. 17 is a side view of the optical system of the laser apparatus of the present invention and FIG. 18 is a side view taken in the direction of arrow B in FIG. 17. Note that the side view taken in the direction of arrow A in FIG. 18 corresponds to FIG. 17.

This embodiment respectively show an optical system in the case where eight beam spots are combined into one beam spot. Note that in the present invention, the number of beam spots to be combined is not limited to this and there occurs no problem so long as the number of beam spots to be combined is in a range of from two to eight.

Figure 19:
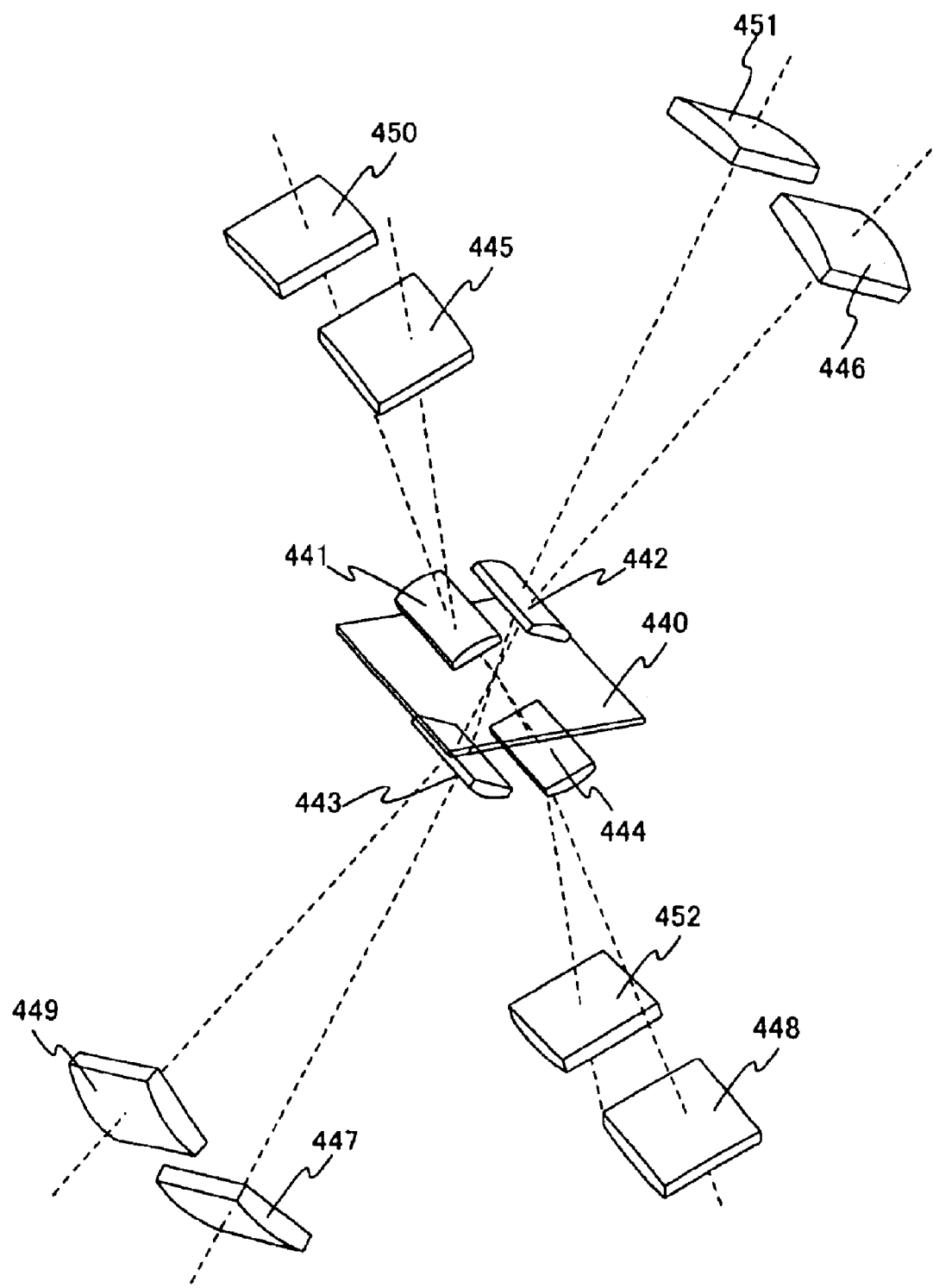
FIG. 19 also shows the optical system of the laser apparatus of the present invention.

Reference numerals 441 to 450 each denote a cylindrical lens and the optical system of this embodiment uses twelve cylindrical lenses, although not shown in FIGS. 17 and 18. FIG. 19 is a perspective view of the optical system shown in FIGS. 17 and 18. Laser lights from different laser oscillation apparatuses are incident on the cylindrical lenses 441 to 444, respectively.

Then, laser lights, whose beam spot shapes have been processed by the cylindrical lenses 450 and 445, are incident on the cylindrical lens 441. The beam spot shapes of the incident laser lights are processed by the cylindrical lens 441 and are irradiated onto an object to be processed 440. Also, laser lights, whose beam spot shapes have been processed by the cylindrical lenses 451 and 446, are incident on the cylindrical lens 442. The beam spot shapes of the incident laser lights are processed by the cylindrical lens 442 and are irradiated onto an object to be processed 440. Also, laser lights, whose beam spot shapes have been processed by the cylindrical lenses 449 and 447, are incident on the cylindrical lens 443. The beam spot shapes of the incident laser lights are processed by the cylindrical lens 443 and are irradiated onto the object to be processed 440. Also, laser lights, whose beam spot shapes have been processed by the cylindrical lenses 452 and 448, are incident on the cylindrical lens 444. The beam spot shapes of the incident laser lights are processed by the cylindrical lens 444 and are irradiated onto the object to be processed 440.

On the object to be processed 440, the beam spots of the laser lights are made to overlap each other and are combined into one beam spot.

It should be noted here that in this embodiment, the focal distance of the cylindrical lenses 441 and 442 that are closest to the object to be processed 440 is set at 20 mm and the focal distance of the cylindrical lenses 445 to 452 is set at 150 mm. In addition, in this embodiment, each lens is set so that the incident angle $\theta_1$ of laser lights from the cylindrical lenses 441 and 452 to the object to be processed 440 becomes 25° and the incident angle $\theta_2$ of laser lights from the cylindrical lenses 445 to 452 to the cylindrical lenses 441 and 442 becomes 10°.

It should be noted here that it is possible for a designer to set the focal distance and incident angle of each lens as appropriate. Further, the number of cylindrical lenses is not limited to this and the optical system used is not limited to cylindrical lenses. It is sufficient that in the present invention, there is used an optical system that is capable of processing the beam spot of a laser light oscillated from each laser oscillation apparatus so that there is obtained a shape and energy density suited for the crystallization of a semiconductor film and of combining the beam spots of all laser lights into one beam spot by having the beam spots overlap each other.

It should be noted here that in this embodiment, there has been described an example where eight beam spots are combined. In this case, there are provided eight cylindrical lenses, which respectively correspond to eight laser oscillation apparatuses, and four cylindrical lenses that correspond to the eight cylindrical lenses.

This embodiment may be implemented by combining with Embodiments 1 to 5.

[Embodiment 7]

In this embodiment, a method of manufacturing an active matrix substrate will be described with reference to FIGS. 25 to 28. A substrate on which a CMOS circuit, a driver circuit, and a pixel portion having a pixel TFT and a retention capacity are formed together for convenience is referred to as an active matrix substrate for convenience.

First of all, a substrate 600 formed of glass such as barium borosilicate glass and aluminum borosilicate glass is used in this embodiment. The substrate 600 may be a quartz substrate, a silicon substrate, a metal substrate or stainless substrate, which has an insulating film on the surface. The substrate 600 may be a plastic substrate having heat resistance, which withstands a processing temperature in this embodiment.

Next, an amorphous semiconductor film 692 is formed on the substrate 601 by publicly known method (such as the sputtering method, LPCVD method and plasma CVD method) (FIG. 25A). In this embodiment, an amorphous semiconductor film is formed. However, micro-crystalline semiconductor film and crystalline semiconductor film may be formed. In addition, a compound semiconductor film having an amorphous structure such as an amorphous silicon germanium film may be used.

The amorphous semiconductor film 692 is crystallized by using the laser crystallization. The laser crystallization is conducted by using the laser apparatus of the present invention. In the present invention, the amorphous semiconductor film is crystallized in part according to a mask information inputted into CPU of the laser apparatus. Of course, the crystallization may be conducted by using not only the laser crystallization, but also being combined with another known crystallization method (thermal crystallization method using RTA and an annealing furnace or using metal elements promoting crystallization).

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a wavelength of 532 nm) or the third harmonic (with a wavelength of 355 nm) of an Nd: YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser beams so as to irradiate the semiconductor film.

Note that, a gas laser or solid-state laser of continuous oscillation type or pulse oscillation type can be used. The gas laser such as an excimer laser, Ar laser, Kr laser and the solid-state laser such as YAG laser, YVO$_4$ laser, YLF laser, YAlO$_3$ laser, glass laser, ruby laser, alexandrite laser, Ti: sapphire laser, Y$_2$O$_3$ laser can be used as the laser beam. Also, crystals such as YAG laser, YVO$_4$ laser, YLF laser, YAlO$_3$ laser wherein Cr, Nd, Er, Ho, Ce, Co, Ti, Yb or Tm is doped can be used as the solid-state laser. A basic wave of the lasers is different depending on the materials of doping, therefore a laser beam having a basic wave of approximately 1 µm is obtained. A harmonic corresponding to the basic wave can be obtained by the using non-linear optical elements.

By the above-mentioned laser crystallization, the crystallized regions 693, 694, and 695 are formed that is crystallized in part in the amorphous semiconductor film (FIG. 25B).

The island like semiconductor films 602 to 606 are formed from the crystallized regions 693, 694, and 695 by performing patterning processing the crystallized semiconductor film into desired shape that is increased the crystallinity (FIG. 25C).

After the island like semiconductor films 602 to 606 are formed, a small amount of impurity element (boron or phosphorus) may be doped in order to control a threshold value of the TFT.

Next, a gate insulating film 607 covering the island like semiconductor films 602 to 606 is formed. The gate insulating film 607 is formed by using an insulating film containing silicon with a thickness of 40 to 150 nm by using plasma CVD method or sputtering method. In this embodiment, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (TEOS) and O$_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film produced in this way as a gate insulating film.

Next, a first conductive film 608, which is 20 to 100 nm in thickness, and a second conductive film 609, which is 100 to 400 nm in thickness, is stacked on the gate insulating film 607. In this embodiment, the first conductive film 608 formed by a TaN film with a thickness of 30 nm and the second conductive film 609 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride (WF$_6$). In both cases, the use of the gate electrode needs low resistance. Therefore, the resistivity of the W film is desirably 20 µΩcm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 µΩcm can be achieved.

While, in this embodiment, the first conductive film 608 is TaN and the second conductive film 609 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Note that, it is important that appropriate etching method or kinds of etchant is properly selected depending on the materials of a conductive film.

Next, masks 610 to 615 made of resist using photolithography method are formed, and first etching processing is performed thereon in order to form electrodes and wires. The first etching processing is performed under first and second etching conditions (FIG. 26B). The first etching condition in this embodiment is to use Inductively Coupled Plasma (ICP) etching and to use CF$_4$ and Cl$_2$ and O$_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 610 to 615 made of resist. Then, CF$_4$ and Cl$_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the first etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 617 to 622 in a first form are formed which include the first conductive layers and the second conductive layers (first conductive layers 617a to 622a and second conductive layer 617b to 622b) through the first etching processing. In a gate insulating film 616, an area not covered by the conductive layers 617 to 622 in the first form is etched by about 20 to 50 nm so as to form a thinner area.

Next, second etching processing is performed without removing masks made of resist (FIG. 26C). Here, $CF_4$, $Cl_2$ and $O_2$ are used as an etching gas to etch the W film selectively. Then, second conductive layers 628b to 633b are formed by the second etching processing. On the other hand, the first conductive layers 617a to 622a are hardly etched, and conductive layers 628 to 633 in the second form are formed.

First doping processing is performed without removing masks made of resist and low density of impurity element, which gives n-type to the semiconductor layer, is added. The doping processing may be performed by the ion-doping method or the ion-implanting method. The ion doping method is performed under a condition in the dose of $1\times10^{13}$ to $5\times10^{14}$ atoms/cm$^2$ and the accelerating voltage of 40 to 80 kV. In this embodiment, the ion doping method is performed under a condition in the dose of $1.5\times10^{13}$ atoms/cm$^2$ and the accelerating voltage of 60 kV. The n-type doping impurity element may be Group 15 elements, typically phosphorus (P) or arsenic (As). Here, phosphorus (P) is used. In this case, the conductive layers 628 to 633 function as masks for the n-type doping impurity element. Therefore, impurity areas 623 to 627 are formed in the self-alignment manner. An n-type doping impurity element in the density range of $1\times10^{18}$ to $1\times10^{20}$ atoms/cm$^3$ are added to the impurity areas 623 to 627.

When masks made of resist are removed, new masks 634a to 634c made of resist are formed. Then, second doping processing is performed by using higher accelerating voltage than that used in the first doping processing. The ion doping method is performed under a condition in the dose of $1\times10^{13}$ to $1\times10^{15}$ atoms/cm$^2$ and the accelerating voltage of 60 to 120 kV. In the doping processing, the second conductive layers 628b to 632b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 27A. The ion doping method is performed under a condition in the dose of $1\times10^{15}$ to $1\times10^{17}$ atoms/cm$^2$ and the accelerating voltage of 50 to 100 kV. Through the second doping processing and the third doping processing, an n-type doping impurity element in the density range of $1\times10^{18}$ to $5\times10^{19}$ atoms/cm$^3$ is added to the low density impurity areas 636, 642 and 648, which overlap with the first conductive layer. An n-type doping impurity element in the density range of $1\times10^{19}$ to $5\times10^{21}$ atoms/cm$^3$ is added to the high density impurity areas 635, 641, 644 and 647.

With proper accelerating voltage, the low density impurity area and the high density impurity area can be formed by performing the second doping processing and the third doping processing once.

Next, after removing masks made of resist, new masks 650a to 650c made of resist are formed to perform the fourth doping processing. Through the fourth doping processing, impurity areas 653, 654, 659 and 660, to which an impurity element doping a conductive type opposite to the one conductive type is added, in a semiconductor layer, which is an active layer of a p-channel type TFT. Second conductive layers 628a to 632a are used as mask against the impurity element, and the impurity element giving p-type is added so as to form impurity areas in the self-alignment manner. In this embodiment, the impurity areas 653, 654, 659 and 660 are formed by applying ion-doping method using diborane ($B_2H_6$) (FIG. 27B). During the fourth doping processing, the semiconductor layer forming the n-channel TFT is covered by masks 650a to 650c made of resist. Thorough the first to the third doping processing, phosphorus of different densities is added to each of the impurity areas 653, 654, 659 and 660. Doping processing is performed such that the density of p-type doping impurity element can be $1\times10^{19}$ to $5\times1021$ atoms/cm$^3$ in both areas. Thus, no problems are caused when they function as the source region and the drain region of the p-channel TFT.

Impurity areas are formed in the island like semiconductor layers, respectively, through the processes above.

Next, the masks 650a to 650c made of resist are removed and a first interlayer insulating film 661 is formed thereon. The first interlayer insulating film 661 may be an insulating film with a thickness of 100 to 200 nm containing silicon, which is formed by plasma CVD method or sputtering method. In this embodiment, silicon oxynitride film with a thickness of 150 nm is formed by plasma CVD method. The first interlayer insulating film 661 is not limited to the silicon oxynitride film but may be the other insulating film containing silicon in a single layer or in a laminated pad.

Next, as shown in FIG. 27C, activation processing is performed by using laser irradiation method. When a laser annealing method is used, the laser used in the crystallization can be used. When the activation processing is performed, the moving speed is same as the crystallization, and an energy density of about 0.01 to 100 MW/cm (preferably, 0.01 to 10 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 661. Alternatively, the hydrogenation may be plasma hydrogenation (using hydrogen excited by plasma) or heating processing in an atmosphere containing 3 to 100% of hydrogen at 300 to 650° C. for 1 to 12 hours.

Next, a second interlayer insulating film 662 formed by an inorganic insulating material or an organic insulator material is formed on the first interlayer insulating film 661. In this embodiment, an acrylic resin film with a thickness of 1.6 μm is formed. However, an acrylic resin film whose viscosity is 10 to 1000 cp, preferably 40 to 200 cp and which may have depressions and projections formed on the surface may be used.

In this embodiment, in order to prevent mirror reflection, a second interlayer insulating film having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same photomask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 662 may be a film having a flattened surface. In this case, after the pixel electrode is formed, projections and depressions are formed on the surface by performing an added process such as publicly known sand-blast method and etching method. Preferably, by preventing mirror reflection and by dispersing reflected light, the whiteness is increased.

Subsequently, the third interlayer insulating film 672 is formed to contact with the second interlayer insulating film 662 after the second interlayer insulating film is formed.

Figure 28:
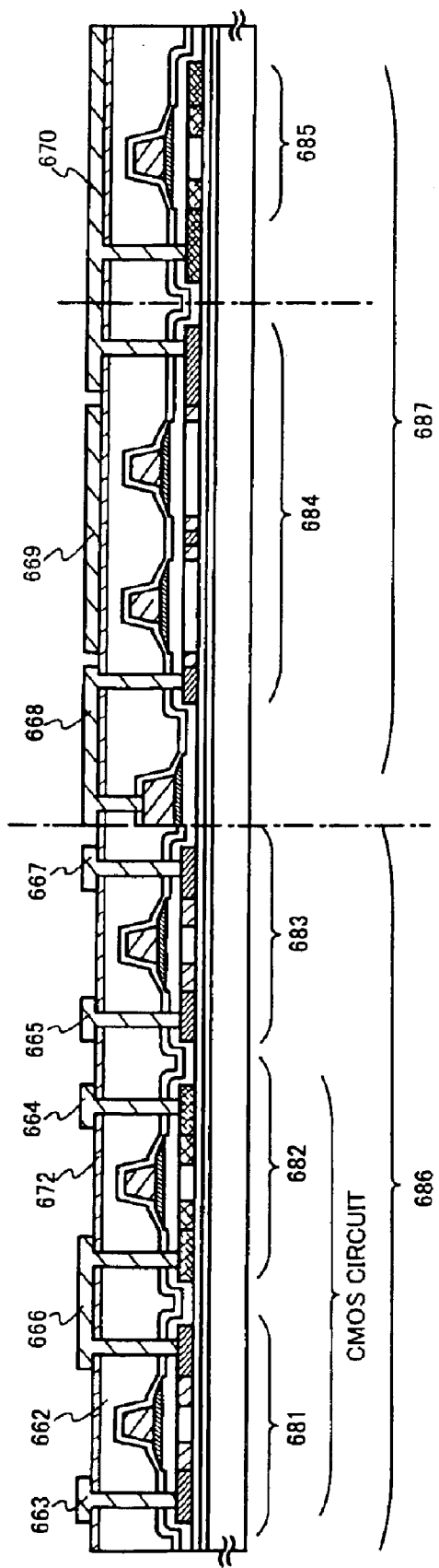
FIG. 28 shows a manufacturing method for the semiconductor device that uses the laser apparatus of the present invention.

Wirings 663 to 667 electrically connecting to impurity areas, respectively, are formed in a driver circuit 686. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 28).

In a pixel portion 687, a pixel electrode 670, a gate wiring 669 and a connecting electrode 668 are formed. Source wirings (a laminate of layers 633a and 633b) are electrically connected with a pixel TFT 684 by the connecting electrode 668. The gate wiring 669 is electrically connected with a gate electrode of the TFT pixel 684. A pixel electrode 670 is electrically connected with a drain region of the pixel TFT 684. Furthermore, the pixel electrode 670 is electrically connected with a semiconductor layer 606 functioning as one electrode forming a storage capacitor. Desirably, a material having excellent reflectivity such as a film mainly containing Al or Ag or the laminate film is used for the pixel electrode 670.

In this way, the driver circuit 686 having a CMOS circuit including an n-channel TFT 681 and a p-channel TFT 682 and a n-channel TFT 683, and the pixel portion 687 having the pixel TFT 684 and the retention capacitor 685 can be formed on the same substrate. Thus, an active matrix substrate is completed.

The n-channel TFT 681 of the driver circuit 686 has a channel forming region 637, a low density impurity area 636 overlapping with the first conductive layer 628a, which constructs a part of the gate electrode (GOLD area), and a high density impurity area 652 functioning as the source region or the drain region are implanted. The p-type channel TFT 682 forming a CMOS circuit together with the n-channel TFT 681, which are connected by an electrode 666, has a channel forming region 640, a high density impurity area 653 functioning as the source region or the drain region, and an impurity area 654 to which a p-type doping impurity element are implanted. The n-channel TFT 683 has a channel forming region 643, a low density impurity area 642 overlapping with the first conductive layer 630a, which constructs a part of the gate electrode, (GOLD area), and a high density impurity area 656 functioning as the source region or the drain region.

The pixel TFT 684 of the pixel portion has a channel forming region 646, a low density impurity area 645 formed outside of the gate electrode (LDD region) and a high density impurity area 658 functioning as the source region or the drain region. An n-type doping impurity element and a p-type doping impurity element are added to a semiconductor layer functioning as one electrode of the storage capacitor 685. The storage capacitor 685 is formed by an electrode (a laminate of layers 632a and 632b) and a semiconductor layer by using the insulating film 616 as a dielectric.

The pixel structure in this embodiment is arranged such that light can be blocked in a space between pixel electrodes and the ends of the pixel electrodes can overlap with the source wiring without using the black matrix.

This embodiment can be implemented by combining with Embodiments 1 to 8.

[Embodiment 8]

Figure 29:
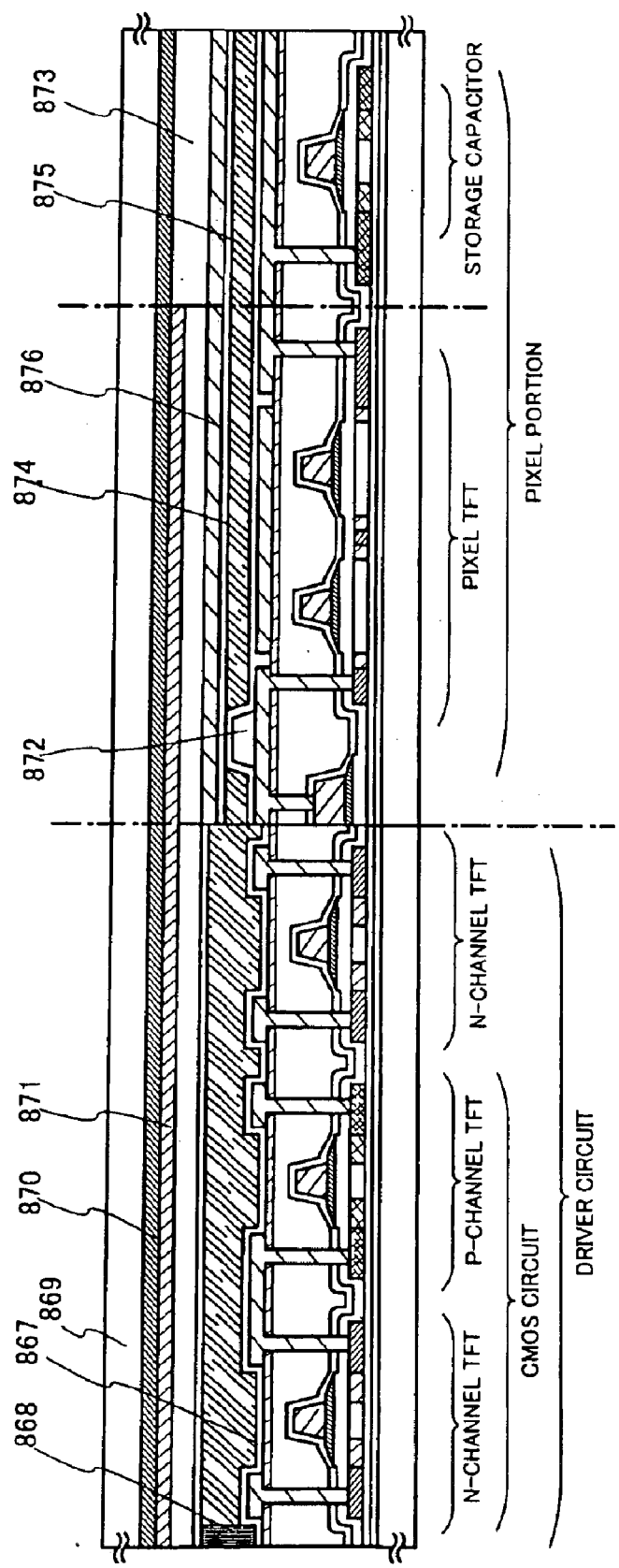
FIG. 29 shows a liquid crystal display apparatus manufactured using the laser apparatus of the present invention.

This embodiment explains, below, a process to manufacture a reflection type liquid crystal display device from the active matrix substrate made in Embodiment 7, using FIG. 29.

First, after obtaining an active matrix substrate in the state of FIG. 28 according to Embodiment 7, an orientation film 867 is formed at least on the pixel electrodes 670 on the active matrix substrate of FIG. 28 and subjected to a rubbing process. Incidentally, in this embodiment, prior to forming an orientation film 867, an organic resin film such as an acryl resin film is patterned to form columnar spacers 872 in a desired position to support the substrates with spacing. Meanwhile, spherical spacers, in place of the columnar spacers, may be distributed over the entire surface of the substrate.

Then, a counter substrate 869 is prepared. Then, coloring layers 870, 871 and a planarizing film 873 are formed on a counter substrate 869. A shade portion is formed by overlapping a red coloring layer 870 and a blue coloring layer 871 together. Meanwhile, the shade portion may be formed by partly overlapping a red coloring layer and a green coloring layer.

In this embodiment is used a substrate shown in Embodiment 7. There is a need to shade at least the gap between the gate wiring 669 and the pixel electrode 670, the gap between the gate wiring 669 and the connecting electrode 668, and the gap between the connecting electrode 668 and the pixel electrode 670. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black matrix, thereby enabling to reduce the number of processes.

Then, a counter electrode 876 of a transparent conductive film is formed on the planarizing film 873 at least in the pixel portion. An orientation film 874 is formed over the entire surface of the counter substrate and subjected to a rubbing process.

Then, the active matrix substrate formed with the pixel portion and driver circuit and the counter substrate are bonded together by a seal member 868. The seal member 868 is mixed with filler so that the filler and the columnar spacers bond together the two substrates through an even spacing. Thereafter, a liquid crystal material 875 is poured between the substrates, and completely sealed by a sealant (not shown). The liquid crystal material 875 may be a known liquid crystal material. In this manner, completed is a reflection type liquid crystal display device shown in FIG. 29. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above comprises TFT manufactured by a semiconductor film, wherein a laser beam having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this embodiment can be implemented by combining with Embodiments 1 to 7.

[Embodiment 9]

This embodiment explains an example of manufacturing a light emitting device by using a method of manufacturing TFT when an active matrix substrate is fabricated in the Embodiment 7. In this specification, the light-emitting device refers, generally, to the display panel having light-emitting elements formed on a substrate sealed between the substrate and a cover member, and the display module having TFTs or the like mounted on the display panel. Incidentally, the light emitting element has a layer including an organic compound that electroluminescence caused is obtained by applying an electric field (light emitting layer), an anode layer and a cathode layer. Meanwhile, the electroluminescence in compound includes the light emission upon returning from the singlet-excited state to the ground state (fluorescent light) and the light emission upon returning from the triplet-excited state to the ground state (phosphorous light), including any or both of light emission.

Note that, all the layers that are provided between an anode and a cathode in a light emitting element are defined as an organic light emitting layer in this specification. Specifically, the organic light emitting layer includes a light emitting layer, a hole injection layer, an electron injection layer, a hole transporting layer, an electron transporting layer, etc. A basic structure of a light emitting element is a laminate of an anode layer, a light emitting layer, and a cathode layer layered in this order. The basic structure can be modified into a laminate of an anode layer, a hole injection layer, a light emitting layer, and a cathode layer layered in this order, or a laminate of an anode layer, a hole injection layer, a light emitting layer, an electron transporting layer, and a cathode layered in this order.

The light emitting element comprising the hole injection layer, the electron injection layer, the hole transporting layer, and the electron transporting layer may be solely formed by inorganic compounds, or materials mixed with organic compounds and inorganic compounds. The light emitting element may be formed by mixture of these layers.

FIG. 30A is a sectional view of a light-emitting device of this embodiment manufactured up through the third interlayer insulating film 750. In FIG. 30A, the switching TFT 733 and the current controlling TFT 734 provided on the substrate 700 is formed by using the manufacturing method in Embodiment 7. Incidentally, although this embodiment is of a double gate structure formed with two channel forming regions, it is possible to use a single gate structure formed with one channel forming region or a triple gate structure formed with three channel forming regions.

The n-channel TFT 731 and the p-channel TFT 732 in the driver circuit provided on the substrate 700 is formed by using the manufacturing method in Embodiment 7. Incidentally, although this embodiment is of a single gate structure, it is possible to use a double gate structure or a triple gate structure.

In the case of the light-emitting device, the third interlayer insulating film 750 is effective to prevent water contained in the second interlayer insulating film 751 from penetrating into the organic light emitting layer. If the second interlayer insulating film 751 has organic resin material, providing the third interlayer insulating film 750 is effective because the organic resin materials contain water a lot.

Completed the manufacture process up through the step of forming the third interlayer insulating film in Embodiment 7, the pixel electrode 711 is formed on the third interlayer insulating film 750.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide. A transparent conductive film added with gallium may also be used. The pixel electrode 711 is formed on a planar third interlayer insulating film 750 prior to forming the wirings. In this embodiment, it is very important to planarize the step due to the TFT by using a the second interlayer insulating film 751 made of resin. A light emitting layer to be formed later, because being extremely thin, possibly causes poor light emission due to the presence of a step. Accordingly, it is desired to provide planarization prior to forming a pixel electrode so that a light emitting layer can be formed as planar as possible.

After the pixel electrode 711 is formed, contact holes are formed in the gate insulating film 752, the first interlayer insulating film 753, the second interlayer insulating film 751, the third interlayer insulating film 750, respectively. The conductive film is formed to overlap the pixel electrode 711 on the third interlayer insulating film 750, and the resist 760 is formed. Wirings 701 to 707 are formed connected electrically to each impurity region of TFT by etching the conductive film using the resist 760. Note that a lamination film of a 50 nm thick Ti film and a 500 nm thick alloy film (Al and Ti alloy film) is patterned in order to form the wirings. There are no limitations regarding the two layer structure, of course, and a single layer structure or a laminate structure having three or more layers may also be used. Further, the wiring material is not limited to Al and Ti. For example, a lamination film, in which Al or Cu is formed on a TaN film, and then a Ti film is formed, may be patterned, forming the wirings (FIG. 30B).

The wiring 707 is a source wiring (corresponding to the current supply line) of the current controlling TFT 734. Reference numeral 706 is an electrode that connects to the pixel electrode 711 by overlapping with the pixel electrode 711 of the current controlling TFT 734.

After forming wirings 701 to 707, the passivation film 712 is formed without removing resist 760 as shown in FIG. 30B. The passivation film 712 is formed to overlap the wirings 701 to 707, the third interlayer insulating film 750, and the resist 760. The passivation film 712 is composed of a silicon nitride film, a silicon oxynitride film, an aluminum nitride, or an insulating film containing aluminum oxynitride. The insulating films are used in a single layer or a combined lamination. A part of the pixel electrode 711 is exposed by etching the passivation film 712.

A light emitting layer 713 is formed on the pixel electrode 711. Incidentally, although FIG. 30B shows only one pixel, this embodiment separately forms light emitting layers correspondingly to the respective colors of R (red), G (green) and B (blue). Meanwhile, in this embodiment is formed a low molecular weight organic light-emitting material by the deposition method. Specifically, this is a lamination structure having a copper phthalocyanine (CuPc) film provided with a thickness of 20 nm as a hole injecting layer and a tris-8-qyuinolinolato aluminum complex ($Alq_3$) film provided thereon with a thickness of 70 nm as a light emitting layer. The color of emission light can be controlled by adding a fluorescent pigment, such as quinacridone, perylene or DCM1, to $Alq_3$.

However, the foregoing example is an example of organic light-emitting material to be used for a light emitting layer and not necessarily limited to this. It is satisfactory to form a light emitting layer (layer for light emission and carrier movement therefore) by freely combining a light emitting layer, a charge transporting layer and a charge injection layer. For example, although in this embodiment was shown the example in which a low molecular weight organic light-emitting material is used for a light emitting layer, it is possible to use an intermediate molecular weight organic light-emitting material or high molecular weight organic light-emitting material. In this specification, an intermediate molecular weight organic light-emitting material can be defined that an aggregate of an organic compound which does not have subliming property or dissolving property (preferably, an aggregate which has molecularity of 10 or less), or an organic compound which has a molecular chain length of 5 μm of less (preferably 50 nm or less). As an example of using high molecular electroluminescent emitting material, the laminated pad can be made polythiophene (PEDOT) films with a thickness of 20 nm is provided by spin coating method as a hole injection layer, and paraphenylene-vinylene (PPV) films with a thickness of 100 nm is provided thereon as a light emitting layer. The light emitting wave length can be selected from red through blue by using π-conjugated system high molecular of PPV. The inorganic material such as a silicon carbide can be used as a charge transporting layer and a charge injection layer. These organic light-emitting material and inorganic light-emitting material are formed by using known materials.

Next, a cathode 714 of a conductive film is provided on the light emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light emitting layer 713 and a cathode 714.

It is effective to provide a protective film 754 in such a manner to completely cover the light-emitting element 715. The protective film 754 is formed by an insulating film including a carbon film, a silicon nitride film or a silicon oxynitride film, and used is an insulating film in a single layer or a combined lamination.

In such a case, it is preferred to use a film favorable in coverage as a protective film 754. It is effective to use a carbon film, particularly DLC (diamond-like carbon) film. The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

In this embodiment, the light emitting layer 713 is overlapped completely with a inorganic insulating film having high barrier property such as a carbon film, a silicon nitride, a silicon oxynitride, aluminum nitride, or aluminum oxynitride, so that it can prevent effectively the deterioration of the light emitting layer due to water and oxygen from penetrating thereof into the light emitting layer.

Furthermore, it is preferable to use the silicon nitride film formed by sputtering method using silicon as a target for the third interlayer insulating film 750, the passivation film 712, the protective film 754 that the penetration of impurities into the light emitting layer is prevented effectively. The deposition condition may be appropriately selected, preferably, nitride ($N_2$) or a mixed gas of nitride and argon are used for sputtering gas, and sputtering is performed by applying a high frequency electric. The substrate temperature may be set as room temperature, and heating means are unnecessary to be used. If the organic insulating film and the organic compound layer are formed already, it is preferable that the deposition is conducted without heating the substrate. However, to remove completely absorbed water or occluded water, it is preferable to perform dehydration by heating for several minutes to hours in vacuum at about 50 to 100° C.

The silicon nitride film formed by sputtering method at the condition: at room temperature using silicon as a target; applying 13.56 MHz high frequency electric; and using nitride gas is characterized in that not observed the absorption peak of N—H association and Si—H association in the infrared absorption spectrum and the absorption peak if Si—O. The oxide density and the hydrogen density is not more than 1 atomic %. Thus, it can prevent more effectively impurities such as oxygen and water more effectively from penetrating into the light emitting layer.

Furthermore, a seal member 717 is provided to overlap the light emitting layer 715 to bond a cover member 718. For the seal member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 30B. Incidentally, it is effective to continuously carry out, without release to the air, the process to form a protective film after forming a passivation film 712 by using a deposition apparatus of a multi-chamber scheme (or in-line scheme). In addition, with further development it is possible to continuously carry out the process up to bonding a cover member 718, without release to the air.

In this manner, n-channel TFTs 731, p-channel TFT 732, a switching TFT (n-channel TFT) 733 and a current control TFT (p-channel TFT) 734 are formed on the substrate 700.

Furthermore, as was explained using FIG. 30, by providing an impurity region overlapped with the gate electrode through an insulating film, it is possible to form an n-channel TFT resistive to the deterioration resulting from hot-carrier effect. Consequently, a reliable light emitting device can be realized.

Meanwhile, this embodiment shows only the configuration of the pixel portion and driver circuit. However, according to the manufacturing process in this embodiments besides there, it is possible to form logic circuits such as a signal division circuit, a D/A converter, an operation amplifier, a γ-correction circuit on a same insulator. Furthermore, a memory or microprocessor can be formed.

The light emitting device manufactured, wherein a laser beam having a periodic or uniform energy distribution is irradiated and a crystal grain with a large grain size is formed. Thus, the light emitting device ensures a good operational characteristic and high reliability. The light emitting device can be used as a display portion for an electronic appliance in various kinds.

Incidentally, this embodiment can be implemented by combining any one of Embodiments 1 to 7.

[Embodiment 10]

This embodiment will be described SEM of a semiconductor film crystallized by the laser irradiation.

In this embodiment, a glass film is formed as a base film with plasma CVD method, and a silicon oxynitride film (compositional ratio: Si=32%, O=59%, N=7%, H=2%) with a thickness of 400 nm. Subsequently, an amorphous silicon film with a thickness of 150 nm are laminated on the base film as a semiconductor film with plasma CVD method. After hydrogen contained in the semiconductor film is released by performing heat treatment at 500° C. for three hours, the semiconductor film is crystallized by a laser annealing method. The semiconductor film is crystallized in that the laser annealing condition: a second harmonic wave of $YVO_4$ laser is used as a laser beam, an incident angles θ is set to 18° to form a rectangular shape beam, whereby irradiating the semiconductor film to be the central beam spot at right angle to the scanning direction as moving the substrate at a speed of 50 cm/s.

Figure 20:
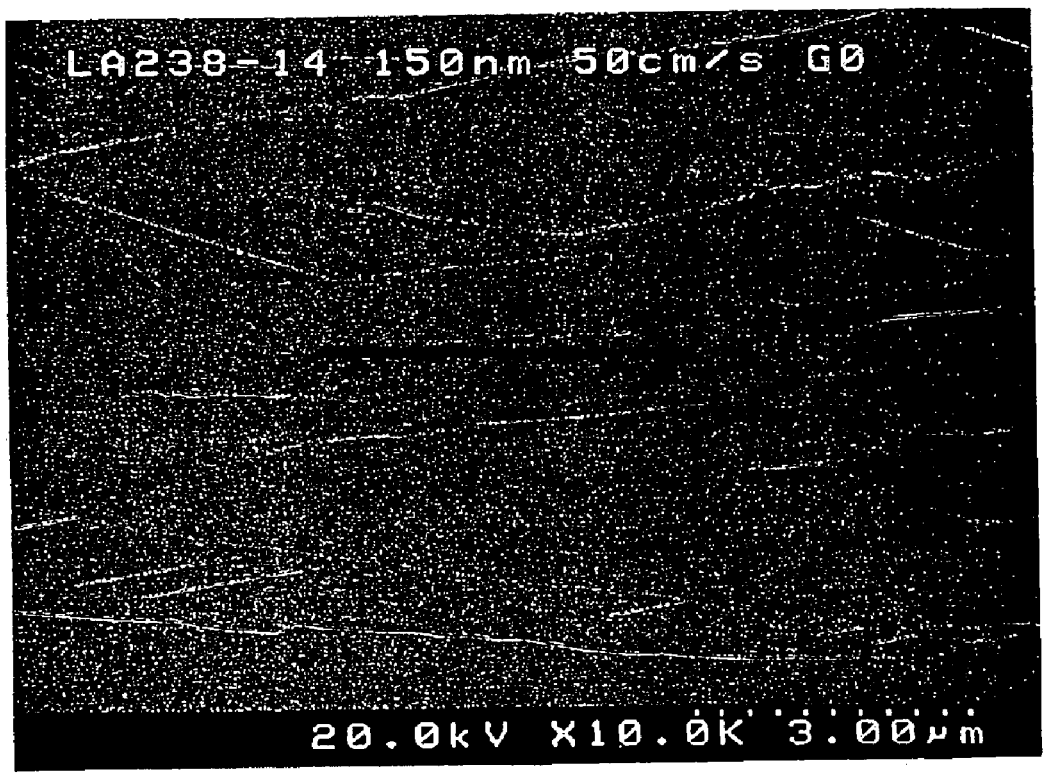
FIG. 20 is an SEM photograph of a crystallized semiconductor film.

A seco-etching is performed to the crystalline semiconductor film thus obtained, and the result of observing the surface of the crystalline semiconductor film with a SEM by one thousand times is shown in FIG. 20. Note that, the seco solution in the seco-etching is the one made by using $K_2Cr_2O_7$ for $HF:H_2O=2:1$ as an additive. FIG. 20 was obtained by relatively scanning the laser beam in the direction indicated by the arrow in figure, and FIG. 20 shows the appearance that crystal grains of large grain size is formed in a perpendicular direction relative to the scanning direction.

Therefore, since the crystal grains of large grain size are formed in the semiconductor film wherein crystallization is conducted by using the present invention, when TFT is fabricated by using the semiconductor film, the number of crystal boundaries that may be contained in a channel forming region can be reduced. Further, since an individual crystal grain has the crystallinity such that it can be regarded substantially single crystal, the high mobility (field effect mobility) equal to or more than that of a transistor using a single crystal semiconductor can be obtained.

In addition, since the formed crystal grains become complete in one direction, the number of crossing across the crystal grain boundary by a carrier can be remarkably reduced. Therefore, it is possible to reduce variations of an on current value (a value of a drain current flowing in an on state of a TFT), an off current value (a value of a drain current flowing in an off state of a TFT), a threshold voltage, an S value, and field effect mobility. And electric characteristic is extremely improved.

[Embodiment 11]

This embodiment will be described SEM of a semiconductor film crystallized by the laser irradiation by applying a method recorded in Japanese Patent Laid-open No. Hei 7-183540.

In accordance with Embodiment 10, after the amorphous silicon film is formed, by applying a method recorded in Japanese Patent Laid-open No. Hei 7-183540, an aqueous nickel acetate solution (weight converting concentration 5 ppm, volume 10 ml) is applied to the surface of the semiconductor film by spin coating to perform heat treatment in the nitrogen atmosphere at 500° C. for one hour and in the nitrogen atmosphere at 550° C. for twelve hours. Subsequently, an improvement of crystallinity of the semiconductor film is performed by laser annealing method. The improvement of crystallinity of the semiconductor film is performed under the condition of the laser annealing method that a second harmonic wave of $YVO_4$ laser is used as a laser beam, an incident angles θ is set to 18° to form a rectangular shape beam, whereby irradiating the semiconductor film to be the central beam spot at right angle to the scanning direction as moving the substrate at a speed of 50 cm/s.

Figure 21:
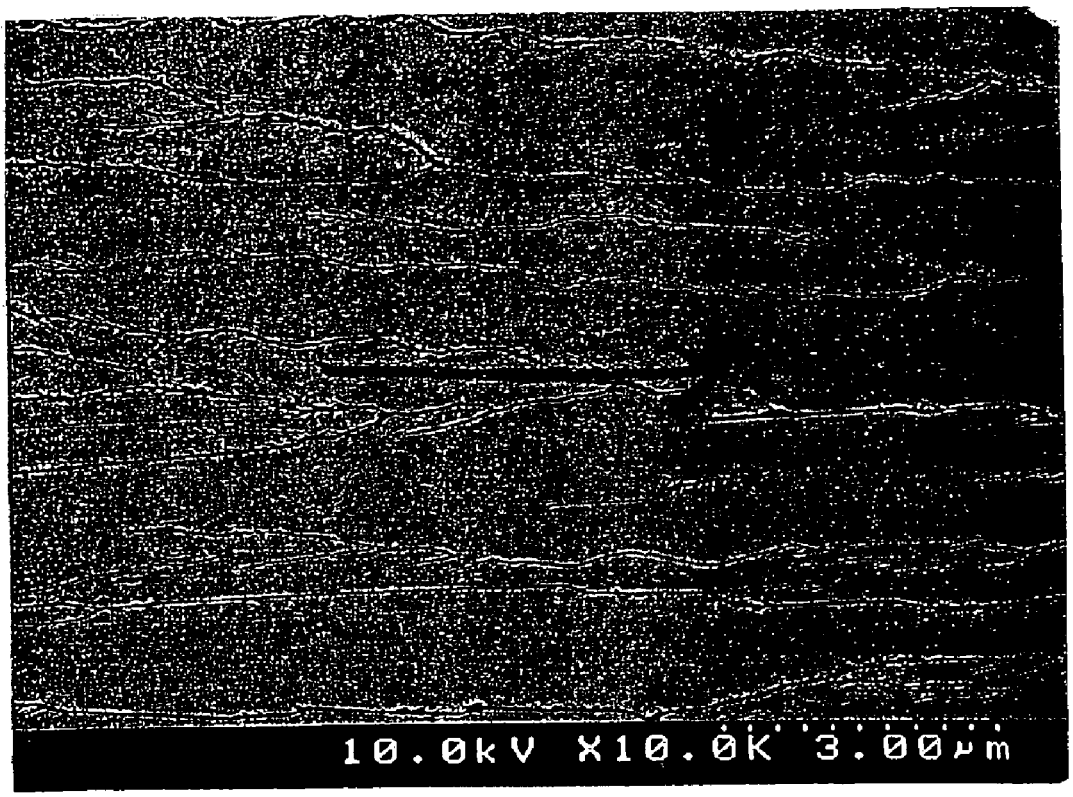
FIG. 21 is an SEM photograph of the crystallized semiconductor film.

A seco-etching is performed to the crystalline semiconductor film thus obtained, and the surface of the crystalline semiconductor film is observed with the SEM by one thousand times. An observation result is shown in FIG. 21. The observation result in FIG. 21 was obtained by relatively scanning the laser beam in the direction indicated by the arrow in figure, and FIG. 21 shows the appearance that crystal grains of large grain size is formed in a parallel direction relative to the scanning direction. Further, it is characteristics that crystal grains shown in FIG. 21 has fewer grain boundaries formed in the direction which intersects to relative scanning direction of laser beam than that shown in FIG. 20.

Therefore, since the crystal grains of large grain size are formed in the semiconductor film wherein crystallization is conducted by using the present invention, when TFT is fabricated by using the semiconductor film, the number of crystal boundaries that may be contained in a channel forming region can be reduced. Further, since an individual crystal grain has the crystallinity such that it can be regarded substantially single crystal, the high mobility (field effect mobility) equal to or more than that of a transistor using a single crystal semiconductor can be obtained.

In addition, since the formed crystal grains become complete in one direction, the number of crossing across the crystal grain boundary by a carrier can be remarkably reduced. Therefore, it is possible to reduce variations of an on current value, an off current value, a threshold voltage, an S value, and field effect mobility. And electric characteristic is extremely improved.

[Embodiment 12]

This embodiment will be described an example of forming TFT using crystallized semiconductor film according to Embodiment 10.

In this embodiment, a glass film is used as a base film, and a silicon oxynitride film (compositional ratio: Si=32%, O=27%, N=24%, H=17%) with a thickness of 50 nm, and a silicon oxynitride film (compositional ratio: Si=32%, O=59%, N=7%, H=2%) with a thickness of 100 nm are laminated on the base film with plasma CVD method. Subsequently, an amorphous silicon film with a thickness of 150 nm is formed on the base film as a semiconductor film by plasma CVD method. Hydrogen contained in the semiconductor film is released by performing heat treatment at 500° C. for three hours. Then, a second harmonic wave of $YVO_4$ laser is used as a laser beam, and performing crystallization according to the condition described in Embodiment 10.

Subsequently, a first doping processing is conducted. The first doping processing is a channel doping that controls a threshold value. The first doping processing is conducted by using $B_2H_6$ as a material gas, setting the gas flow rate to 30 sccm, the current density to 0.05 µA, the acceleration voltage to 60 kV, and the dose to $1\times10^{14}$ atoms/cm². Subsequently, patterning is performed to etch a semiconductor film in a predetermined shape, and then a silicon oxynitride film with a thickness of 115 nm is formed as a gate insulating film covering the etched semiconductor film by the plasma CVD method. Subsequently, a TaN film with a thickness of 30 nm and a W film with a thickness of 370 nm as conductive films are laminated on the gate insulating film.

A mask made of resist (not shown) is formed by photolithography to etch the W film, the TaN film and the gate insulating film. Subsequently, introducing impurity elements which impart n-type to the semiconductor film by second doping processing. In this case, conductive layers are become masks with respect to the impurity elements imparting n-type respectively and an impurity region that is sandwiching the channel forming region formed in a self-aligning manner. In this embodiment, the second doping processing is divided into two conditions to be performed since the film thickness of the semiconductor film is very thick with 150 nm. In this embodiment, at first, the second doping processing of the first condition is performed by using phosphine ($PH_3$) as a material gas, and setting a dose to $2\times10^{13}$ atoms/cm² and the acceleration voltage to 90 kV. And then, the second doping processing of the second condition is performed by setting the dose to $5\times10^{14}$ atoms/cm² and the acceleration voltage to 10 kV.

Next, the mask made of a resist is removed, a new mask made of resist is formed to cover the semiconductor film of the n-channel TFT, and the third doping processing is performed. By the third doping processing, an impurity element for imparting a conductivity type opposite to the one conductivity type is added to an impurity region. The impurity region is formed in the semiconductor film which becomes an active layer of the p-channel TFT. The conductive layers are used as a mask to the impurity element and the impurity element for imparting a p-type is added so as to form impurity region in a self-aligning manner. In this embodiment, the third doping processing is also divided into two conditions to be performed since the film thickness of the semiconductor film is very thick with 150 nm. In this embodiment, the third doping processing of the first condition is performed by using diborane ($B_2H_6$) as a material gas and setting the dose to $2\times10^{13}$ atoms/cm², and the acceleration voltage to 90 kV. And then, the third doping processing of the second condition is performed by setting the dose to $1\times10^{15}$ atoms/cm², and the acceleration voltage to 10 kV.

By the steps until now, the impurity regions that is sandwiching the channel forming region are formed in the respective semiconductor layers.

Next, the mask made of resist is removed and a silicon oxynitride film with a thickness of 50 nm (compositional ratio: Si=32.8%, O=63.7%, H=3.5%) is formed as a first interlayer insulating film by plasma CVD method. Next, a recovery of crystallinity of the semiconductor layers and an activation of the impurity element added to the respective semiconductor layers are conducted by the heat treatment. In this embodiment, the heat treatment is performed in a nitrogen atmosphere at 550° C. for four hours by a thermal annealing method using an annealing furnace.

Next, a second interlayer insulating film made of organic insulating film materials or inorganic insulating materials are formed on a first interlayer insulating film. In this embodiment, a silicon nitride film with a thickness of 50 nm is formed by CVD method and then a silicon oxide film with a thickness of 400 nm is formed. Next, a hydrogenation processing can be carried out after the heat treatment. In this embodiment, the heat treatment is performed in a nitrogen atmosphere at 410° C. for one hour by using the annealing furnace.

Subsequently, a wiring electrically connecting to the respective impurity regions is formed. In this embodiment, a lamination film of a Ti film with a thickness of 50 nm, an Al—Si film with a thickness of 500 nm, and a Ti film with a thickness of 50 nm is patterned to form. Of course, it is not limited to a two layer structure, but also may be a single layer structure or lamination structure of three layers or more. Further, materials for wirings are not limited to Al and Ti. For example, wirings may be formed by forming Al or Cu on the TaN film and patterning the lamination film on which a Ti film is formed.

Figure 22A:
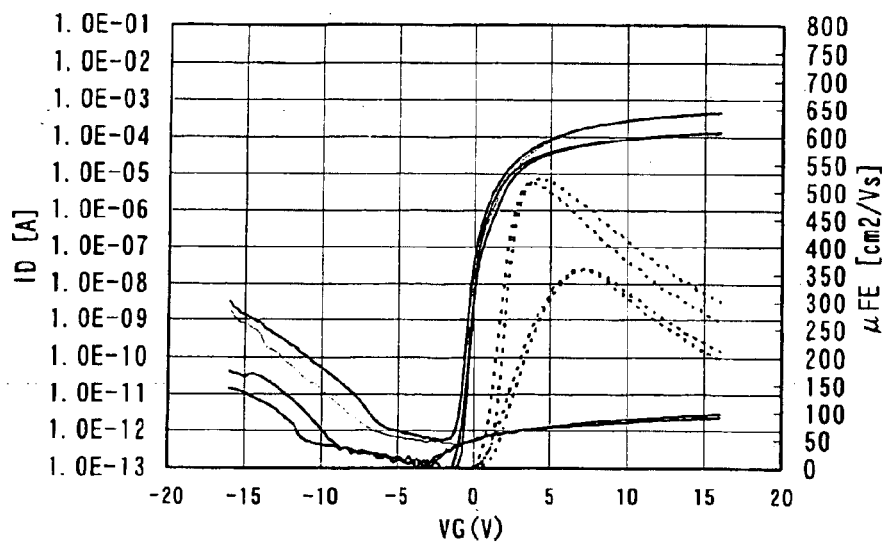
FIGS. 22A and 22B show the characteristics of a TFT.
Figure 22B:
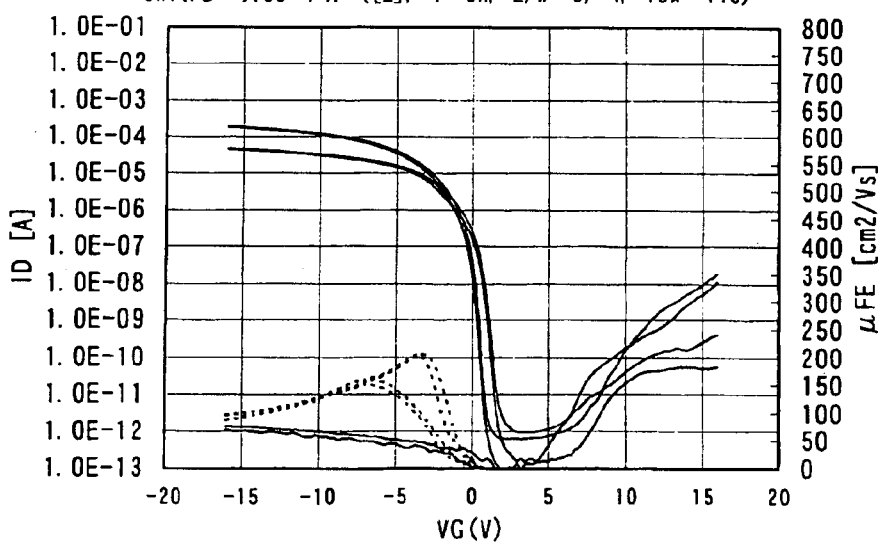

As described above, an n-channel TFT and a p-channel TFT are formed. An electric characteristic of the n-channel TFT is shown in FIG. 22A and an electric characteristic of the p-channel TFT is shown in FIG. 22B by measuring the electric characteristics. As the measurement condition of the electric characteristics, measurement point is assumed to be two points, the gate voltage (Vg) is set to in the range of −16 to 16 V, and the drain voltage (Vd) is set to 1 V and 5 V, respectively. Moreover, in FIGS. 22A and 22B, drain current (ID) and gate current (ID) are shown in a solid line and the mobility (µFE) is shown in a dotted line.

FIGS. 22A and 22B show that the electric characteristics of TFT manufactured by using the crystalline semiconductor film formed in Embodiment 10 is remarkably improved. When TFT is manufactured by using the semiconductor film, the number of crystal grain boundaries that may be contained in a channel forming region can be reduced, since a crystal grain of large grain size is formed in the semiconductor film, which is crystallized by using the present invention. Furthermore, since the crystal grains are formed in the same direction, it is possible to reduce the number of crossing across the grain boundary by carrier remarkably. Therefore, the mobility is 524 cm²/Vs at the n-channel TFT and the mobility is 205 cm²/Vs at the p-channel TFT. When a semiconductor device is manufactured by using such TFT, the mobility characteristic and the reliability of the semiconductor device can be improved.

[Embodiment 13]

This embodiment will be described an example of forming TFT using crystallized semiconductor film according to Embodiment 11.

It forms to an amorphous silicon film as a semiconductor film in accordance with Embodiment 11. Further, by applying a method recorded in Japanese Patent Laid-open No. Hei 7-183540, an aqueous nickel acetate solution (weight converting concentration 5 ppm, volume 10 ml) is applied to the surface of the semiconductor film by spin coating thereby forming a metal containing layer. Then heat treatment is performed in the nitrogen atmosphere at 500° C. for one hour and in the nitrogen atmosphere at 550° C. for twelve hours. Subsequently, an improvement of crystallinity of the semiconductor film is performed by laser annealing method. The improvement of crystallinity of the semiconductor film is performed by the laser annealing method under the conditions that a second harmonic wave of $YVO_4$ laser is used as a laser beam according to the condition described in Embodiment 11.

Figure 23A:
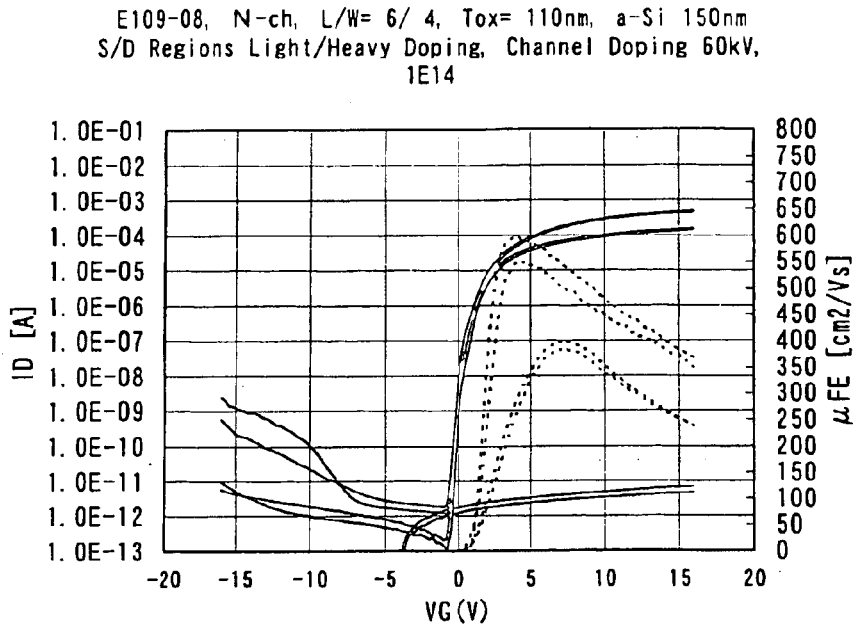
FIGS. 23A and 23B show the characteristics of the TFT.
Figure 23B:
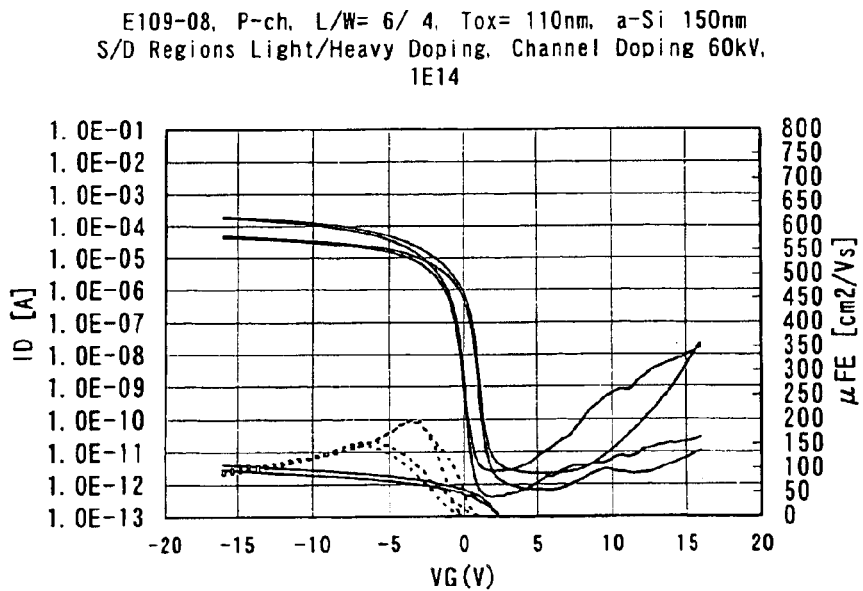

In accordance with the Embodiment 12, a n-channel TFT and a p-channel TFT are formed hereafter. The electric characteristics of the n-channel TFT and the p-channel TFT are measured, and then an electric characteristic of the n-channel TFT is shown in FIG. 23A, an electric characteristic of the p-channel TFT is shown in FIG. 23B, respectively, in the laser annealing step. As the measurement condition of the electric characteristics, the measurement point is assumed to be two points, the gate voltage (Vg) is set to in the range of −16 to 16 V, and the drain voltage (Vd) is set to 1.5 V. Moreover, in FIGS. 23A to 23B, drain current (ID) and gate current (ID) is shown in solid line and the mobility (μFE) is shown in dotted line.

FIGS. 23A to 23B show that the electric characteristics of TFT using the semiconductor film manufactured in Embodiment 11 is remarkably improved. When TFT is manufactured by using the semiconductor film, the number of crystal grain boundaries that may be contained in a channel forming region can be reduced, since a crystal grain of large grain size is formed in the semiconductor film which is crystallized by using the present invention. Furthermore, since the formed crystal grains become complete in one direction and there are few grain boundaries formed in the direction crossed to the relative scanning direction of laser light, it is possible to reduce the number of crossing across the grain boundary by carrier remarkably. Therefore, it is understood that the mobility is 595 cm$^2$/Vs at the n-channel TFT and the mobility is 199 cm$^2$/Vs at the p-channel TFT, and these mobility is very excellent. When a semiconductor device is manufactured by using such TFT, the mobility characteristic and the reliability of the semiconductor device can be improved.

[Embodiment 14]

Given as embodiments of electric equipment employing a semiconductor device formed by the laser apparatus of the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). Specific examples of the electric equipment are shown in FIGS. 24A to 24H.

Figure 24A:
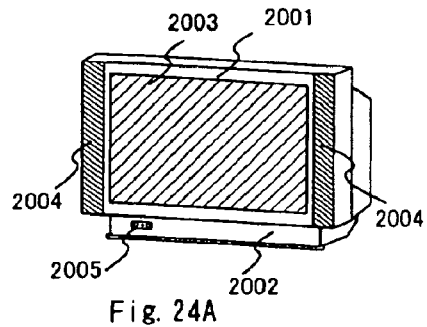
FIGS. 24A to 24H each show electronic equipment that uses the semiconductor device of the present invention.

FIG. 24A shows a display device, which comprises a casing 2001, a supporting base 2002, a display portion 2003, speaker portions 2004, a video input terminal 2005, etc. The light emitting device formed by the present invention is applied can be used for the display portion 2003. The semiconductor device is self-luminous and does not need a backlight, so that it can make a thinner display portion than liquid display devices can. The term display device includes every display device for displaying information such as one for a personal computer, one for receiving TV broadcasting, and one for advertisement.

Figure 24B:
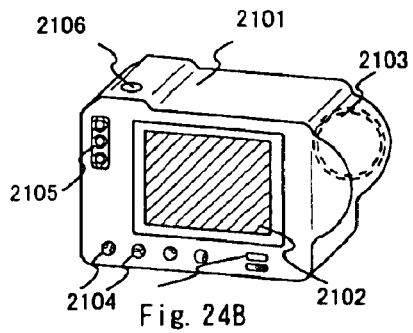

FIG. 24B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102, and other circuits.

Figure 24C:
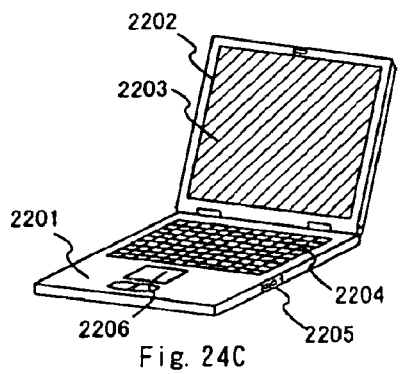

FIG. 24C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203, and other circuits.

Figure 24D:
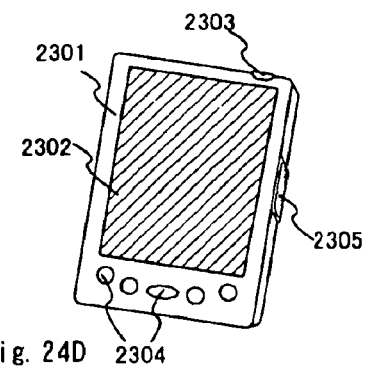

FIG. 24D shows a mobile computer, which comprises a main body 2301, a display portion 2302, a switch 2303, operation keys 2304, an infrared ray port 2305, etc. The light emitting device formed by the present invention is applied can be used for the display portion 2302, and other circuits.

Figure 24E:
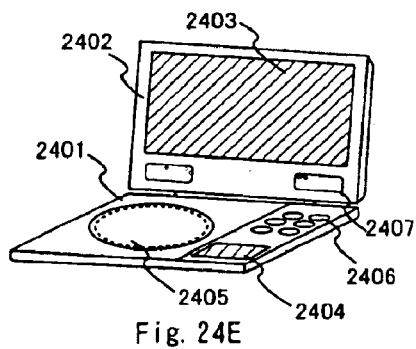

FIG. 24E shows a portable image reproducing device equipped with a recording medium (a DVD player, to be specific). The device comprises a main body 2401, a casing 2402, a display portion A 2403, a display portion B 2404, a recording medium (DVD or the like) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404, and other circuits. The term image reproducing device equipped with a recording medium includes domestic game machines.

Figure 24F:
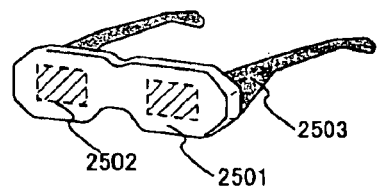

FIG. 24F shows a goggle type display (head mounted display), which comprises a main body 2501, display portions 2502, and arm portions 2503. The light emitting device formed by the present invention is applied can be used for the display portions 2502, and other circuits.

Figure 24G:
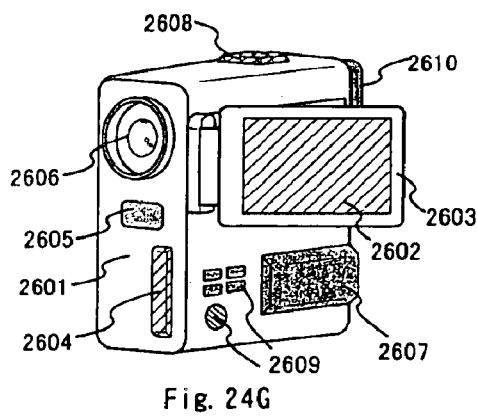

FIG. 24G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, eyepiece portion 2610 etc. The light emitting device formed by the present invention is applied can be used for the display portion 2602, and other circuits.

Figure 24H:
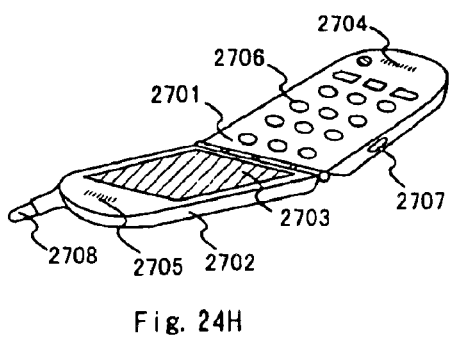

FIG. 24H shows a cellular phone, which comprises a main body 2701, a casing 2702, a display portion 2703, an audio input portion 2704, an audio output portion 2705, operation keys 2706, an external connection port 2707, an antenna 2708, etc. The light emitting device formed by the present invention is applied can be used for the display portion 2703, and other circuits. If the display portion 2703 displays white characters on a black background, power consumption of the cellular phone can be reduced.

The light emitting device can be used also in a front or rear projector besides above-mentioned electronic apparatuses.

As described above, the application range of the light emitting device to which the present invention is applied is very wide and electric equipment of every field can employ the device. The electric equipments in this embodiment may use any configuration of semiconductor devices shown in Embodiments 1 to 13.

[Embodiment 15]

In general, a stage, on which an object to be processed by irradiating laser lights is mounted, is moved along a guide rail provided in the X direction and the Y direction. Also, between the guide rail and a portion (slider) to which the stage is fixed, there is sandwiched an object having a curved surface that is called a ball (bearing) and there is provided a mechanism for realizing the smooth moving of the stage by reducing a load due to friction.

It is required to replace this ball through periodical maintenance work because this ball is worn and torn as a result of the repeated moving of the stage. It is also required to further reduce the friction caused during the moving of the stage in order to move the stage more smoothly.

Figure 34A:
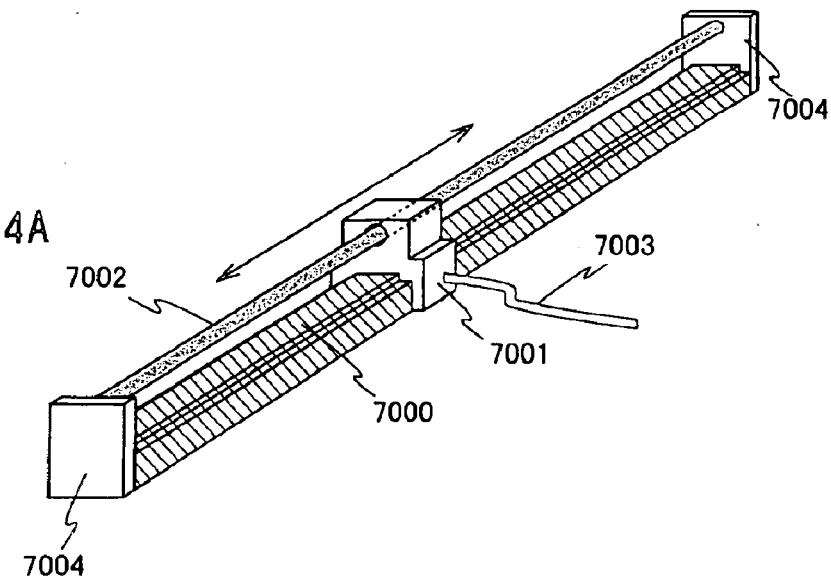
FIGS. 34A to 34C show a construction of position control means.

FIG. 34A shows means (position control means) of this embodiment for moving the stage. Reference numeral 7000 denotes a guide rail for which projections and depressions are formed along one direction in order to move the stage in a fixed direction. Also, reference numeral 7001 is a portion called a slider to which the stage is fixed and is capable of being moved along the guide rail 7000. Also, a rod 7002 is an axis passing through a hole established in the slider 7001 and is provided in a direction along the guide rail. The rod 7002 is fixed to the guide rail 7000 by end plates 7004.

Figure 34B:
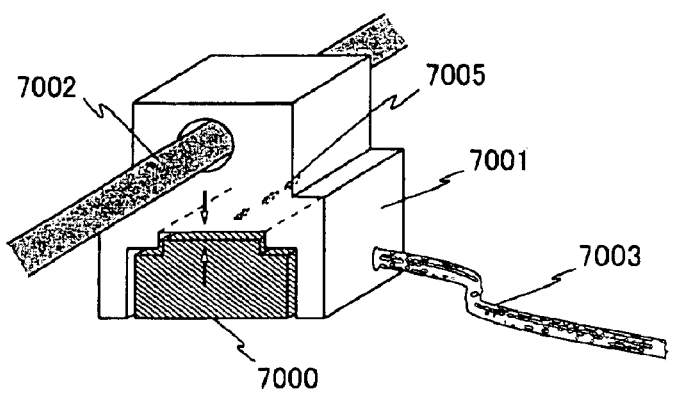

A power supply voltage and air are sent to the slider 7001 through a cable 7003. FIG. 34B is an enlarged view of the slider 7001. This slider 7001 generates, from the power supply voltage, a magnetic field with which the slider 7001 and the guide rail 7000 are attracted to each other. Also, the slider 7001 generates, from the power supply voltage, a magnetic field in a direction in which the rod 7002 is separated from the hole established in the slider 7001 so as to prevent the contact between them. Also, on the other hand, the sent air is discharged to a space between the slider 7001 and the guide rail 7000 from air holes 7005. The distance between the slider 7001 and the guide rail 7000 is kept constant because a force in a direction, in which the slider 7001 and the guide 7000 are attracted to each other, is exerted as a result of this magnetic field and a force in a direction, in which the slider 7001 and the guide 7000 are separated from each other, is exerted as a result of the air discharging.

It should be noted here that the present invention is not limited to the case where the magnetic field is generated by the power supply voltage applied through the cable. That is, there occurs no problem even if the magnetic field is generated by forming one of the guide rail 7000 and the slider 7001 using a magnetic material and forming the other thereof using a material attracted by the magnetic material. Also, there occurs no problem even if both of the guide rail 7000 and the slider 7001 are formed using a magnetic material.

Also, instead of generating the magnetic field using the power supply voltage applied through the cable, one of the rod 7002 and the slider 7001 may be formed using a magnetic material. Also, both of the rod 7002 and the slider 7001 may be formed using a magnetic material.

By using the means for moving the stage described in this embodiment, it becomes possible to move the stage along the guide rail in a non-contact manner, which saves the necessity to perform periodical replacement of a ball due to the wear and tear of the ball and makes it easy to perform maintenance work. Also, the moving of the stage is performed in the non-contact manner, so that there hardly occurs friction and it becomes possible to more smoothly perform the moving of the stage in comparison with a case where a ball is used.

Figure 34C:
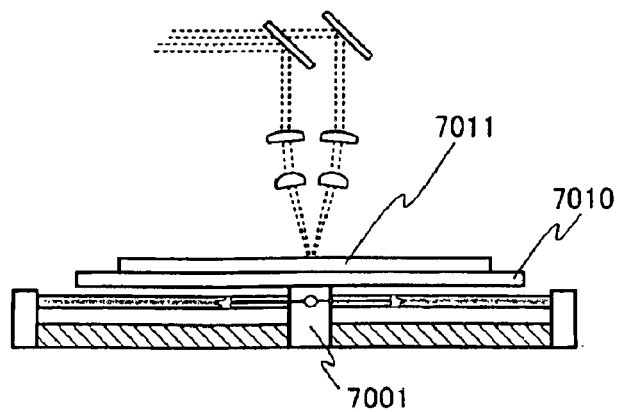

FIG. 34C shows a state where an object to be processed 7011 by irradiating laser lights is mounted on a stage 7010 fixed on the slider 7001. The moving of the stage is performed more smoothly by means of the stage moving means of this embodiment, which makes it possible to more uniformly perform the irradiation of the laser lights.

It is possible to implement this embodiment in combination with the first to the fourteenth embodiments.

[Embodiment 16]

In this embodiment, there will be described an example using an active vibration removing base.

Figure 35A:
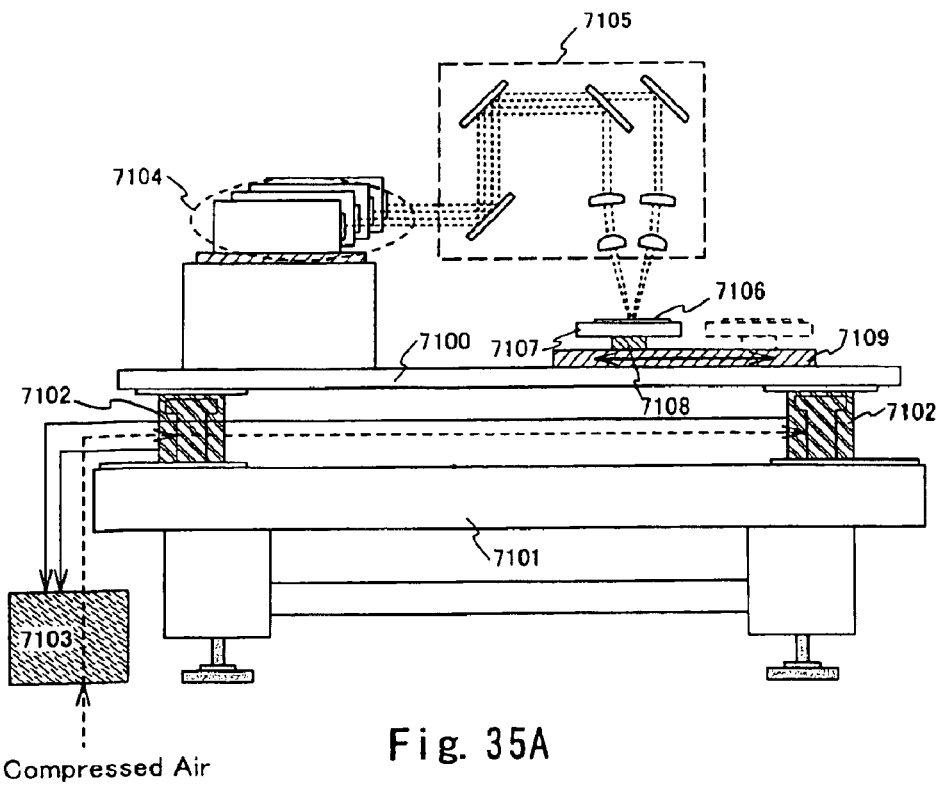
FIGS. 35A and 35B show a construction of an active vibration removing base.

FIG. 35A shows a state where the laser apparatus of the present invention is mounted on an active vibration removing base. This active vibration removing base includes a board 7100 on which the laser apparatus is actually mounted, a plurality of isolators 7102, a stand 7101 that functions as a scaffolding, and a controller 7103.

The board 7100 is provided on the stand 7101 so that the isolators 7102 are sandwiched therebetween. Each isolator 7102 includes a gimbal piston (air spring) provided with a gimbal mechanism for detecting a vibration and removing it. Also, the controller 7103 controls the operation of each gimbal piston.

Incidentally, in FIG. 35A, the laser apparatus mounted on the board 7100 includes four laser oscillation apparatuses 7104. Also, reference numeral 7105 denotes an optical system that is capable of condensing laser lights by changing the paths of lights outputted from the laser oscillation apparatuses 7104 and processing the shapes of their beam spots. Further, the important point concerning the optical system 7105 of the present invention is that it is possible to combine the beam spots of laser lights outputted from the plurality of laser oscillation apparatuses 7104 by having the beam spots overlap each other.

The combined beam spots are irradiated onto a substrate 7106 that is an object to be processed. The substrate 7106 is mounted on a stage 7107. In FIG. 35A, position control means 7108 and 7109 correspond to the means for controlling the positions of the beam spots on the object to be processed and the position of the stage 7107 is controlled by the position control means 7108 and 7109. The position control means 7108 performs the control of the position of the stage 7107 in the X direction and the position control means 7109 performs the control of the position of the stage 7107 in the Y direction.

Figure 35B:
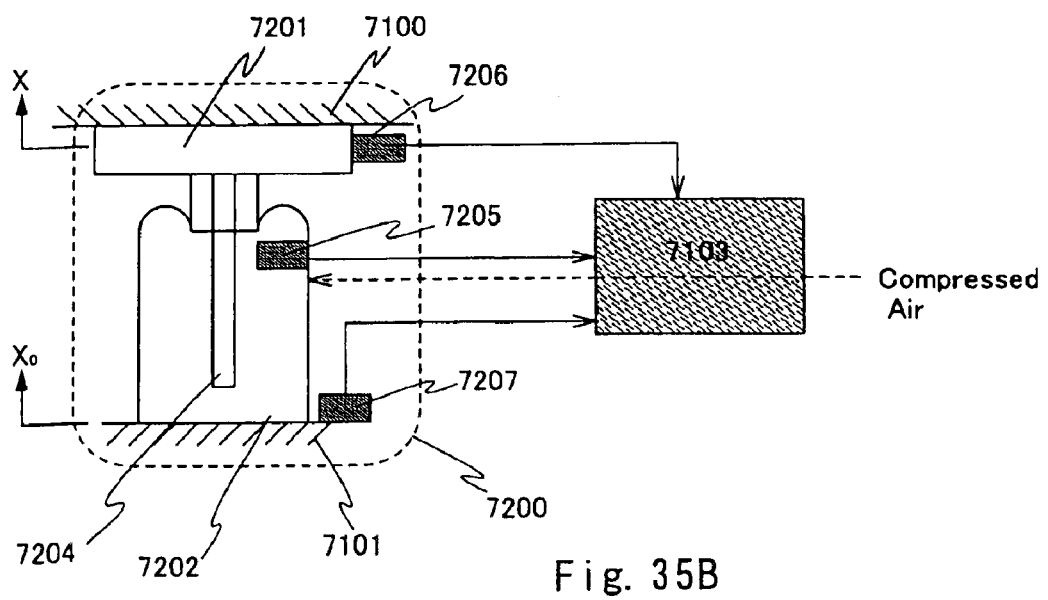

A concrete function of the gimbal piston will be described with reference to FIG. 35B. In FIG. 35B, in the portion surrounded by a broken line 7200, there is shown the outline of the construction of the gimbal piston. The gimbal piston 7200 includes a support base 7202 fixed to the stand 7101 and a load disc 7201 fixed to the board 7100. A support rod 7204 is fixed to the load disc 7201, which realizes a construction where if the load disc 7201 is rocked due to a vibration of the board 7100, the support rod 7204 is rocked in a pendulum manner inside of the support base 7202.

A displacement sensor 7205 monitors the displacement of the load disc 7201 at a position specified by "X" using the support rod 7204. Also, the displacement sensor 7205 monitors the acceleration of the displacement of the load disc 7201 at the position specified by "X" using a first acceleration sensor 7206 and monitors the acceleration of the displacement of the frame 7101 at a position specified by "$X_o$" using a second acceleration sensor 7207.

Results of these three monitors are sent to the controller 7103. The controller 7103 obtains the displacement of the board 7100, the acceleration of the displacement, and the speed of the displacement from the results of the monitoring by the displacement sensor 7205, the first acceleration sensor 7206, and the second acceleration sensor 7207, and obtains, from these values, feedback values concerning the displacement, acceleration, and speed in order to suppress the vibration of the board 7100. Then, in accordance with the feedback values concerning the displacement, acceleration, and speed, a compressed air is given to the gimbal piston 7200 so that an inverse vibration is given to the load disc 7201.

With the construction described above, it becomes possible to cancel out a vibration from the floor, on which the stand 7101 is mounted, and a vibration from the laser apparatus due to the position control means 7108 and 7109 and the like using a vibration given by the compressed air and to suppress a vibration of the board 7100.

It should be noted here that there occurs no problem even if the controller 7103 includes a function of studying a vibration given to the board 7100 and promptly removing a vibration next time when the same vibration is given.

By suppressing the vibration of the board 7100, it becomes possible to prevent a situation where the alignment of the optical system possessed by the laser apparatus is shifted due to the vibration. In particular, the construction described above is extremely useful in the case where there is required more precise alignment of the optical system where beam spots are combined using a plurality of laser oscillation apparatuses.

It is possible to implement this embodiment in combination with the first to the fifteenth embodiments.

[Embodiment 17]

In this embodiment, there will be described the relation between (i) the distance between centers of respective laser beams and (ii) an energy density in the case where the laser beams are made to overlap each other.

Figure 36:
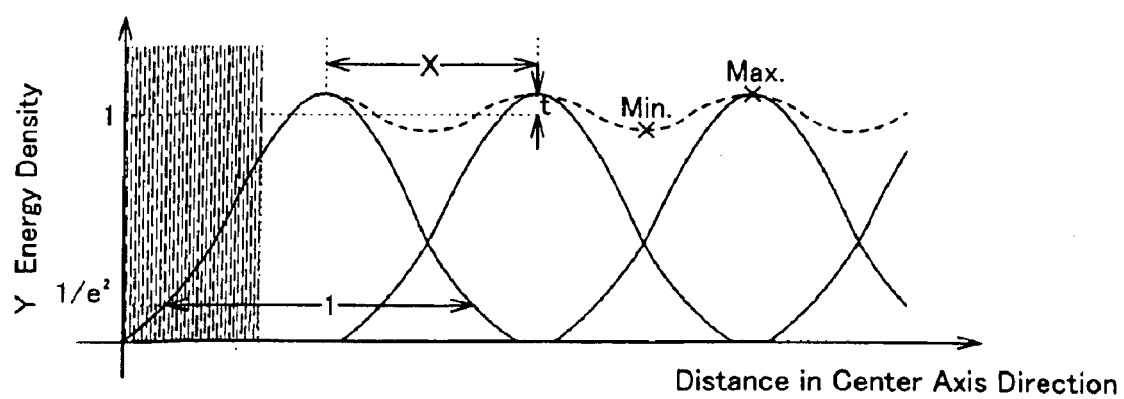
FIG. 36 shows distribution of energy densities in the center axis direction of laser beams made to overlap each other.

FIG. 36 shows the distribution of the energy density of each laser beam in the center axis direction using a solid line and shows the distribution of the energy densities of combined laser beams using a broken line. In general, the value of the energy density of a laser beam in the center axis direction is pursuant to the Gaussian distribution.

Figure 37:
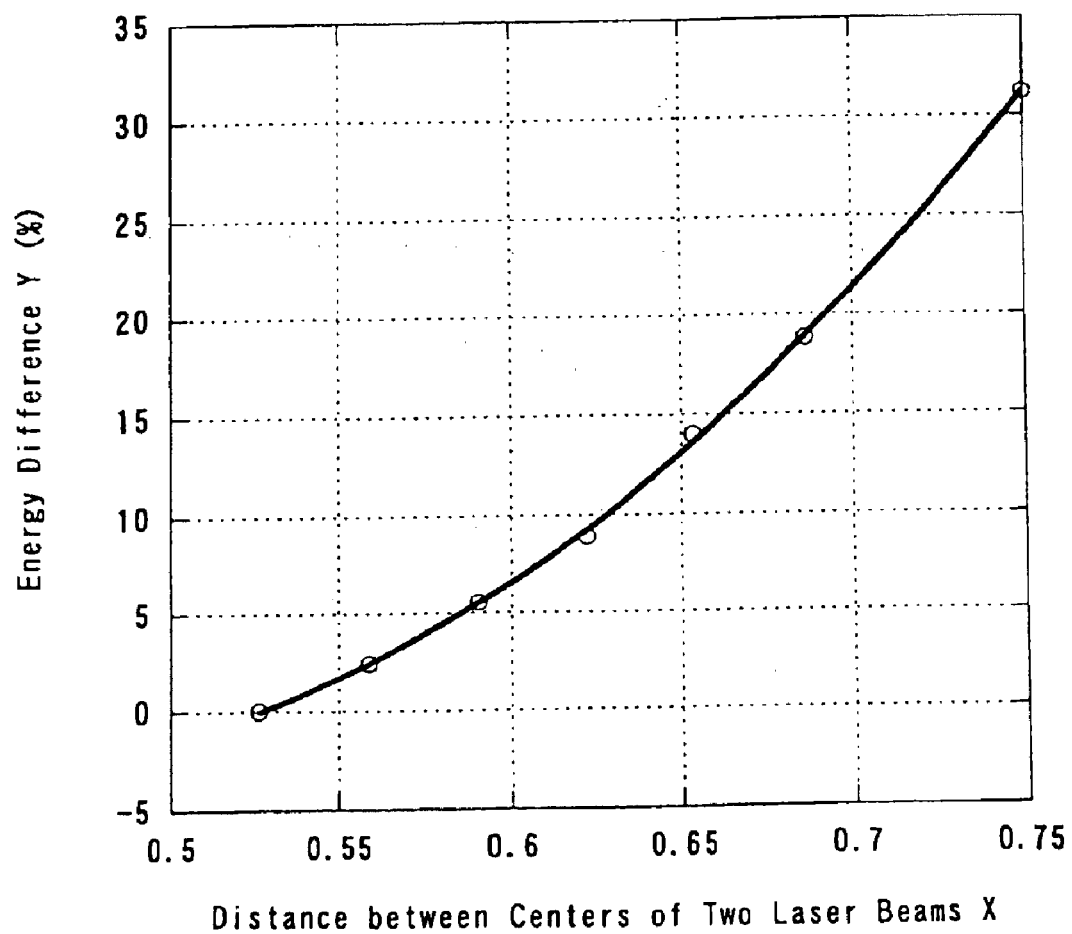
FIG. 37 shows a relation between (i) a distance between the centers of laser beams and (ii) an energy difference.

As to laser beams before combining, their width in the center axis direction, which satisfies an energy density of $1/e^2$ or higher of a peak value, is set at "1" and the distance between respective peaks is referred to as "X". Also, as to laser beams after the combining, the increased amount of a peak value from the average value of valley values and the peak value after the combining is referred to as "Y". The relation between "X" and "Y" obtained through a simulation is shown in FIG. 37. Note that in FIG. 37, "Y" is expressed on a percentage basis.

In FIG. 37, an energy difference Y is expressed by Expression 1 below that is an approximate expression.

$$Y=60-293X+340X^2 \text{ (X is larger one of two solutions)} \quad \text{Expression 1}$$

It can be seen from Expression 1 that in the case where it is desired to set the energy difference at around 5%, for instance, it is sufficient that setting is made so that "X" becomes almost equal to 0.584. It is ideal that "Y" becomes equal to zero. In this case, however, the lengths of laser beams are shortened, so that it is preferable that "X" is determined with consideration given to the balance with throughput.

Figure 38:
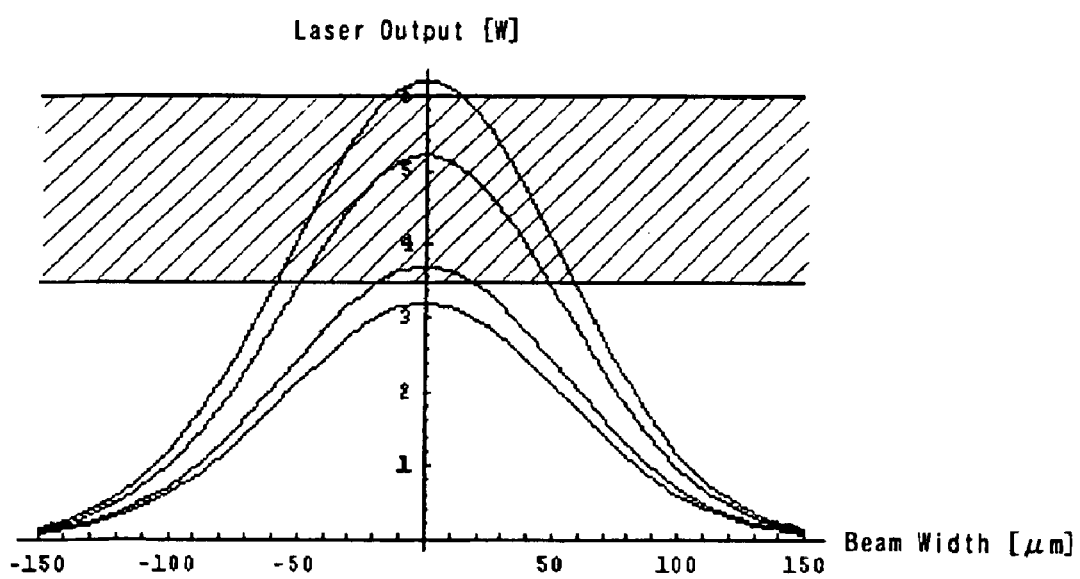
FIG. 38 shows distribution of output energy of a laser beam in the center axis direction.

Next, there will be described the allowable range of "Y". FIG. 38 shows the distribution of the output (W) of a $YVO_4$ laser with respect to its beam width in the center axis direction in the case where the laser beam has an elliptic shape. The region specified by sloped lines is a range of an output energy that is necessary to obtain favorable crystallinity and it can be seen that there occurs no problem so long as the output energy of synthesized laser lights remains within a range of from 3.5 to 6 W.

When the maximum value and the minimum value of the output energy of the laser beams after the synthesizing exist close to the inside edges of the output energy range that is necessary to obtain favorable crystallinity, the energy difference Y, with which it is possible to obtain the favorable crystallinity, becomes the maximum. As a result, in the case shown in FIG. 38, the energy difference Y becomes ±26.3% and it can be seen that the favorable crystallinity is obtained if the energy difference "Y" remains within this range.

It should be noted here that the range of the output energy that is necessary to obtain the favorable crystallinity changes depending on which range of crystallinity is judged as favorable. Also, the distribution of the output energy changes depending on the shape of a laser beam, so that the allowable range of the energy difference Y is not limited to the value described above. A designer is required to determine the range of the output energy that is necessary to obtain the favorable crystallinity as appropriate and to set the allowable range of the energy difference Y from the distribution of the output energy of a laser used.

It is possible to implement this embodiment in combination with the first to sixteenth embodiments.

With the present invention, laser lights are not scanned and irradiated onto the entire surface of a semiconductor film but are scanned so that at least each indispensable portion is crystallized. With the construction described above, it becomes possible to save a time taken to irradiate the laser lights onto each portion to be removed through patterning after the crystallization of the semiconductor film and to significantly shorten a time taken to process one substrate.

What is claimed is:

1. A manufacturing method for a semiconductor device comprising:
   outputting a plurality of laser lights from a plurality of laser oscillation apparatuses;
   forming one beam spot by having beam spots of the plurality of laser lights overlap each other using an optical system on a semiconductor film;
   enhancing crystallinity in a region determined by pattern information by scanning the formed beam spot only on the region of the semiconductor film determined by the pattern information; and
   forming an island-like semiconductor film having crystallinity by patterning the region, in which the crystallinity has been enhanced, using the pattern information.

2. A manufacturing method for a semiconductor device comprising:
   outputting a plurality of laser lights from a plurality of laser oscillation apparatuses;
   forming one beam spot by having beam spots of the plurality of laser lights overlap each other using an optical system so that centers of the beam spots draw a straight line on a semiconductor fill;
   enhancing crystallinity in a region determined by pattern information by scanning the formed beam spot only on the region of the semiconductor film determined by the pattern information; and
   forming an island-like semiconductor film having crystallinity by patterning the region, in which the crystallinity has been enhanced, using the pattern information.

3. A manufacturing method for a semiconductor device according to any one of claims 1 and 2, wherein the laser oscillation apparatus is a solid laser of continuous oscillation.

4. A manufacturing method for a semiconductor device according to any one of claims 1 and 2, wherein the laser oscillation apparatus is at least one kind of laser selected from the group consisting of a YAG laser, a $YVO_4$ laser, a YLF laser, a $YAlO_3$ laser, a glass laser, a ruby laser, an alexandrite laser, a $Y_2O_3$ laser, and a Ti: sapphire laser of continuous oscillation.

5. A manufacturing method for a semiconductor device according to any one of claims 1 and 2, wherein the laser oscillation apparatus is at least one kind of laser selected from the group consisting of an excimer laser, an Ar laser, and a Kr laser of continuous oscillation.

6. A manufacturing method for a semiconductor device according to any one of claims 1 and 2, wherein the laser light is second harmonics.

7. A manufacturing method for a semiconductor device according to any one of claims 1 and 2, wherein the number of the laser oscillation apparatuses ranges from 2 to 8.

8. A semiconductor device that uses a manufacturing method for the semiconductor device according to any one of claims 1 and 2, the semiconductor device comprising:

an island like semiconductor film having enhanced crystallinity, wherein said film is formed by patterning a region of enhanced crystallinity, the region of enhanced crystallinity is determined by pattern information.

9. An electronic equipment that uses the semiconductor device manufacturing method according to any one of claims 1 and 2, the semiconductor device comprising:

an island like semiconductor film having enhanced crystallinity, wherein said film is formed by patterning a region of enhanced crystallinity, the region of enhanced crystallinity is determined by pattern information.

10. A manufacturing method for a semiconductor device comprising:

forming a semiconductor film over a substrate;

outputting a plurality of laser lights from a plurality of laser oscillation apparatuses;

forming one beam spot by having beam spots of the plurality of the laser lights overlap each other, and scanning the formed beam spot to a region of the semiconductor film determined by a pattern information.

11. A manufacturing method for a semiconductor device comprising:

forming a semiconductor film over a substrate;

outputting a plurality of laser lights from a plurality of laser oscillation apparatuses;

forming one beam spot by having beam spots of the plurality of the laser lights overlap each other so that centers of the beam spots draw a straight line on the semiconductor film; and scanning the formed beam spot to a region of the semiconductor film determined by a pattern information.

12. A manufacturing method for a semiconductor device according to any one of 10 and 11, wherein the laser oscillation apparatus is a solid laser of continuous oscillation.

13. A manufacturing method for a semiconductor device according to any one of claims 10 and 11, wherein the laser oscillation apparatus is at least one kind of laser selected from the group consisting of a YAG laser, a $YVO_4$ laser, a YLF laser, a $YAlO_3$ laser, a glass laser, a ruby laser, an alexandrite laser, a $Y_2O_3$ laser, and a Ti: sapphire laser of continuous oscillation.

* * * * *